(12) United States Patent
Craven et al.

(10) Patent No.: US 6,760,451 B1
(45) Date of Patent: Jul. 6, 2004

(54) COMPENSATING FILTERS

(76) Inventors: Peter Graham Craven, 11 Wessex Way, Grove, Wantage, Oxon (GB), OX12 0BS; Michael Anthony Gerzon, 57 Juxon Street, Jericho, Oxford (GB), OX2 6DJ ( * ) Notice: Subject to any disclaimer, the term of this patent is extended or adjusted under 35 U.S.C. 154(b) by 0 days.

(21) Appl. No.: 09/083,276

(22) Filed: May 22, 1998

Related U.S. Application Data

(62) Division of application No. 08/802,208, filed on Feb. 18, 1997, now Pat. No. 5,815,580, which is a division of application No. 08/561,601, filed on Nov. 21, 1995, now Pat. No. 5,627,899, which is a division of application No. 08/074,837, filed on Aug. 3, 1993, now Pat. No. 5,511,129.

(51) Int. Cl.[7] ............................................. H03G 5/00
(52) U.S. Cl. ......................................... 381/98; 381/59
(58) Field of Search ............................. 381/58, 59, 97, 381/98, 101, 102, 103, 56

(56) References Cited

U.S. PATENT DOCUMENTS

| | | | | |
|---|---|---|---|---|
| 4,306,113 A | * | 12/1981 | Morton | 381/58 |
| 4,495,643 A | * | 1/1985 | Orban | 381/106 |
| 4,507,791 A | * | 3/1985 | Gundry | 381/106 |
| 4,631,749 A | * | 12/1986 | Rapaich | 381/103 |
| 4,694,498 A | * | 9/1987 | Suzuki et al. | 381/59 |
| 4,769,848 A | * | 9/1988 | Eberbach | 381/97 |
| 4,773,094 A | * | 9/1988 | Dolby | 381/58 |
| 4,888,808 A | * | 12/1989 | Ishikawa et al. | 381/98 |
| 4,947,133 A | * | 8/1990 | Thomas | 381/106 |
| 5,023,914 A | * | 6/1991 | Arnold | 381/97 |
| 5,168,129 A | * | 12/1992 | D'Antonio | 181/30 |
| 5,185,801 A | * | 2/1993 | Meyer et al. | 381/59 |
| 5,185,805 A | * | 2/1993 | Chiang | 381/59 |
| 5,511,129 A | * | 4/1996 | Craven et al. | 381/59 |
| 5,627,899 A | * | 5/1997 | Craven et al. | 381/103 |
| 5,815,580 A | * | 9/1998 | Craven et al. | 381/103 |
| 6,011,853 A | * | 1/2000 | Koski et al. | 381/56 |
| 6,111,957 A | * | 8/2000 | Thomasson | 381/56 |

FOREIGN PATENT DOCUMENTS

| | | |
|---|---|---|
| EP | 0 924 762 | of 1983 |
| EP | 0 924 762 | 1/1983 |

OTHER PUBLICATIONS

Kuriyama et al., "Adaptive Loudspeaker System", Journal of the Audio Engineering Society, vol. 37, No. 11, Nov. 1989, New York US, pp. 919–926.

Patent Abstract of Japanese Appl. No. 63–234699, vol. 13, No. 38 (E–709), Jan. 1989.

(List continued on next page.)

*Primary Examiner*—Xu Mei
(74) *Attorney, Agent, or Firm*—Nixon & Vanderhye P.C.

(57) ABSTRACT

A prefilter (5) for an audio system comprising a loudspeaker (1) in a room (2), which corrects both amplitude and phase errors due to the loudspeaker (1) by a linear phase correction filter response and corrects the amplitude response of the room (2) whilst introducing the minimum possible amount of extra phase distortion by employing a minimum phase correction filter stage. A test signal generator (8) generates a signal comprising a periodic frequency sweep with a greater phase repetition period than the frequency repetition period. A microphone (7) positioned at various points in the room (2) measures the audio signal processed by the room (2) and loudspeaker (1), and a coefficient calculator (6) (e.g. a digital signal processor device) derives the signal response of the room and thereby a requisite minimum phase correction to be cascaded with the linear phase correction already calculated for the loudspeaker (1). Filter (5) may comprise the same digital signal processor as the coefficient calculator (6). Applications in high fidelity audio reproduction, and in car stereo reproduction.

14 Claims, 33 Drawing Sheets

OTHER PUBLICATIONS

IEEE Acoustics, Speech, and Signal Processing Magazine, vol. 36, No. 2, Feb., 1988, New York US, pp. 145–152.

Patent Abstracts of Japanese Appl. No. 59–225626, vol. 9, No. 99 (E–311), Apr. 27, 1985.

Hoang et al., 1989 IEEE Int. Symposium on Circuits and Systems Portland May 8–11, 1989, pp. 371–374.

Journal of the Audio Engineering Society, vol. 37, No. 11, Nov. 1989, New York US, pp. 899–907.

Patent Abstract of Japanese Appl. No. 12–048798, vol. 13, No. 594 (E–867), Dec. 27, 1989.

Journal of the Audio Engineering Society, vol. 37, No. 11, Nov. 1989, New Yourk US pp. 919–926, Kuriyama et al. 'Adaptive Loudspeaker System'.

Patent Abstracts of Japan, vol. 13, No. 38 (E–709) Jan. 27, 1989 & JP, A, 63 234 699 (Matsushita) Sep. 26, 1988.

IEEE Acoustics, Speech, and Signal Processing Magazine, vol. 36, No. 2, Feb. 1988, New York US pp. 145–152.

Patent Abstracts of Japan, vol. 9, No. 99 (E–311) Apr. 27, 1985 & JP, A,59 225 626 (Nippon) Dec. 18, 1984.

1989 IEEE Int. Symposium on Circuits and Systems Portland May 8–11, 1989; Phuong–Quan Hoang et al pp. 371–374.

Journal of the Audio Engineering Society, vol. 37, No. 11, Nov. 1989, New York US pp. 899–907.

Patent Abstracts of Japan, vol. 13, No. 594 (E–867) Dec. 27, 1989 & JP,A,12 048 798 (Toa Tokushu) Oct. 4, 1989.

Journal of the Audio Engineering Society, vol. 37, No. 11, Nov. 1989, New Yourk US pp. 919–926, Kuriyama et al. 'Adaptive Loudspeaker System'.

Patent Abstracts of Japan, vol. 13, No. 38 (E–709) Jan. 27, 1989 & JP, A, 63 234 699 (Matsushita) Sep. 26, 1988 (Abstract only).

IEEE Acoustics, Speech, and Signal Processing Magazine, vol. 36, No. 2, Feb. 1988, New York US pp. 145–152.

Patent Abstracts of Japan, vol. 9, No. 99 (E–311) Apr. 27, 1985 & JP, A,59 225 626 (Nippon) Dec. 18, 1984 (Abstract only).

1989 IEEE Int. Symposium on Circuits and Systems Portland May 8–11, 1989; Phuong–Quan Hoang et al pp. 371–374.

Journal of the Audio Engineering Society, vol. 37, No. 11, Nov. 1989, New York US pp. 899–907.

Patent Abstracts of Japan, vol. 13, No. 594 (E–867) Dec. 27, 1989 & JP,A,12 048 798 (Toa Tokushu) Oct. 4, 1989 (Abstract only).

* cited by examiner

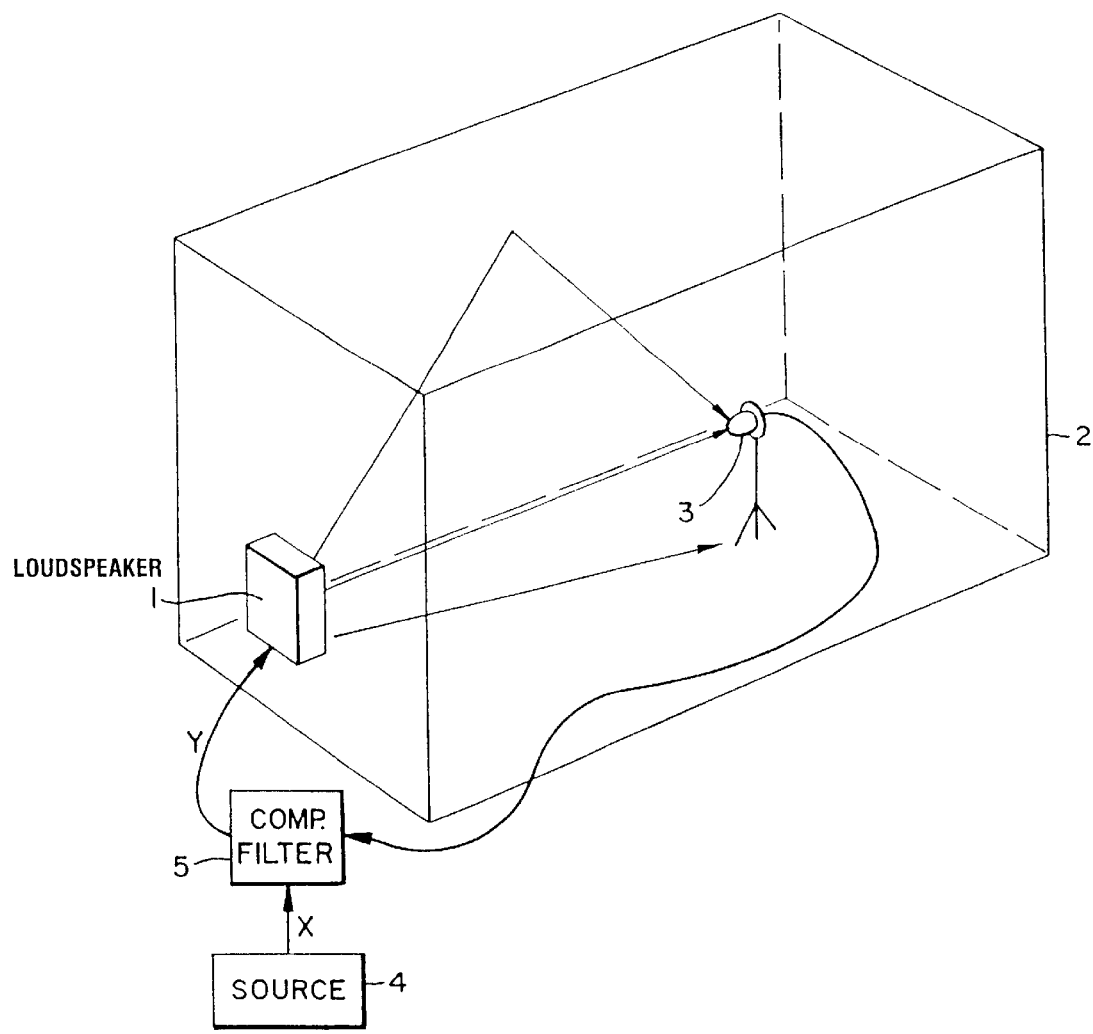

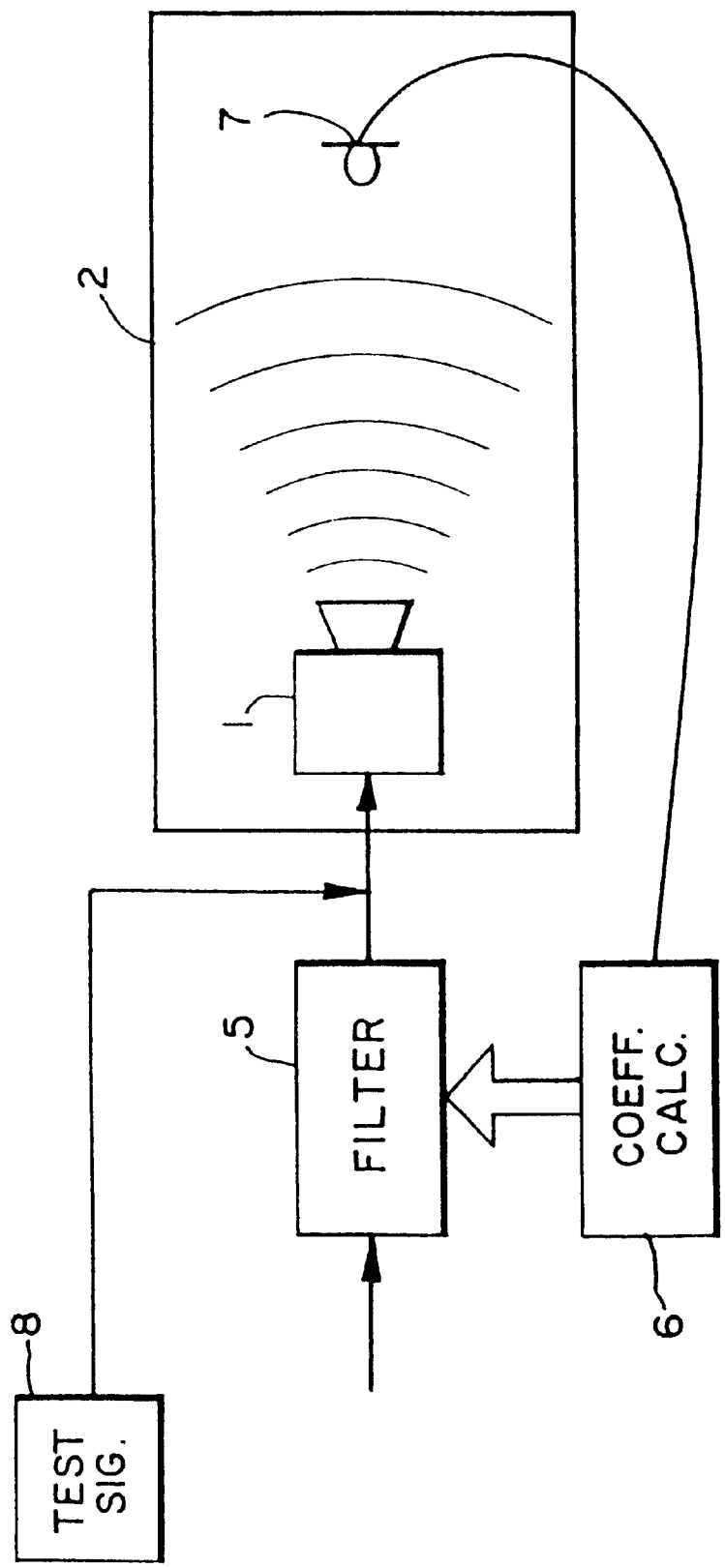

PRE RESPONSE

PRE RESPONSE

PRE RESPONSE

COMPENSATING FILTERS

This is a divisional of application Ser. No. 08/802,208, filed Feb. 18, 1997, now U.S. Pat. No. 5,815,580; which is a divisional of application Ser. No. 08/561,602, filed Nov. 21, 1995, now U.S. Pat. No. 5,627,899; which is a divisional of application Ser. No. 08/074,837, filed Aug. 3, 1993, now U.S. Pat. No. 5,511,129.

BACKGROUND OF THE INVENTION

1. Field of the Invention

This invention relates to filtering audio signals to compensate the effects of acoustic and/or electrical stages in the signal path from the original sound source to the human ear.

2. Discussion of Prior Art

In general, this signal path will include a pickup receiving the sound, and converting it to, typically, an electrical signal; signal transmission channels; signal processing (e.g. filtering, tone control or noise reduction); signal transmission, or alternatively recording on to a record carrier; signal reception or alternatively replaying from the record carrier; a further transmission link; and reconversion into an audio signal via an electro-acoustic transducer. If the transducer is a loudspeaker, the final stage in the path is transmission through an acoustic environment (typically a room) to the human ear.

Associated with each stage of the signal path is a transfer characteristic, and at various stages in the path attempts may be made to filter the signal to compensate the effects of these transfer characteristics. Compensation generally takes place at a stage in the signal path subsequent to the stages to be compensated. For example, in the case of a sound recording, the signal will be filtered at the mixing and cutting stages so as to compensate, if necessary, for the recording environment and equipment (amongst other things).

At the reproduction stage, it is nowadays common to provide a so called "graphic equalizer" comprising a plurality of band pass filters each with its own gain control, though which the signal is passed, to allow a listener to re-equalize the reproduced sound signal. The graphic equalizer is generally positioned between the record carrier reader (e.g. turntable or compact disc player) and the power amplifier driving the electro-acoustic transducer (loudspeaker).

Since such equalizers are adjusted manually, their setting is a matter for the personal taste of the listener but they can be used (and are intended for use) to compensate for large scale irregularities in the amplitude response over frequency of the electro-acoustic transducer or of the acoustic environment in which the transducer is positioned.

In fact, with modern high fidelity audio equipment, the major variations in sound reproduction quality are due to the transfer functions of the loudspeaker and of the acoustic environment in which the loudspeaker is positioned.

The loudspeaker often comprises several separate transducers responsive to different frequency ranges, the loudspeaker input signal being split into the ranges by a crossover network (generally an analogue filter), and the transducers being mounted in a cabinet. The transfer function of the loudspeaker will thus depend upon the electrical characteristics of the crossover network and of the transducers; on the relevant positions of the transducers; and on the mechanical resonances of the cabinet.

The transfer function of the acoustic environment may be visualised by considering that the signal passes though multiple paths between the loudspeaker and the human ear; as well as the direct path through the air between the two, there will generally be a path through the floor on which the loudspeaker and user stand, and reflected paths from the (at least) four walls, ceiling and floor. This leads to constructive and destructive acoustic interference and to standing wave patterns of considerable complexity within the room, so that the paths from the loudspeaker to different points in the room will have different transfer characteristics—where the room exhibits pronounced resonances, these transfer characteristics can be extremely different, with complete cancellation at some frequencies, the frequencies differing between different points. These effects are audible as colorations of the reproduced sound, and as relatively long reverberations.

It would in principle be desirable to provide a compensating filter and means for deriving the parameters of the filter such that a given sound source would be reproduced substantially identically through any loudspeaker and/or acoustic environment, so as to free the listener from the need to carefully select certain loudspeakers, and pay attention to their position within a room and to the acoustic properties of the room.

One example of a proposal to achieve exactly this is described in U.S. Pat. No. 4,458,362 and corresponding EP0094762A, in which it is proposed to provide a finite impulse response digital filter (implemented by a microcomputer and a random access memory) in the signal path preceding the loudspeaker. The coefficients of the filter are derived in an initial phase, in which a listener postions himself at his desired listening point within a room and instructs the microprocessor to generate a test signal which is propagated via the loudspeaker through the room to the listener position and picked up by a microphone carried by the listener. From the test signal and signal picked up by the microphone, the impulse response of the intervening portions of the signal path (e.g. the loudspeaker and the acoustic path through the room to that listener position) is derived and the coefficients of an FIR filter approximating the inverse transfer characteristic to that of the signal path are calculated and used in subsequent filtering.

However, this attractively simple idea suffers from major drawbacks in practice. Firstly, since the transfer characteristic of the signal path is derived to only a single listener point within a room, and since (as discussed above) the transfer characteristics of signal paths to closely spaced points in the room can have widely different transfer characteristics because of the presence of multiple room resonances, if the listener moves within the room, then the transfer characteristic derived for the filter becomes inappropriate so that, far from compensating for the effects of the room, the filter may actually further degrade the sound heard by the listener at his new position.

The disclosure of U.S. Pat. No. 4,458,362 further refers only to compensating the frequency response of elements of the signal path and ignores the phase responses of those elements. Although it is commonly thought that the human ear is relatively insensitive to phase, we have found that phase distortion, even at low levels, can be perceptually significant to a listener.

Different elements of the signal path will exhibit different phase behaviour; the behaviour of loudspeakers depends variously on the crossover network, the transducers and the cabinet dimensions. The phase response of the acoustic environment, however, can be extremely complex due to the reflection or resonances from the room boundaries. These give rise to sharp changes in the phase response of the path to a single point in the room.

Another problem is that it is possible, at some points in the room, for sound to reach a listener by a first path at a relatively low level and then by a second path at a relatively higher level; the first path could, for example, be through the floor of the room; or the first path could be a direct path from the loudspeaker through the air and the second a reflection of greater magnitude (which can occur if two reflections add up in amplitude and phase). The effect in any event is that instead of hearing a sound followed by a fainter echo, the listener hears a "pre-echo" followed by a louder sound, which is perceived as extremely unnatural.

It is relatively straightforward to cancel an echo; an IIR filter having a delay equivalent to the echo length and a loop gain equivalent to −1 times the attenuation of the echo can be used, or an FIR filter of length sufficiently long to approximate such an IIR filter can be employed with suitable tap values. However, compensating a pre-echo is considerably more difficult. A direct compensation is impossible, since the corresponding IIR filter would be unstable, and it is necessary to employ a bulk delay within the compensating filter so that the impulse response of the compensating filter itself can be made acausal.

It is therefore clear that such filters themselves will introduce pre-echo, calculated to exactly compensate that introduced by the acoustic environment. However, because the pre-echo time and amount are themselves sensitive functions of the listener position in the room, a filter calculated to compensate at one point will not only fail to compensate pre-echo at another point but will introduce a further pre-echo of its own which sounds extremely unnatural to a listener. Even if no distinct echo is heard, a low level of response occurring prior to the arrival of the main part of the impulse response.

SUMMARY OF THE INVENTION

The invention generally provides a filter (preferably a digital filter) in which the substantially direction independent portion of the path (including loudspeaker and acoustic environment) is compensated so as to substantially linearise the phase response thereof, and the directionally dependent parts of the response are compensated so as to flatten the amplitude response without introducing further phase distortion. The substantially direction independent part of the response includes substantially the loudspeaker response, and more particularly the electrical portions thereof. Also provided are methods of processing signals to yield the parameters of such filters, and methods of manufacturing such filters using the results of such processing.

Also provided according to one aspect of the invention is audio processing apparatus which includes data relating to the response of the loudspeaker with which it is supplied or to be used, capable of generating a test signal through the loudspeaker and of measuring the test signal received at a plurality of points in the room to derive a representative room signal response taking account of the loudspeaker response data, and thereby generating filter parameters for subsequent audio reproduction in such a manner as not to generate audible pre-echos.

In another aspect, the invention provides a user controllable phase correction to compensate phase lead errors on audio source material, as a post filter.

Other aspects, embodiments, objects and advantages of the invention will be apparent from the description and claims.

BRIEF DESCRIPTION OF THE DRAWING

The invention will now be illustrated, by way of example only, with reference to the accompanying drawings in which:

FIGS. 1a and 1b illustrate schematically the disposition of elements of the invention and environment;

FIG. 2 is a schematic block diagram of apparatus according to the invention;

FIG. 11b illustrates and alternative method to that of FIGS. 10 and 11a;

DETAILED DISCUSSION OF PREFERRED EMBODIMENTS

Physical Model

Figure 1B:
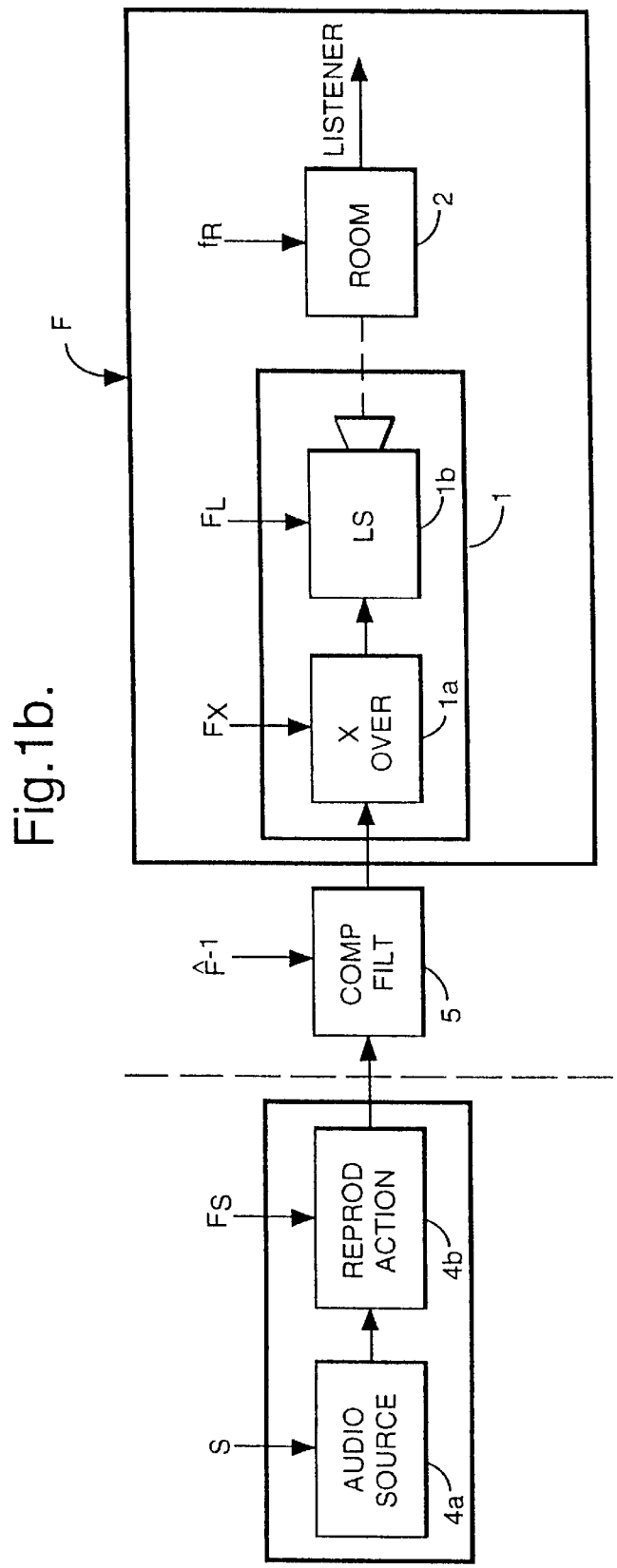

Referring to FIG. 1a, a loudspeaker 1 is positioned within a room or other acoustic environment 2. Also within the room 2 is a listening point 3; a microphone at this point is illustrated, but in use a human ear would take its place. The loudspeaker 1 is fed from a signal source 4 an electrical signal representing a sound signal to be reproduced by the loudspeaker 1. In the electrical path between the source 4 and loudspeaker 1 is the compensating filter apparatus 5 the subject of the present invention.

The acoustic signal generated by the loudspeaker in response to the electrical signal it receives traverses the acoustic environment 2 by several paths; through the floor, directly through the air, and via multiple reflections from the walls, floor and ceiling. The walls, floor and ceiling will to some extent attenuate the acoustic signal with each reflection. If the degree of attenuation is relatively low, long resonances lasting several seconds can build up depending upon the dimensions of the room 2, leading to sharp peaks and troughs in the frequency spectrum of the room 2.

The peak height is a measure of resonance amplitude, whereas the sharpness or narrowness in the spectral domain is a measure of the length in time of the reverberation or resonance, or the Q factor assocated therewith. High Q, long lasting resonances, even of low amplitude, are psychoacoustically undesirable. In the low frequency region below around 600 kHz, complicated three dimensional standing wave patterns may be present.

Signal Model

Referring to FIG. 1b, the path taken by an audio signal to reach the listener at the listening position 3 is as follows. The source 4 providing the signal to the loudspeaker 1 is equivalent to an original audio source such as a human speaker or a musical instrument, designated as 4a, which has passed through an electrical reproduction system such as a microphone, a recording studio, a reproduction turntable or tape deck and associated interconnection lines, designated generally as 4b, The original audio signal will be designated S, and the transfer function of the electrical reproduction stage 4b will be designated $F_s$, so that the electrical signal X supplied by the source 4 comprises $S*F_s$ (where * denotes multiplication in the frequency domain or, correspondingly, convolution in the time domain).

The signal X thereafter passes through, and is filtered by, the compensating filter 5 the transfer function of which is designated $\hat{F}^{-1}$, for reasons discussed below. Thereafter the filtered signal Y is fed (possibly through a power amplifier) to the loudspeaker 1. The loudspeaker 1 generally comprises an electrical crossover network 1a, typically a fourth order passive filter, splitting the signal into several frequency ranges—typically, a bass frequency range (below 300 Hz), a mid-frequency range (between this and 3000 Hz) and a treble frequency range (above this). The transfer function of the crossover network 1a will be designated $F_x$. Each filtered signal is then supplied to a respective transducer; typically, a moving coil cone transducer for the bass frequencies and moving coil or piezo ceramic dome transducers for mid and treble frequencies. These are mounted within a loudspeaker cabinet.

These elements of the loudspeaker may be viewed as exhibiting a transfer function $F_L$ which is due in part to the electrical parameters of the transducers, and in part to the geometrical disposition of the transducers and to the mechanical properties of the cabinet. In general, these latter parameters are directional so that in fact the transfer function of the loudspeaker depends upon the position of the listener relative to the forward axis of the loudspeaker (i.e. the axis along which the transducers vibrate). However, for present purposes, the transfer function of the loudspeaker in this description will generally be understood to refer to its transfer function along the loudspeaker axis, and at a distance sufficiently great that near-field effects are not overwhelming.

The audio signal generated by the loudspeaker 1 passes to the listener point 3 through the acoustic environment 2, which imposes on the audio signal a transfer function which generally comprises a number of different signal paths having differing attenuations and also in general resonances. For any given listener point 3, a room transfer function $F_r$ can be designated and measured but considered as a whole the acoustic environment 2 cannot be described by a single transfer function. The term "room transfer function", when used in the following, is used to indicate a transfer function which is valid over a contiguous volume of the room as an approximation to the transfer function between the loudspeaker 1 and different listener positions 3 within that volume.

The entire signal path between the source 4 and the listener position 3 may therefore be considered to exhibit a lumped transfer function F, comprising $F_x*F_l*F_r$, (or $F_L*F_R$ where $F_L=F_x*F_l$ is the response of the whole loudspeaker unit) and the compensating filter 5 should exhibit a transfer function $F^{-1}$ which tends to flatten, or reduce to unity, the lumped transfer function F of the signal path.

Description of Hardware

Filter 5

It is greatly preferred to realise the filter 5 as a digital filter by providing a digital input coupled to a highspeed digital processor operable to execute a stored program utilising a buffer memory to store previous input values and/or previous output values.

As is well known, a digital filter operates by generating a series of output values in dependence upon combinations of previous input and/or output values stored in the buffer memory multiplied by digital coefficients which thus characterise the filter.

A Digital Signal Processor (DSP) device comprising a program memory, arithmetic logic, a multiplier and fast data memory is employed as the filter 5.

Test Signal Generator 8

Also provided in this embodiment is a test signal generator 8 which supplies an electrical test signal to the input of the loudspeaker 1 directly (i.e. not via the filter 5). The test signal includes signal frequency components across the range over which it is intended to equalise the lumped transfer function F (as discussed in greater detail below).

Coefficient Calculator 6

A coefficient calculator 6 is provided, connectable to a microphone 7, and arranged to calculate from the signal from the microphone 7 the coefficients for the filter 5 and to supply them to the filter. Since in this embodiment the filter 5 and the coefficient calculator 6 are not simultaneously employed, the processor device which comprises the filter 5 may also comprise the coefficient calculator 6 by executing a different stored program.

General Operation of the Invention

One essential feature of the invention arises from our realisation that the transfer functions of the loudspeaker 1 and of the acoustic environment 2 are qualitatively different, and that it is advantageous to model and compensate the two separately (although, of course, the same filter hardware 5 is preferably used to compensate both). However, there are very considerable difficulties in separately measuring the two transfer functions in practice, since a loudspeaker is required to inject an audio signal into the acoustic environment, and a far field loudspeaker response cannot be measured except within an acoustic environment. It is possible to calculate a mathematical approximation to the various transfer functions. For example, if the type and cutoff frequency of the crossover network is specified its transfer function should be easy to calculate. This applies also to the electrical parts (e.g. the moving coil) of the loudspeaker. However, modelling the mechanical behaviour of the loudspeaker is complex, and modelling the acoustic behaviour of an environment such as a room is extremely complex because of the very large number of possible resonances. It is therefore prefered to derive the transfer functions of the loudspeaker and room by measurement.

The response of a component to a signal can be described in many ways; time domain descriptions such as the impulse response or the auto correlation spectrum; and spectral response descriptions such as the complex frequency spectrum or the power spectrum are amongst them. The various processes of measuring the loudspeaker and room responses, processing the responses, and designing the parameters of a filter to compensate therefor, can therefore be performed in many ways. In the following, for simplicity of presentation, the response measurement and filter design will be described using frequency domain methods, from which alternative methods will be obvious to the skilled man.

Figure 3:
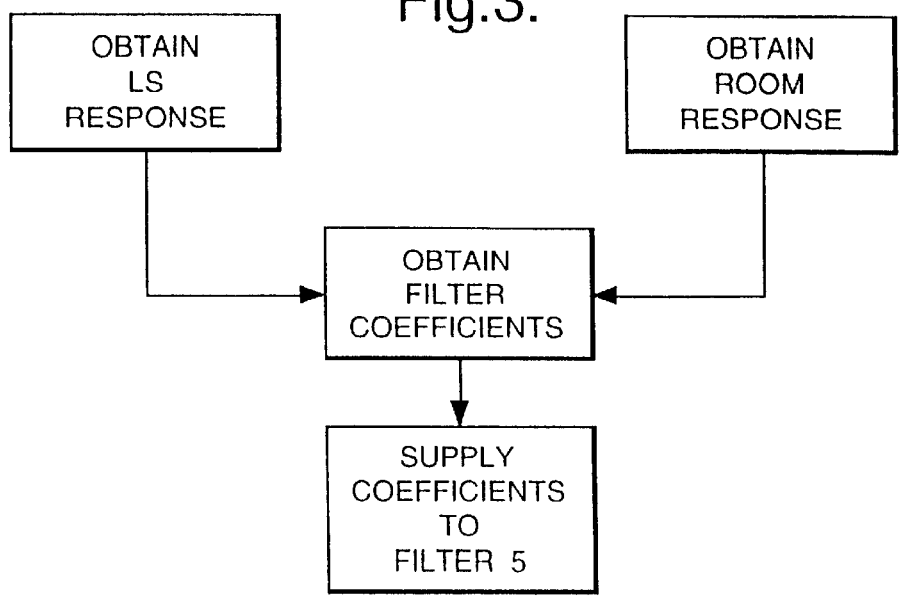
FIG. 3 illustrates schematically a method of deriving the characteristics of a filter to be used in the apparatus of FIG. 2.

Referring to FIG. 3, the general method of operation of the coefficient calculator 8 is to obtain, separately, a model of the loudspeaker response substantially independent of the environment, and a model of the environment response (which will be valid over a zone within the environment) which is substantially independent of the loudspeaker response. The coefficient calculator 6 then calculates the coefficients of a filter which will compensate for the loudspeaker and for the environment in different ways taking account of the different physical natures of the loudspeaker and of the environment. The phase response of the loudspeaker can be compensated to substantially eliminate phase distortions introduced by the loudspeaker, since the loudspeaker response is largely independent of direction and position of the listener relative to the loudspeaker. The acoustic environment (e.g. room) is compensated so as to equalise its amplitude response but without completely equalising its phase resonse so as to avoid introducing further phase errors. The coefficients of a signal filter which combines both compensations are supplied to the filter 5 to enable subsequent filtered audio reproduction via the loudspeaker 1.

Figure 4:
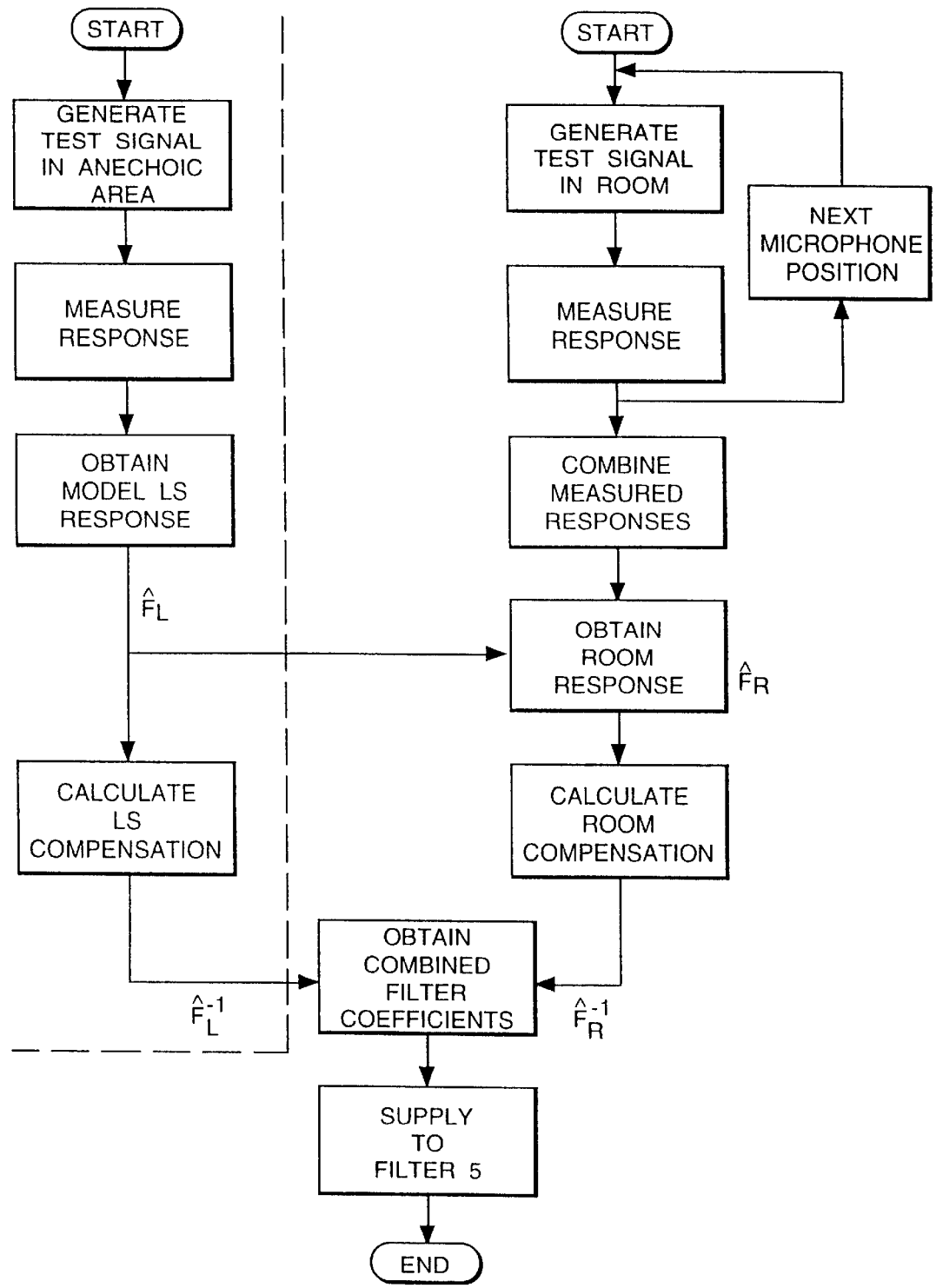
FIG. 4 illustrates in greater detail the method of FIG. 3.

Referring to FIG. 4, the process of FIG. 3 will be described in greater detail. The response of the loudspeaker 1 is measured by placing the loudspeaker in an echo free environment, passing a test signal through the loudspeaker, and picking up the reproduced audio signal via a microphone. From the signal measured by the microphone, a suitable model of the loudspeaker response is derived. From this model, the response necessary to compensate the loudspeaker is derived; in a simple case, this is merely the spectral inverse of the loudspeaker response itself. The model loudspeaker response and the loudspeaker compensation response data are then stored for subsequent use.

The loudspeaker 1 is then positioned within the acoustic environment in which it is to be used, and the microphone 7 is placed at a listener position within the environment. An electrical test signal from the test signal generator 8 is supplied to the loudspeaker 1 and the resulting audio signal received at the microphone 7 is measured and stored. The microphone 7 is then moved to another point and the process is repeated. Once sufficient measurements have been taken, the coefficient calculator 6 calculates a room response from a combination of the stored measurements, to be jointly representative of all the points at which the measurements were taken. This response includes the response due to the loudspeaker 1. The coefficient calculator 6 therefore uses the stored model loudspeaker response $\hat{F}_L$ jointly with the combined measured response to derive the response of the acoustic environment 2 $\hat{F}_R$ only, eliminating the dependency upon the loudspeaker 1. A compensation response $\hat{F}_R^{-1}$ to substantially compensate the room response is derived, and combined with the loudspeaker compensation response $\hat{F}_L^{-1}$. From the combined compensation response the coefficients of the digital filter 5 to execute the combined compensation are derived and supplied to the filter 5 for use in subsequent audio reproduction.

Loudspeaker Compensation

To measure the loudspeaker response, as shown in FIG. 4, the loudspeaker is placed in an anechoic chamber comprising a room the walls and ceilings of which are heavily acoustically damped, the microphone 7 (for example an electret microphone with a response down to about 20 Hz) is positioned on the loudspeaker axis in front of the loudspeaker at a distance away from the near field of the bass unit (20–30 cms from the cone for example) and the loudspeaker 1 is fed with a test signal by the test signal generator 8. The signal received by the microphone 7 is anti-alias filtered, sampled and digitised by a conventional ADC (not shown) and the digital signal is supplied to the coefficient calculator 6.

Figure 5:
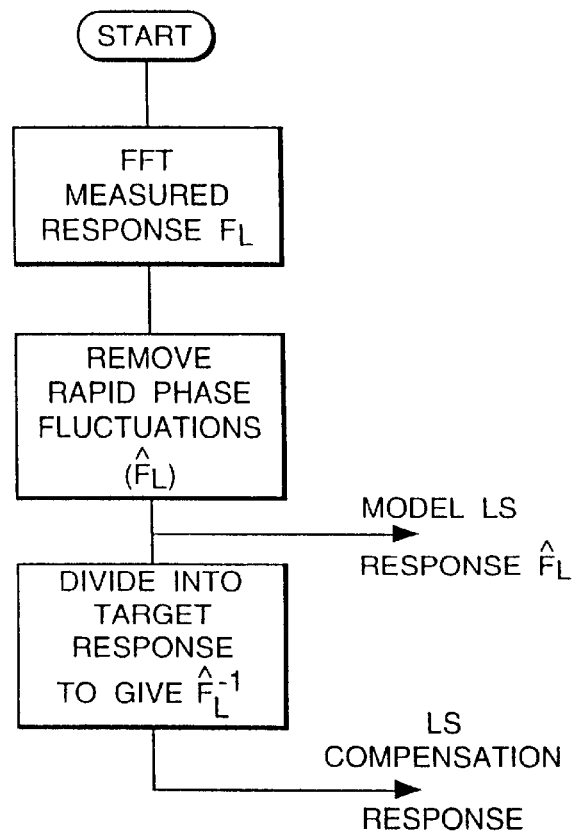
FIG. 5 illustrates in greater detail the method of deriving loudspeaker parameters in the method of FIG. 4.

Referring to FIG. 5, the process of deriving the transfer function or response of the loudspeaker from the measured signal first comprises the step of taking the Fourier transform of the signal.

For simplicity, in the following the effects of a single impulse test signal will be discussed; the signal measured by the microphone 7 therefore directly yields the impulse response of the loudspeaker. If other test signals are used, it is necessary to derive the impulse response of the loudspeaker from the measured signal by deconvolving the test signal response from the measured response as discussed in greater detail below.

The measured response may be improved by utilising any other knowledge of the expected response; for example, many loudspeakers have a log/linear low frequency rolloff with a slope of six, twelve or 24 dB/octave, and a mathematically calculated curve can therefore be fitted to the measured data in the low frequency region of the response. Alternatively, the response can be calculated from measurements of dimensions and mass of the loudspeaker components.

It is also preferred that any rapid variations of phase with frequency (expressed as a logarithmic scale) are left uncompensated so that the compensating filter corrects only broad trends in the phase (and amplitude) response of the loudspeaker. This is because these rapid variations of phase are likely to be due to mechanical resonances of the loudspeaker cabinet, and consequently will sound different in different directions around the loudspeaker—exact compensation for one microphone position would therefore worsen the response at other listener positions. To achieve this, a smoothing operation is performed on the derived Fourier transfer coefficients.

The next step is to generate, from the measured response, the response of a compensation filter which, when multiplied by the loudspeaker response in the frequency domain (or convolved therewith in the time domain) will achieve a desired target response. The desired target response for an "ideal" loudspeaker has the following features; its amplitude spectrum should be essentially flat over the audible range; it should, however, taper off smoothly at very low frequencies to avoid overloading the loudspeaker; and its phase response should be linear (within the passband at any rate) to avoid phase distortion (and give a constant group delay). Merely deriving the inverse to the measured loudspeaker response (i.e. setting the target response as unity) would cause the filter to boost the amplitude response at low frequencies (possibly by as much as twelve or twenty-four dB/octave), leading to possible speaker overload.

It is particularly important to equalise the phase response of the loudspeaker at low frequencies, including the rolloff frequencies, and phase anomalies above about 300–500 Hz are less noticeable.

The spectral description of the target response (e.g. flat amplitude spectrum down to 100 Hz, tapering into linear low frequency rolloff of twelve dB/octave, linear phase response at least over lower frequencies) will be permanently stored in the coefficient calculator 6. The measured, smoothed, loudspeaker response is divided into this target response to provide a spectral description $F_L^{-1}$ of the loudspeaker compensating filter response. The coefficient calculator 6 can then, at a later stage, derive corresponding filter coefficients from this description using any convenient algorithm for the type of filter desired. For a FIR filter, it is merely necessary to apply an inverse Fourier transform to directly derive the impulse response (e.g. the coefficients) of the filter.

Acoustic Environment Measurement

It would be possible to measure the response of the acoustic environment 2 using a different loudspeaker, for example one with a substantially ideal response. However, we prefer to employ the loudspeaker to be used in the room as shown in FIG. 4 so that elements of the loudspeaker response not compensated by the loudspeaker compensating filter $\hat{F}_L^{-1}$ can be lumped into, and compensated with, the room compensating filter $\hat{F}_R^{-1}$ response.

This is particularly beneficial because those rapidly fluctuating components of the loudspeaker response $F_L$ which are direction or position dependent, and were consequently not taken account of in deriving the loudspeaker compensation response $\hat{F}_L^{-1}$ are suitable to be compensated in the same manner as the acoustic environment.

Having decided to employ the same loudspeaker to measure the room response, the obvious method of so doing would be to feed the loudspeaker 1 with a compensated signal passed through the loudspeaker compensating filter so that the acoustic test signal introduced into the acoustic environment 2 is not affected by the response of the loudspeaker itself. However, we find that this method can be affected by the presence of electrical and acoustic noise in the path. More seriously, the rolloff introduced by the loudspeaker compensation filter would then be compensated for by the room compensation. Additionally, this method will generally tend to result in a longer filter (comprising a cascade of the loudspeaker compensating filter and the room compensating filter), leading to more calculations being necessary in real time filtering.

Referring to FIGS. 4 and 5, the environment response is therefore measured as follows. The loudspeaker 1 is positioned as desired in the acoustic environment (e.g. room) 2. A compensated volume or zone is designated within the room; this is typically a couch or other area of the room where a listener is likely to be. The microphone 7 is positioned at a first point within the compensated volume. The test signal generator 8 generates a test signal which is supplied directly to the loudspeaker 1 which correspondingly generates an audio signal (equivalent to the test signal influenced by the loudspeaker response) within the room 2. The audio signal travels through the room 2 via multiple paths and reaches the microphone 7 which correspondingly generate a measured signal, which is digitised as before and supplied to the coefficient calculator 6.

The microphone is then moved to another position within the compensating volume and the process is repeated. The coefficient calculator 6 stores the signal from the microphone for each position. When measurements have been taken at a suitable number of positions the coefficient calculator 6 then generates an averaged (in a loose sense) system response from the measured signal, and obtains from this the averaged room response $F_r$ by taking acount of the already measured loudspeaker response $F_L$. After adjusting the derived room response $F_r$ (as described in greater detail below), a desired correction response is calculated and from this and the compensation response $F_L^{-1}$ derived for the loudspeaker, coefficients for a filter $F^{-1}$ are calculated which when executed by the filter 5 will compensate both the loudspeaker 1 and the room 2. The filter coefficients for this are then supplied to the filter 5 for subsequent processing of audio signals from the source 4.

Figure 6:
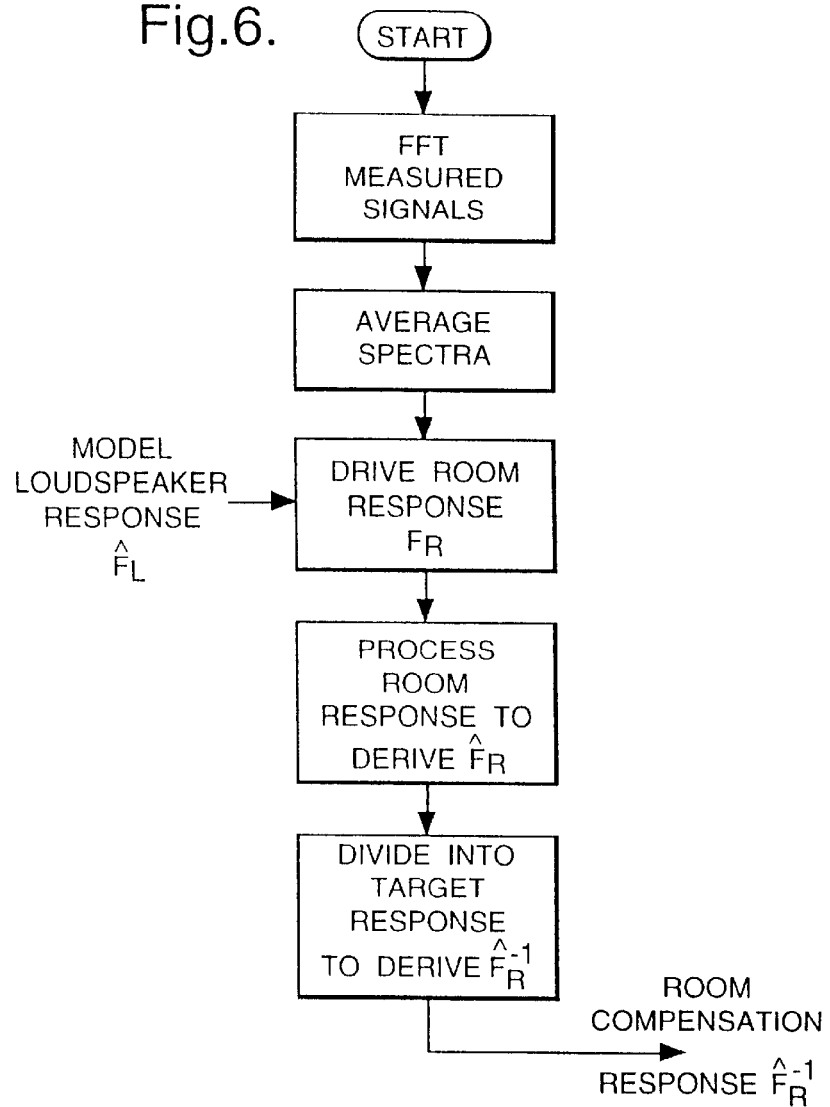
FIG. 6 illustrates in greater detail the method of deriving room parameters in the method of FIG. 4.

Referring to FIG. 6, the process by which the coefficient calculator 6 derives the room response $F_r$, the room compensation response $F_r^{-1}$ will now be described in greater detail. As stated above, the stored target response for the room has a broadly flat amplitude spectrum.

The first step is to combine the responses of the measured signal; this is conveniently done in the spectral domain by executing a Fourier transform on the impulse response obtained from the measured signals, averaging the Fourier transform spectra from all the measured points in the room and averaging the Fourier spectra using some convenient average (not necessarily the arithmetic mean) to give an averaged spectrum. This process of averaging in the spectral domain reduces the local amplitude response differences due to standing wave patterns and reflections within the acoustic environment 2. It is preferred to average the amplitude spectra only, rather than amplitude and phase spectra; averaging the power spectra is one convenient amplitude related method.

The response of the compensating filter $\hat{F}_r^{-1}$ is desired to exhibit minimum phase behaviour so as to avoid the possibility of introducing pre-echos.

A minimum phase filter is a causal filter having the lowest deviation from zero phase response achievable for a given amplitude response. As a consequence, the envelope of its impulse response is tightly confined around the t=0 (e.g. the initial) impulse response component.

It is mathematically demonstrable that the phase response of a minimum phase filter is directly related to the amplitude response of the filter. It is in fact given by computing the logarithm of the spectral power response, computing the Hilbert transform of the result, and then deriving a filter with amplitude equal to the square root of the spectral power response and phase equal to the calculated Hilbert transform.

Figure 7:
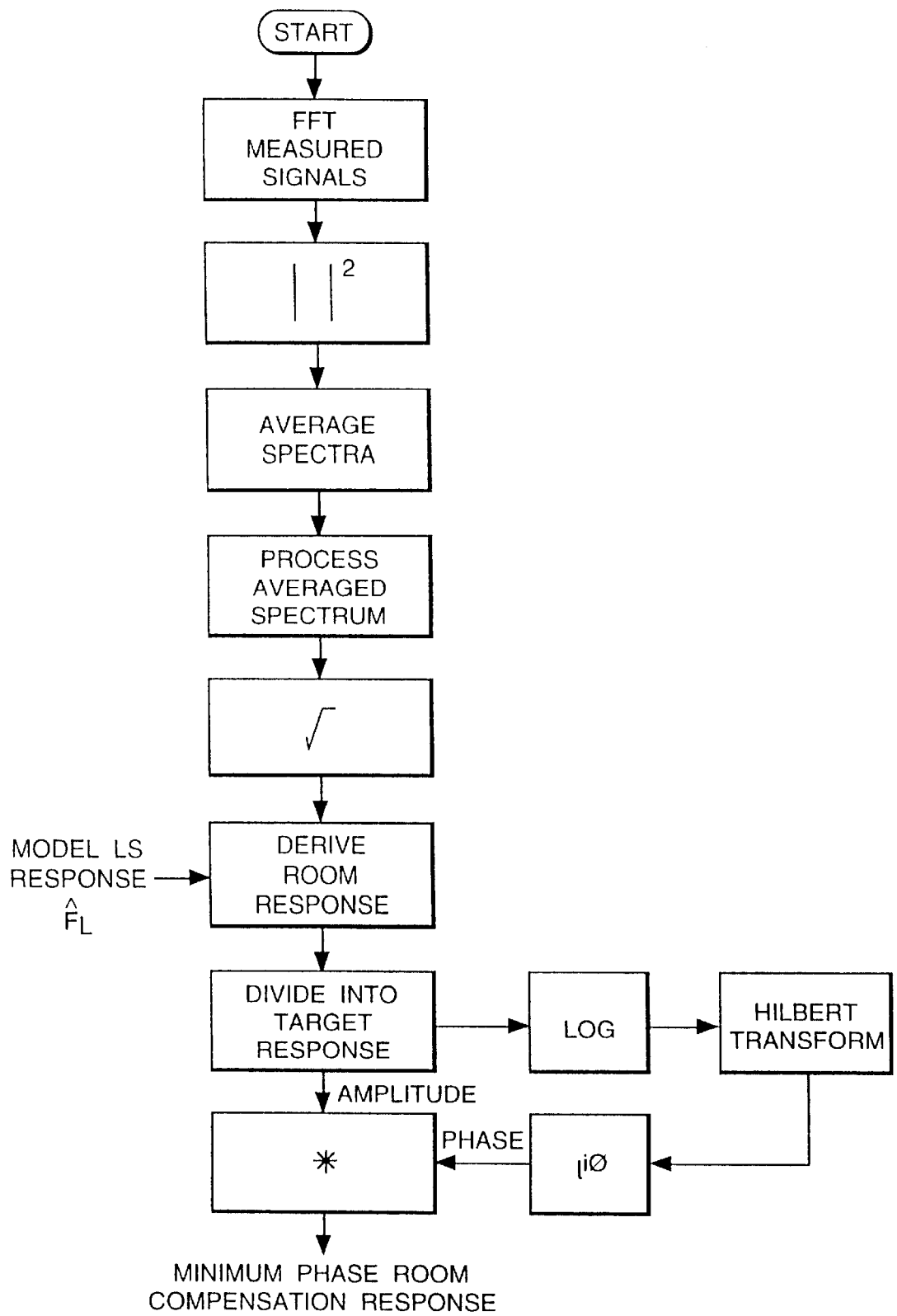
FIG. 7 illustrates a modification of the method of FIG. 6.

The coefficient calculator 6 therefore calculates, for each of the stored microphone signals, the spectral power response; conveniently this is achieved by performing a discrete Fourier transform and then taking the modulus (squared) of each complex term. The corresponding terms for each stored signal are then summed to yield an average spectral power response representing the spectral power response over the entire compensation volume. FIG. 7 illustrates the process of FIG. 6 adapted for a minimum phase room compensation response.

The next step is to divide out from the measured response the contribution to the transfer function due to the loudspeaker 1. The loudspeaker response $F_L$ will already be available, having been measured as described above, although it is preferred to use the smoothed response $\hat{F}_L$ (omitting rapidly changing phase components) since the position of the microphone 7 within the room 2 will inevitably differ from the microphone position at which the loudspeaker response measurements were taken, and the uncompensated parts of the loudspeaker response are thus left in the desired room response $F_R$. The averaged measured spectrum is therefore divided by the modulus of the spectral response of the loudspeaker to produce a response approximating that of the room.

Processing the Room Spectrum

Although averaging the measured response from a number of points helps to somewhat reduce the influence of some room resonance effects at low frequencies, the averaged room response may still contain sharp peaks corresponding to particular resonances and deep troughs. Deep troughs are particularly problematical, since a straightforward compensation filter would strongly boost the signal at frequencies corresponding to trough, which can lead to loudspeaker overloading. Additionally, in other areas of the room the original trough may not be noticable but the boost applied to the signal certainly will. We have discovered that the psycho-acoustic effect of troughs in a frequency response is far less noticable to a listener than that of peaks in a response. We therefore prefer for this reason also not to introduce large peaks into the response of the correction filter, so that the correction filter is less responsive to troughs in the measured room response than to peaks.

The sharpness of any troughs is also of significance, since a correspondingly sharp feature in the compensating filter response implies a high Q factor and we have found that the psycho-acoustic effects of such high Q filtering can be extremely subjectively undesirable to the listener. Even quite low-level resonances can, if they continue for a long time, be disturbing to the listener.

Rather than generating a compensating filter which corresponds to the spectral inverse of the measured room response, it is therefore preferred to make the compensating filter correspond to a processed version of the room response.

Figure 8:
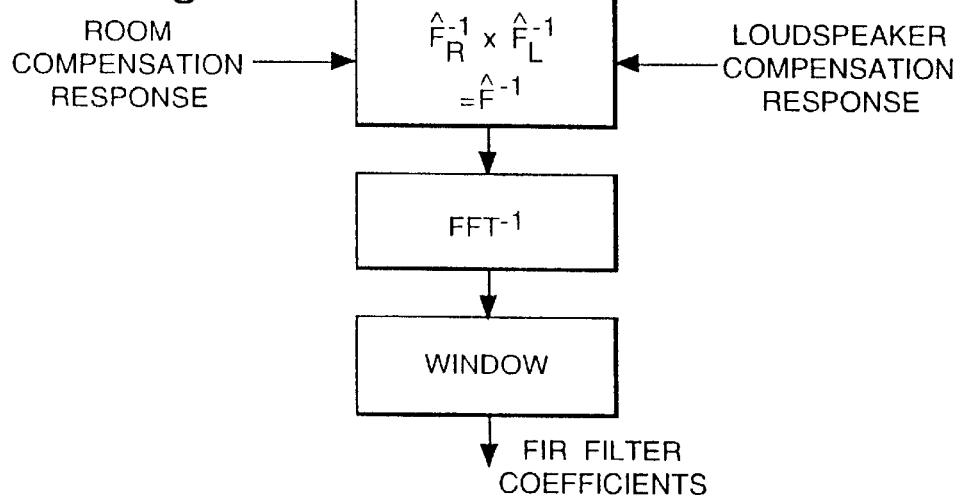
FIG. 8 illustrates schematically the method of combining FIGS. 5 and 6 in FIG. 4.

The processing smooths (i.e. reduces the amplitude and/or sharpness) of peaks and, more particularly, troughs in the room response spectrum as discussed in greater detail below. Having generated a smoothed room response, $\hat{F}_R$ the next step is to calculate the response $\hat{F}_R^{-1}$ of a filter to compensate the room response. The desired filter amplitude response is obtained simply by taking the square root of each power spectrum term and dividing the result into unity (or, in principle, a different room target response). The desired phase response is, for a minimum phase filter, directly calculated from the amplitude spectrum as the Hilbert transform of the logarithm of the amplitude spectrum. From the phase and amplitude spectra, the required filter coefficients can be derived by an inverse Fourier transform back into the time domain, with appropriate windowing to limit the length of the filter. Although it would be possible to separately derive the room correction filter, it is prefered that, as shown in FIG. 8, once the phase and amplitude spectra of the desired room correction filter have been calculated, they are multiplied with the spectra already derived for the loudspeaker correction filter to provide a frequency domain description of a combined correction filter calculated to compensate both the loudspeaker and the room; for a FIR filter, coefficients of the combined filter are then derived by inverse Fourier transform of the combined spectral response.

The filter coefficients thus calculated are then stored for use by the digital filter 5 in subsequent audio reproduction.

Figure 9:
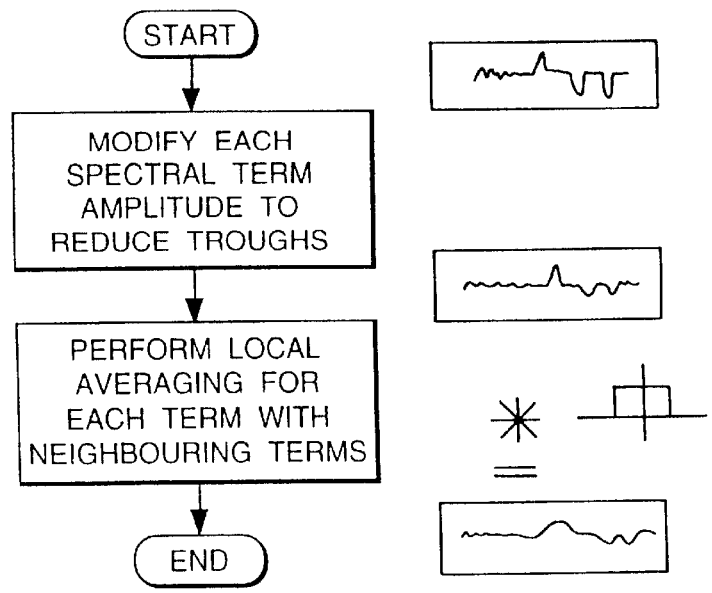
FIG. 9 illustrates a step in the method of FIG. 7.

Referring to FIG. 9, the processing comprises two operations; an amplitude adjusting step in which the amplitude of spectral components is adjusted in dependence upon their own value in a non-linear fashion so that the depth of troughs is reduced, and a smoothing step in which the amplitude of each spectral component is adjusted in dependence upon that of its neighbouring components so as to provide some degree of smoothing, averaging or low pass filtering of the spectral power response which reduces the sharpness of peaks and troughs. This may be achieved simply by providing a moving average over a number of samples (a rectangular smoothing kernel or window), or by employing a more sophisticated smoothing kernel such as a triangular or quadratic kernel. The kernel shape also has some effect on truncating the length of the eventual filter; the smoother the spectrum, the shorter the filter.

The choice of the form of adjustment depends primarily upon the size of the listening area or compensation volume within the room which it is desired to compensate. For equalisation at a single point, it is possible to exactly compensate even the deepest trough or highest peak without undesirable psycho-acoustic effects. For a small compensation volume, a relatively small adjustment avoids severe psycho-acoustic effects but provides detailed equalisation of response dips, whereas a larger adjustment, necessary for a larger compensation zone, produces a compensation filter which does not compensate deep or narrow response troughs. In fact, it is found that the volume over which a compensating filter having a given degree of adjustment operates is on the order of a predetermined number of wave lengths irrespective of frequency; in other words, in order to compensate over a given volume for all frequencies, it is necessary to use a frequency dependent degree of adjustment of the response spectrum so as to smooth peaks and troughs to a greater degree at higher frequencies than at lower frequencies.

We have discovered that at very low frequencies (below 20 Hz or 30 Hz) traffic and machine noise, together with high frequency components of variations of atmospheric pressure due to meteorological phenomena, will be measured by the microphone 7 and hence will erroneously appear to be part of the room response spectrum. It is therefore preferred to very strongly smooth the measured room response below some minimum frequency around 20–30 Hz.

It is undesirable to have sharp transitions between types of spectral processing, however, as this invariably sounds unnatural to the listener. The amplitude adjustment function used therefore has the following effects on the compensation filter response derived:

1. It makes the compensation filter response substantially independent of large troughs in the room response at very low frequencies:
2. It makes the compensation filter response progressively less dependent upon troughs in the room response occurring at progressively higher frequencies above some frequency threshold:
3. It applies an approximately constant amount of amplitude adjustment over the spectral region between very low frequencies and the threshold: and
4. There are not sharp transitions between the three regimes above.

One suitable amplitude adjustment function is as follows:

$$\frac{S(f)+k(f)^2}{K+k(f)^2} = \hat{S}(f)$$

Where the function $k(f)^2$ is:

$$k(f)^2 = \left(\frac{fLOW}{f}\right)^4 + e + \left(\frac{f}{fHIGH}\right)^4$$

The constants e and K are empirically set to some suitable value. It will be seen that this function achieves the above objects, but many other amplitude adjustment functions—for example, using powers other than 4—could be employed. The coefficient calculator 6 therefore takes the stored spectral power coefficients, and replaces each by a modified spectral power coefficient to yield an amplitude processed set of coefficients. Each amplitude modified coefficient is then, as mentioned above, processed by replacing it with a local average comprising the normalised sum of that coefficient and its immediate neighbours. The number of immediate neighbours, and hence the resulting spectral smoothness, is also preferably a function of frequency to achieve the three broad criteria set out above.

The two operations need not be carried out sequentially, but can be combined. Further, each operation can be made to depend upon the other; thus, the degree of smoothing (i.e. the amount by which the modified value of each coefficient depends upon its neighbours) may be varied in dependence upon the amplitude of a coefficient, or vice versa, so that sharp troughs are both smoothed and reduced in amplitude but other coefficients are not.

Limited Pre-echo Filtering

In the foregoing, correction for the room acoustic using the minimum phase filter was proposed. It is found that using this type of correction, room reverberation times (defined as the time shaken for an impulse amplitude to die away to some low level, for example –60 dB) are substantially reduced, and the response of the entire filter, loudspeaker and acoustic environment path itself has no pre-echos over the compensating volume.

However, we have found that room reverberation time can be reduced further, with little or no penalty in psycho-acoustic acceptability, by allowing the filter 5 to exhibit slightly non-minimum phase behaviour. Since the acoustic environment response cannot be exactly corrected over the whole compensation volume, a certain amount of phase error be measurable at some points, but we find that by constraining the amount of preresponse exhibited by the filter 5 to a much lower level than would be the case for linear phase compensation of the room, the result is still acceptable to the listener.

Typical pre-response times which are acceptable are 20 msecs to 50 msecs; one useful (but not rigorous) design rule is found to be that the maximum permitted pre-response time of the filter 5 (or, to be more accurate, of the room compensation filter element of the filter 5) should not significantly exceed the difference the time of arrival of a sound from the loudspeaker at the compensation volume and the time of arrival of the first reflection of that sound in the compensation zone from the most distant reflecting surface of the room.

This measure can of course be calculated for any given room dimensions and loudspeaker and listener positions, or alternatively could be measured from the impulse response of the signal received by the microphone 7, but in general it is preferred to set the maximum amount of pre-response for the filter to compensate the acoustic environment at a predetermined level typically less than 50 msecs.

In this context, "pre-response" generally means that portion of the envelope of the impulse response occurring prior to the peak value of the impulse response. Where a measurable definition is necessary, the pre-response of a filter may be defined as the time, from the first component of the impulse response of the all pass part of the filter response, to the "centre of gravity" of the all pass impulse response;

$$\Sigma a_t^{2*}t/\Sigma a_t^2,$$

where $a_t$ is the amplitude of the impulse response at time t.

It is also possible to make some qualitative statements about the shape of the impulse response of the filter; there should be no discrete peak earlier and lower than the highest peak in the impulse response, as this will generally be audible as a pre-echo unless very closely spaced. We have also discovered, however, that the ear appears to respond more to early parts of transients, so that the mere absence of early peaks is insufficient to eliminate pre-echo; a sharply rising pre-response (compared with the later portions of the impulse response) will still sound audibly unacceptable, but an extended and slowly rising pre-response generally avoids pre-echos.

Figure 10:
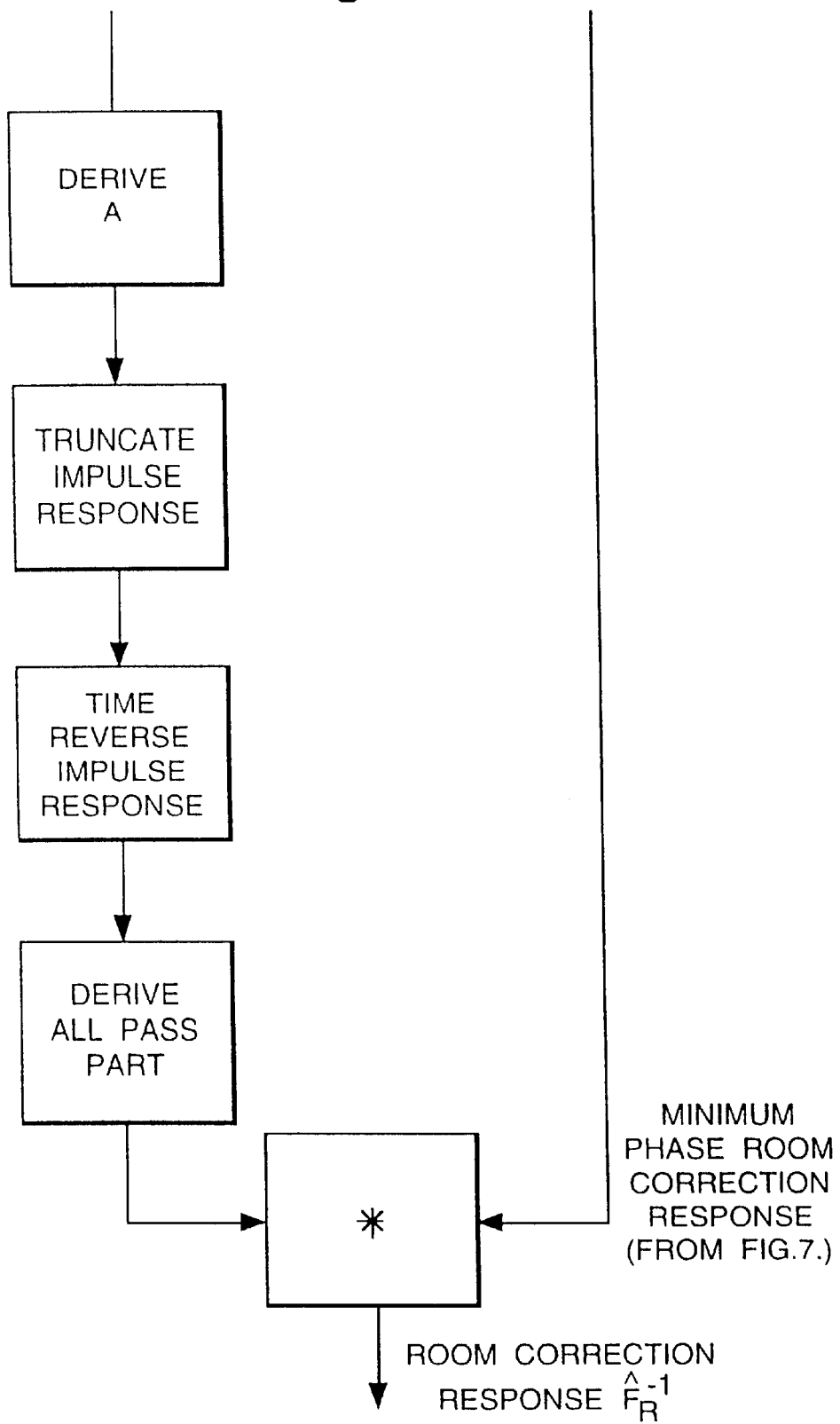
FIG. 10 illustrates a further step in the method of FIG. 7.

Referring to FIG. 10, and recalling that is is possible to consider any given response to be the convolution of (i.e. equivalent to a cascade of) a minimum phase filter and an all pass filter, it will therefore be apparent that the minimum phase correction filter serviced by the process of FIG. 7 leaves uncorrected an all pass component of the acoustic environment function.

Some degree of correction of this component is provided by deriving a representative all pass transfer function A of the acoustic environment; truncating the length of the impulse response of the all pass component A to some predetermined limit (e.g. 50 msecs); time reversing the impulse response (it being remembered that the convolution of an impulse response and its time reversal give rise to a linear phase); deriving the all pass part $A^{-1}$ of the time reversed response; and convoluting this with the minimum phase room correction response produced according to the process of FIG. 7.

The process of deriving an all pass part of a response may be achieved in several ways; for example, in the frequency domain, by deriving the minimum phase component of the spectrum and then dividing this into the original spectrum. To avoid division by zero anomalies, the minimum phase component may first be smoothed as above.

The all pass component A of the room response which is selected for correction may be derived by deriving the all pass components for each microphone measured signal, separately, and then selecting one of the calculated all pass responses as representative. This could be one which corresponds to a central microphone position within the compensation zone, or could be one exhibiting the lowest deviation from the average of all the responses.

Figure 11A:
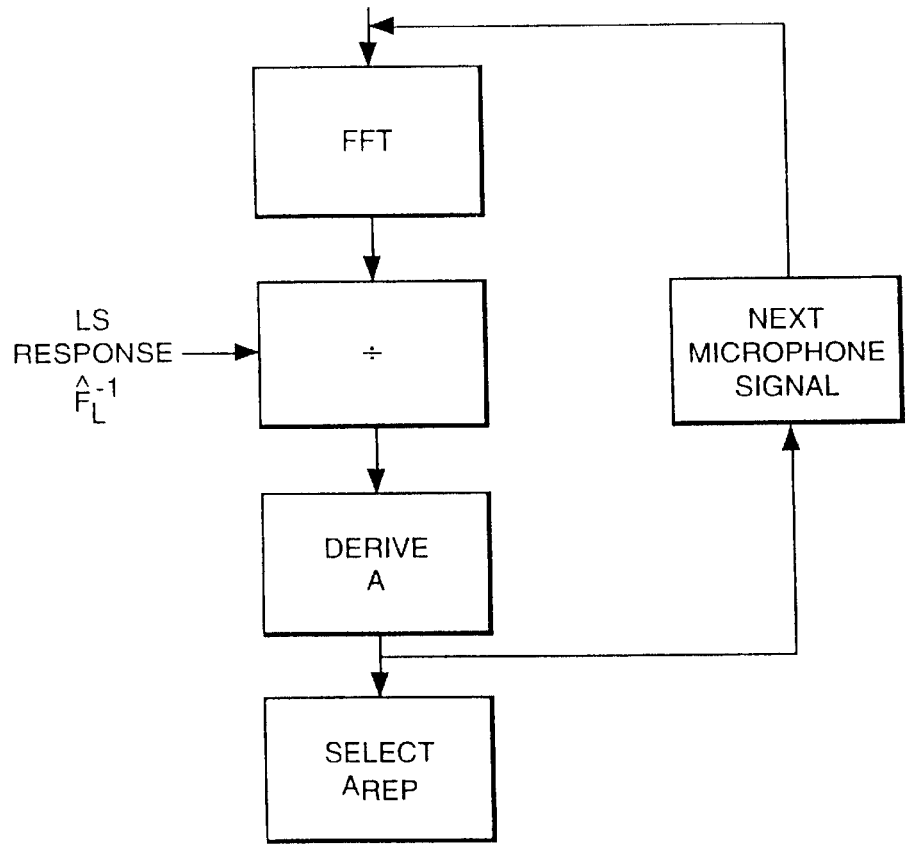
FIG. 11a illustrates a step in the method of FIG. 10.
Figure 11B:
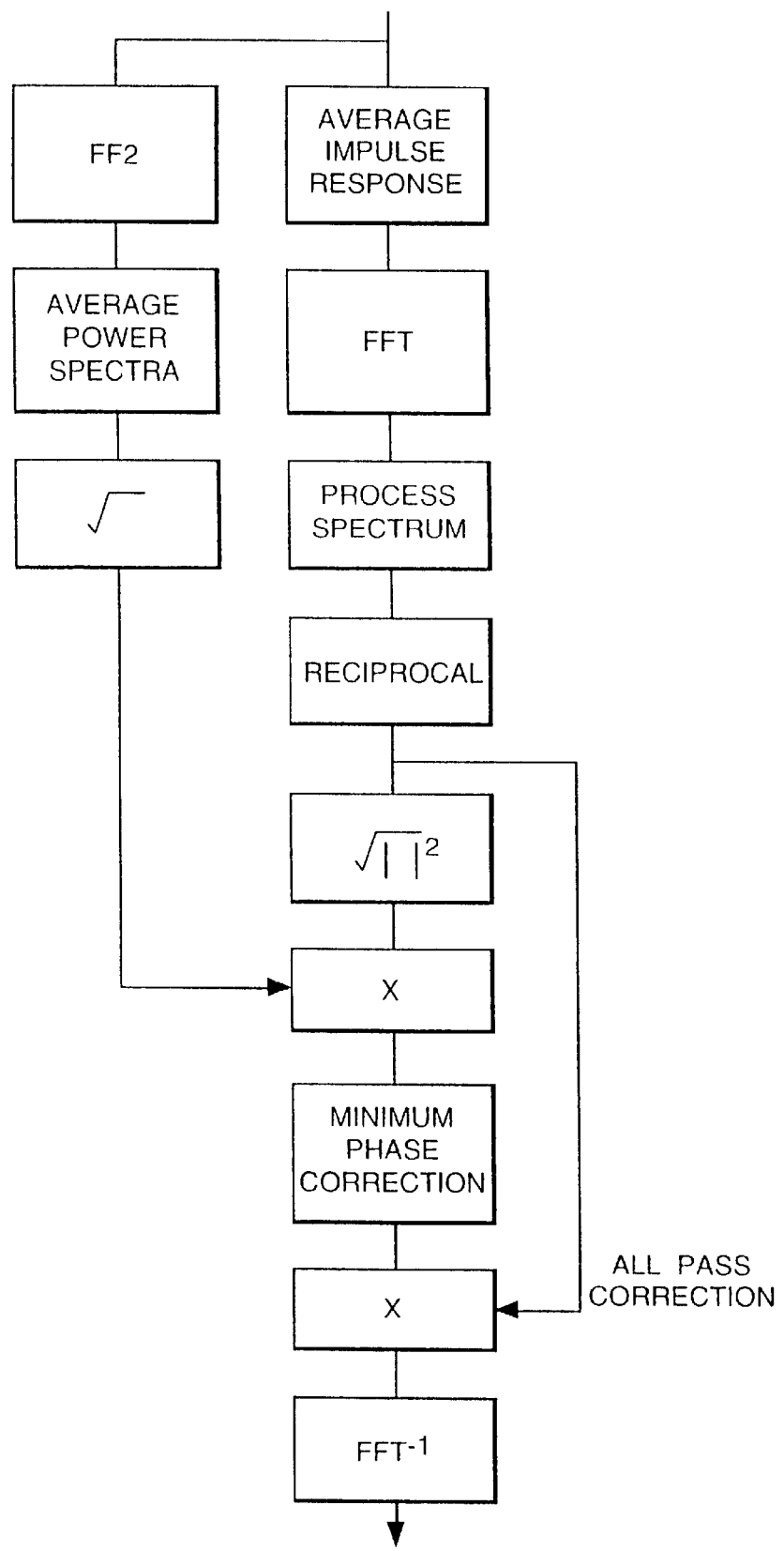

As an alternative to the above method of serving the response of the limited pre-response filter, referring to FIG. 11$b$ the impulse response is measured at each microphone position (with their initial, t=0, components aligned) may be averaged and the averaged impulse response Fourier transformed. The resulting spectrum is strongly smoothed using a local averaging kernel as discussed above, and the reciprocal spectrum is derived—or, more specifically the "regularised reciprocal" defined as $c^*(f)(K+k(f))/c(f)c^*(f)^*k(f)$ where $c^*$ is the complex conjugate of c, K is chosen to have approximately the same mean value as $cc^*$, and $k(f)$ is an amplitude varying function of the kind discussed above.

As shown in FIG. 11$b$, the RMS term for each spectrum of the inverse spectrum thus derived is multiplied by the RMS power spectrum derived as in FIG. 7, and a minimum phase response is derived to compensate this combined response. The inverse spectrum itself is then used as the limited pre-response all pass which is multiplied by the minimum phase correction and the resulting correction spectrum is inverse Fourier transformed into the time domain to obtain the desired filter coefficients.

The use of limited pre-response correction of this type with a suitable limit on the length of the pre-response (generally less than 50 msecs; preferably less than 20 msecs and advantageously less than 10 msecs) reflections from within the loudspeaker cabinet, and off the walls adjacent the loudspeaker, can be cancelled without giving rise to audible pre-echo. The pre-response limits are, it should be stressed, very much shorter than the amount of pre-response which would normally be required to provide linear phase correction for the entire room (typically on the order of several seconds).

Implementation

We have found that at low frequencies a filter with a frequency resolution of down to 1 Hz is desirable for acceptable compensation. It is also at low frequencies that some of the least acceptable loudspeaker and room phase distortions occur. Providing a filter which would give a resolution of 1 Hz across the full audio band width of 0–15 kHz would however require a filter having a length of the order 30,000 stages and, at a sampling rate of 30 kHz, therefore require 30,000 times 30,000=900 megaflops processing power—which is not at present practicable.

Low Frequency Equalisation

Because many of the features of the responses it is desired to correct occur at relatively low frequencies (below 1 kHz, or more specifically below 500 or 300 kHz), it is possible merely to compensate the room and loudspeaker responses in these frequency regions.

Operating only on the low frequency regions can of course be achieved at a much lower sampling rate and, for a given frequency resolution, a shorter filter. However, because the ear is particularly sensitive to sudden jumps or changes in spectral response it is particularly necessary to take great care than the transition between the compensated and uncompensated frequency regions is smooth and gradual without discontinuities.

Figure 12:
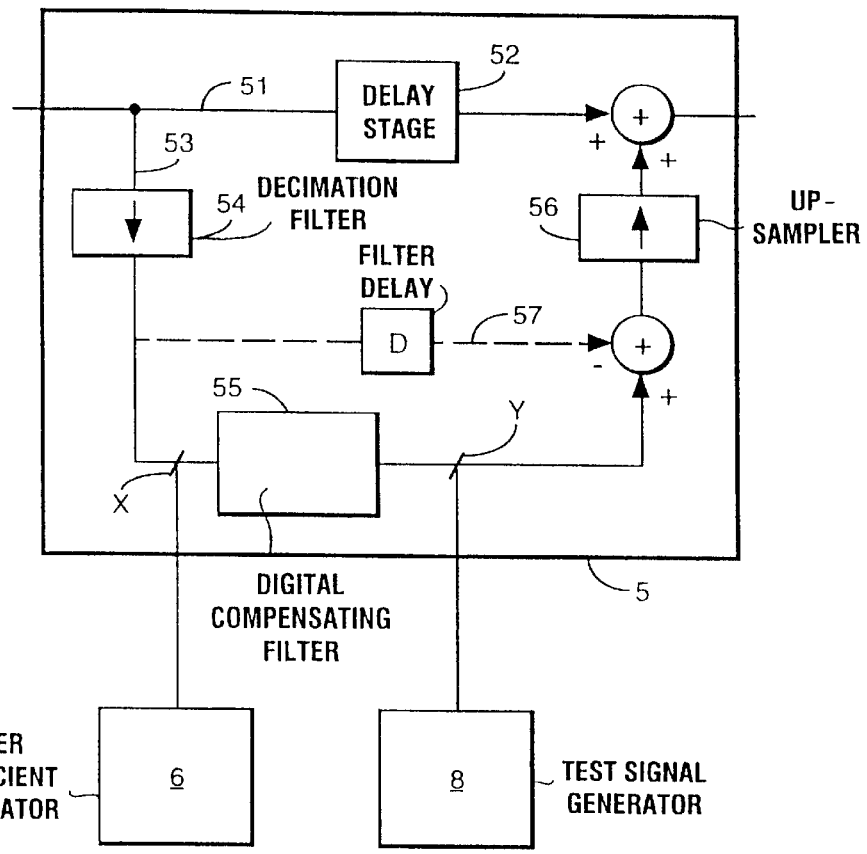
FIG. 12 illustrates the form of a filter 5 in FIG. 2 according to a first embodiment of the invention.

Referring to FIG. 12, in an embodiment of the invention for compensating at low frequencies, the filter 5 may be represented as comprising two separate signal paths. The first path 51 includes a delay stage 52 characterised by a delay time 1 supplied by the coefficient calculator 6 as discussed below. The second path 53 includes a downsampler or decimation filter 54, receiving input samples at some predetermined rate (for example, 44.1 kHz) and generating output samples at a much reduced rate equivalent to the sampling rate for the frequency range to be compensated (i.e. twice the highest frequency present); for a compensation range up to 500 Hz, the output sample rate would therefore be 1 kHz.

To avoid aliasing, the downsampler 54 includes low pass filtering; typically, each output sample represents the average of a plurality of input samples. The down sampled and band limited signal is filtered by a digital compensating filter 55, so as to effect the desired room/speaker compensation, and the bit rate of the filtered signal is then increased by an up-sampler 56 back to the input frequency (e.g. 44.1 kHz). The up-sampler 56 is an interpolating filter receiving successive signal samples and generating a plurality of interpolated sample values in between.

The length of the delay 1 of the delay stage 52 in the first path 51 is equivalent to the lengths of the delays caused by the down converter 54 and up converter 56 (which are predetermined and constant) together with the filter delay D caused by the pre-response of the filter 55 (which is calculated by the coefficient calculator 6).

In a conventional split band filter, the first path 51 would include a high pass filter to match the low pass effects of the down sampler 54. We have found this both undesirable and unnecessary however. Instead, prior to up sampling by the up sampler 56, the down sampled but unfiltered signal delayed by the filter delay D is subtracted from the filtered output of the filter 55. Thus, instead of adding to the original full band width signal a component comprising the filtered low frequency portion thereof, what is added back is the difference generated by the compensating filter 55 itself independently of the effects of the down sampler 54 (which are cancelled by the subtraction). No filtering of the high and mid-range signal components within the path 51 is thus necessary.

In fact, there is no need to separately subtract the unfiltered down sampled signal by providing an extra signal delay path 57; instead, this path may be considered to form part of the filter 55 and, in the case of an FIR filter, is effected simply by reducing the value of the t=0 filter coefficient by unit. The filter coefficient calculator 6 therefore performs this subtraction as the last stage in deriving the filter coefficients of the filter 55.

To derive the filter coefficients, the second signal path 53 is broken before and after the filter 55 at points X and Y respectively. A test signal (at a sample rate of 1 kHz and containing frequencies between 0 and 500 Hz is applied at the point Y, and is interpolated to increase the sample rate by the upsampler 56 and passed to the loudspeaker 1. The microphone 7 is connected to the filter input, and the down sampled output of the down sampler 54 is supplied from point X to the coefficient calculator 6. The signal from the microphone 7 is thus measured at the same sample rate as that at which the filter 55 will operate.

Figure 13:
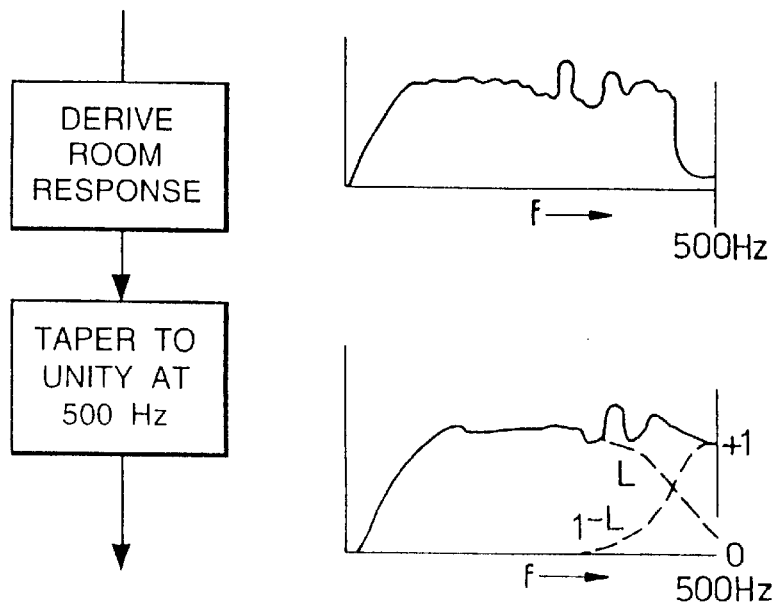
FIG. 13 illustrates a modification to the method of FIG. 6 or FIG. 7 for use with this first embodiment of the invention.

Referring to FIG. 13, the coefficient calculator 6 in this embodiment operates as described above with reference to FIGS. 3 to 11, except that because the room response measured by the microphone 7 will have been effected by the low pass characteristic of the down sampler 54, the measured room response will fall off to zero at 500 Hz. The desired compensation filter should have a response of unity at exactly 500 Hz and above, however, so as not to interfere with the unfiltered signal through the delay stage 52. Merely deriving a compensation filter to the measured response including the fall of at 500 Hz due to the down sampler 54 would therefore result in a compensation filter which strongly boosted frequencies just below 500 Hz which would clearly be unacceptable. The room response processing step within FIG. 6 therefore includes the step of tapering the measured room response towards a value of unity and just below 500 Hz, using a function which is progressive with frequency so as to avoid discontinuities in the compensation response. The exact method by which this is achieved is irrelevant, but one possible method is to multiply each spectral term above a given frequency (for example 350 Hz) with a function which decreases smoothly and monotonically from unity at 350 Hz to zero at 500 Hz, and then added unit minus the valve of the functions; i.e.

$$S'(f)=S(f)*L(f)+(1-L(f))$$

Multiple Band Filter

Figure 14:
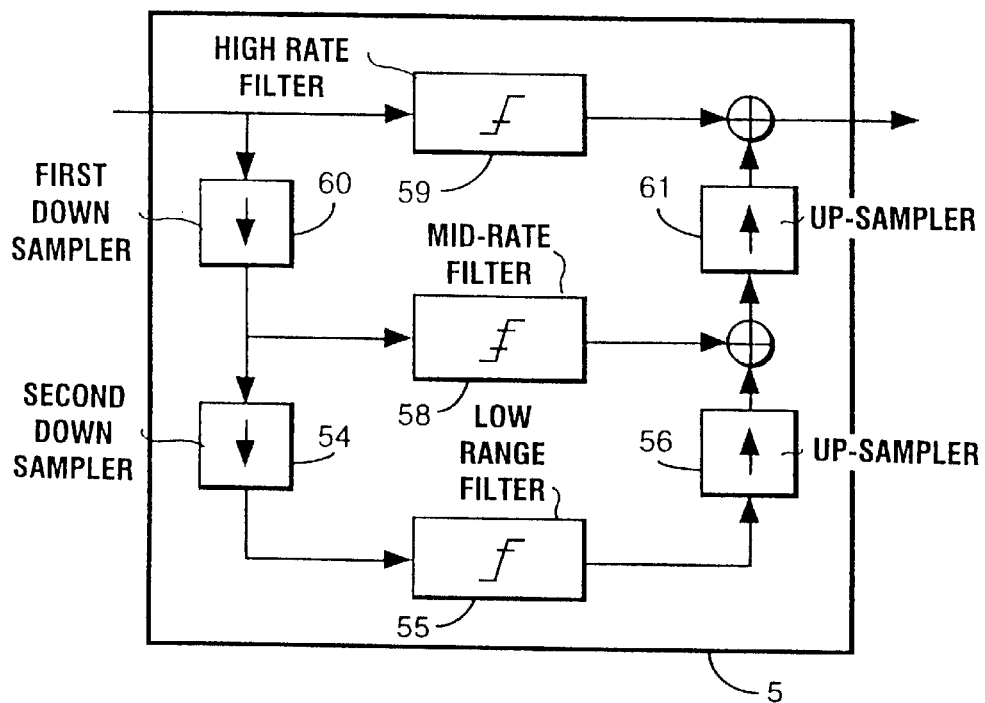
FIG. 14 illustrates schematically the form of a filter 5 according to a second embodiment of the invention.

It is also possible to provide a practical filter 5 capable of filtering the entire audio spectrum. At higher frequencies, the spectral resolution of the filter is less critical and the compensating filter response will have been smoothed to a greater degree as described above. It is therefore possible, in addition to the relatively high resolution filter 55 operating at a low sample rate, to use shorter filters 58, 59 operating at higher rates, and therefore higher frequencies, but with lower resolution, as illustrated in FIG. 14. By way of example, using two Texas Instruments TMS 320 digital signal processor devices (a first implementing the high rate filter and a second implementing the mid and low rate filters) filter dimensions of FIR filters were as follows:

| Filter | Sample Rate (kHz) | Length | (taps & ms) |
|---|---|---|---|
| H/F(59) | 44.1 | 75 | 1.7 |
| M/F(58) | 14.7 | 240 | 16.33 |
| L/F(59) | 1.8375 | 1024 | 557.28 |

| Filter | Pre-response | (taps & ms) | Resol'n (Hz) |
|---|---|---|---|
| H/F(55) | 20 | 0.46 | 294 |
| M/F(58) | 80 | 5.44 | 30.6 |
| L/F(59) | 200 | 108.84 | 0.9 |

Referring to FIG. 14, the input digital signal is filtered by the high rate filter 59. The input signal is also down sampled by a first down sampler 60 by a factor of 3, and fed to the mid-rate filter 58. The filtered signal is then interpolated by an up sampler 61 by a factor of three, and added to the high rate filtered signal from the filter 59. The down sampled input signal from the down sampler 60 is further decimated by a second down sampler 54 by a factor of 8, and filtered by the low range filter 55. The low range filtered signal is then interpolated by a factor 8 by up sampler 56 and added to the filtered signal from the mid range filter 58.

As in the embodiment of FIG. 14, the high rate filter 59 does not need to include a low frequency cutoff, since (as explained below) the coefficients of the lower rate filters take account of the effects of the high rate filter in mid and low frequency ranges.

Deriving Split Band Filters

Although the structure of the filter 5 in this case is straight forward, the band splitting complicates the process of filter derivation.

Figure 15:
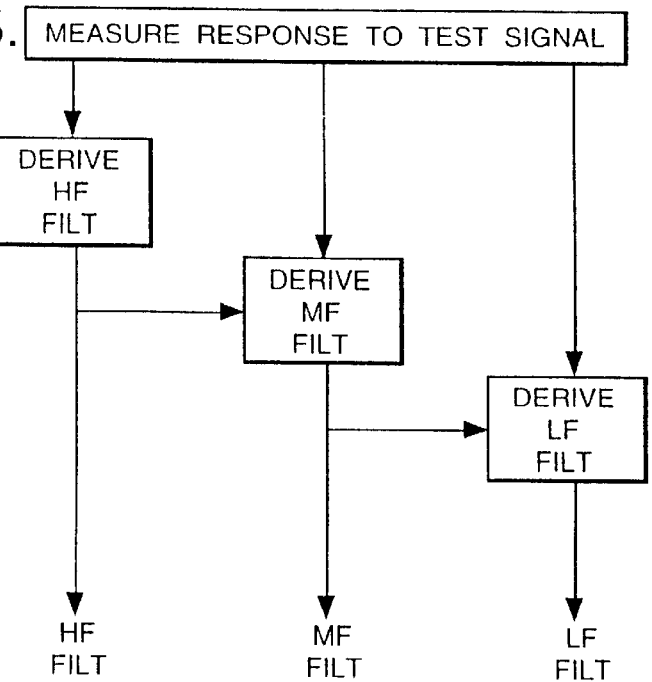
FIG. 15 illustrates schematically the method of deriving the parameters of the filter of FIG. 14.

If the coefficients for the filters 55, 58, 59 were derived separately, this could lead to anomalies in the overall response at the transition frequencies. Referring to FIG. 15, it is therefore preferred that the response for each compensation filter should be derived taking cognizance of the filter for the neighbouring band or bands. More specifically, by deriving first the response for the high rate filter 59, then deriving the response of the mid-rate filter 58 taking into account that of the high rate filter 59, and then the response of the low rate filter 55 taking account of both, smooth transitions between the responses of the three filters are obtained.

Figure 16A:
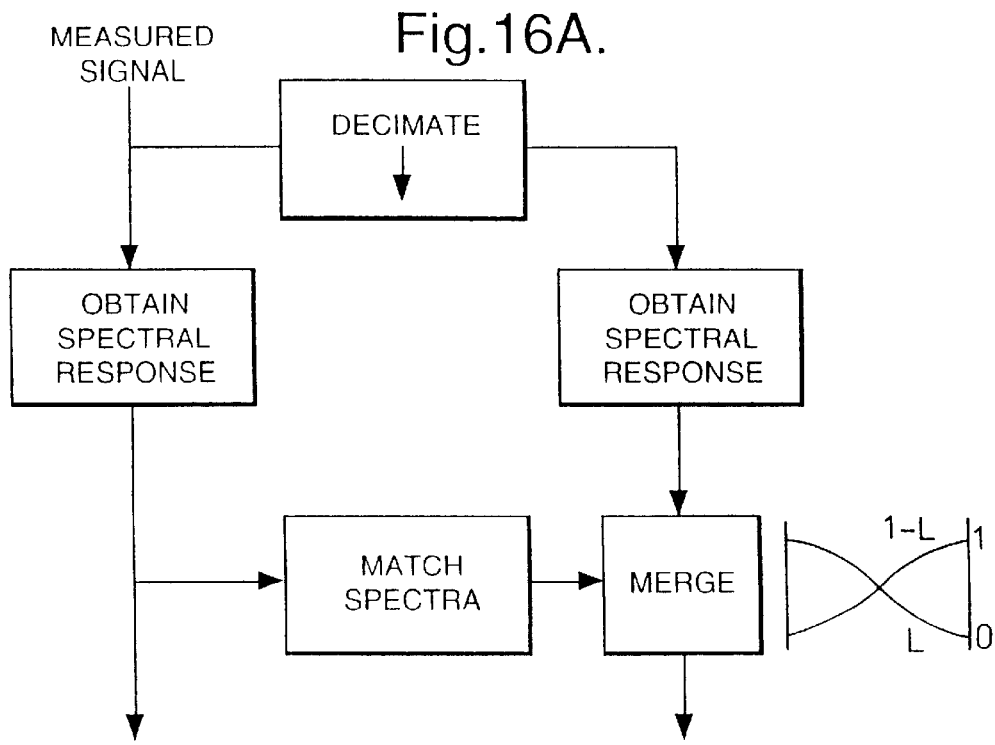
FIGS. 16a–16c illustrate in greater detail stages of the method of FIG. 15.

Referring to FIG. 16a, in a first method of taking account of higher band rate filters when calculating lower band rate filters, the signal measured from the microphone 7 is processed at its original band rate and a spectral response is obtained (e.g. by executing a Fourier transform). The measured signal is also decimated by a down sampler so as to reduce the sample rate, and consequently band limited to half the decimated sample rate. The spectral response of the down sampled measured signal is also obtained. As stated above, this will be band limited to half the sampling rate.

In FIG. 13, the process of tapering, or merging, the spectral response towards unity at the Nyquist frequency was illustrated. However, when higher band rate data is available, the process can be improved by merging the response spectrum towards that of the corresponding spectral region of the higher frequency filter at the Nyquist frequency, as shown in FIG. 16A. If the spectral responses at the different rates were obtained by transforms using different a number of terms over the operative band width, one spectrum (typically the higher band rate spectrum) will require interpolation of extra terms to intersperse the existing terms so that they match the terms of the lower rate spectrum. The operation of merging the two spectra at the Nyquist frequency is equivalent to that set out in FIG. 13; the corresponding expression is:

$$S'(f)=S_L(f)L(f)+S_F(f)(1-L(f))$$

If the spectral responses at the different rates were obtained by transforms using a different number of terms over the operative band width, and hence having a different resolution, it is advantageous to smooth the spectra using a frequency dependent smoothing kernel to smooth the higher resolution spectrum to match the lower resolution spectrum at the transition between the two.

Figure 16B:
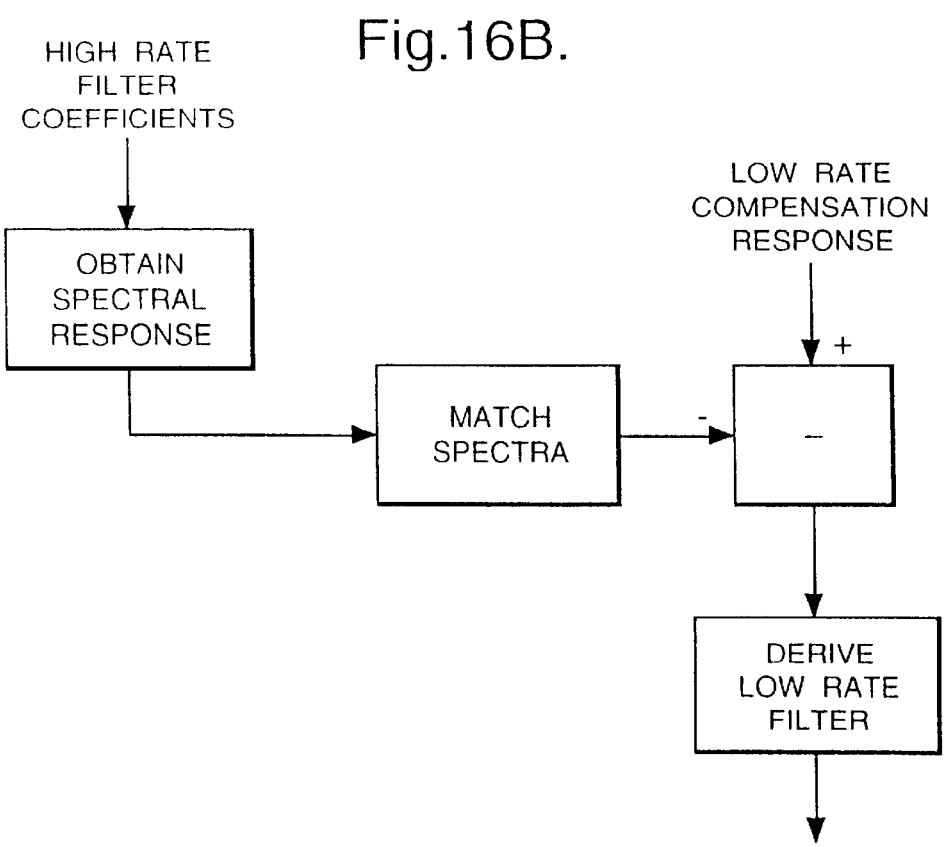

The second method by which account is taken of compensation in higher frequency bands is illustrated in FIG. 16B. In serving the co-efficients of the high rate compensation response, at least if a finite impulse response filter is used, it will generally have been necessary to generate a filter having a shorter length than would be required to exactly possess the calculated compensation response. This is conveniently achieved by windowing the impulse response obtained by applying the inverse spectral transform to the compensation spectral response. However, reducing the filter length will inevitably effect its spectral response, and may re-introduce some response in the lower frequency region which the lower rate filters are to compensate.

In fact, the low frequency cut within the target response for the high frequency filter is relatively gentle and so in any event the high rate filter may have a substantial response in the low and mid-rate regions.

In order to take account of the high rate filter response in lower frequency ranges, the spectrum of the actual high rate filter response is obtained by a further Fourier transform, and corresponding frequency terms are aligned or matched to those of the low rate compensation response prior to deriving the low rate compensation filter.

The values of coefficients of the high rate filter response spectrum which fall within the pass band of the low rate response spectrum are then subtracted from their low rate equivalents, so that the low rate filter excludes the filtering already performed by the high rate filter. The similarity with the method used to deprive the filter of the embodiment of FIG. 12 will be apparent.

Figure 16C:
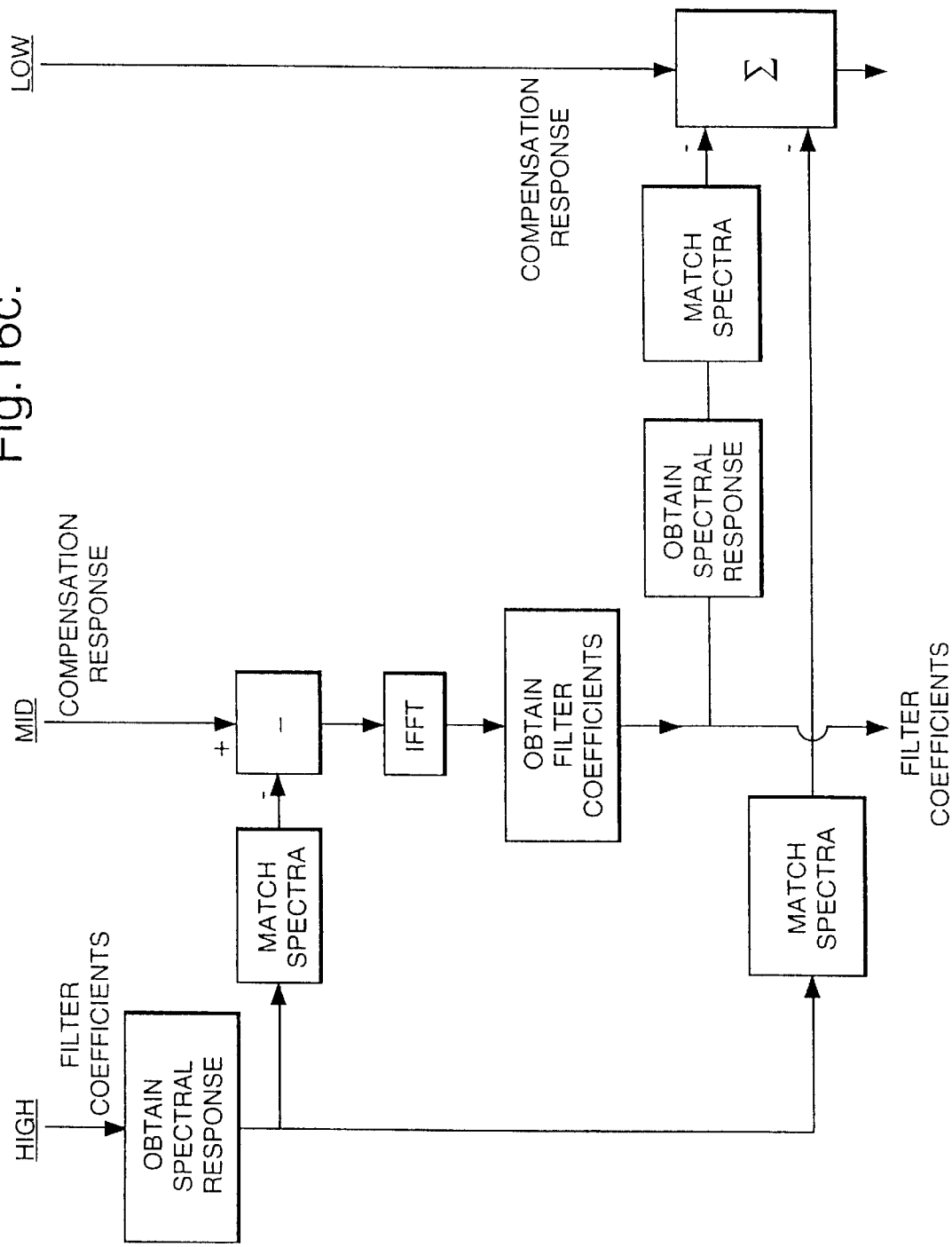

After this, the coefficients of the low rate filter are derived, e.g. by inverse Fourier transform. Where three or more filter responses in different bands are calculated, as shown in FIG. 16c, the corresponding portions of the spectral correction response obtained for each filter is subtracted from that of every filter operating at a lower rate; in other words, the spectral response of the derived high rate filter is subtracted from the spectral response of the calculated mid-band compensation, from which the response for the mid-band compensation filter is calculated. The spectral responses of the mid-band compensation filter and the high region are both filter in the low band frequency region are both subtracted from the calculated compensation response for the low frequency band filter, and from the result the low rate compensation filter is calculated.

Figure 17:
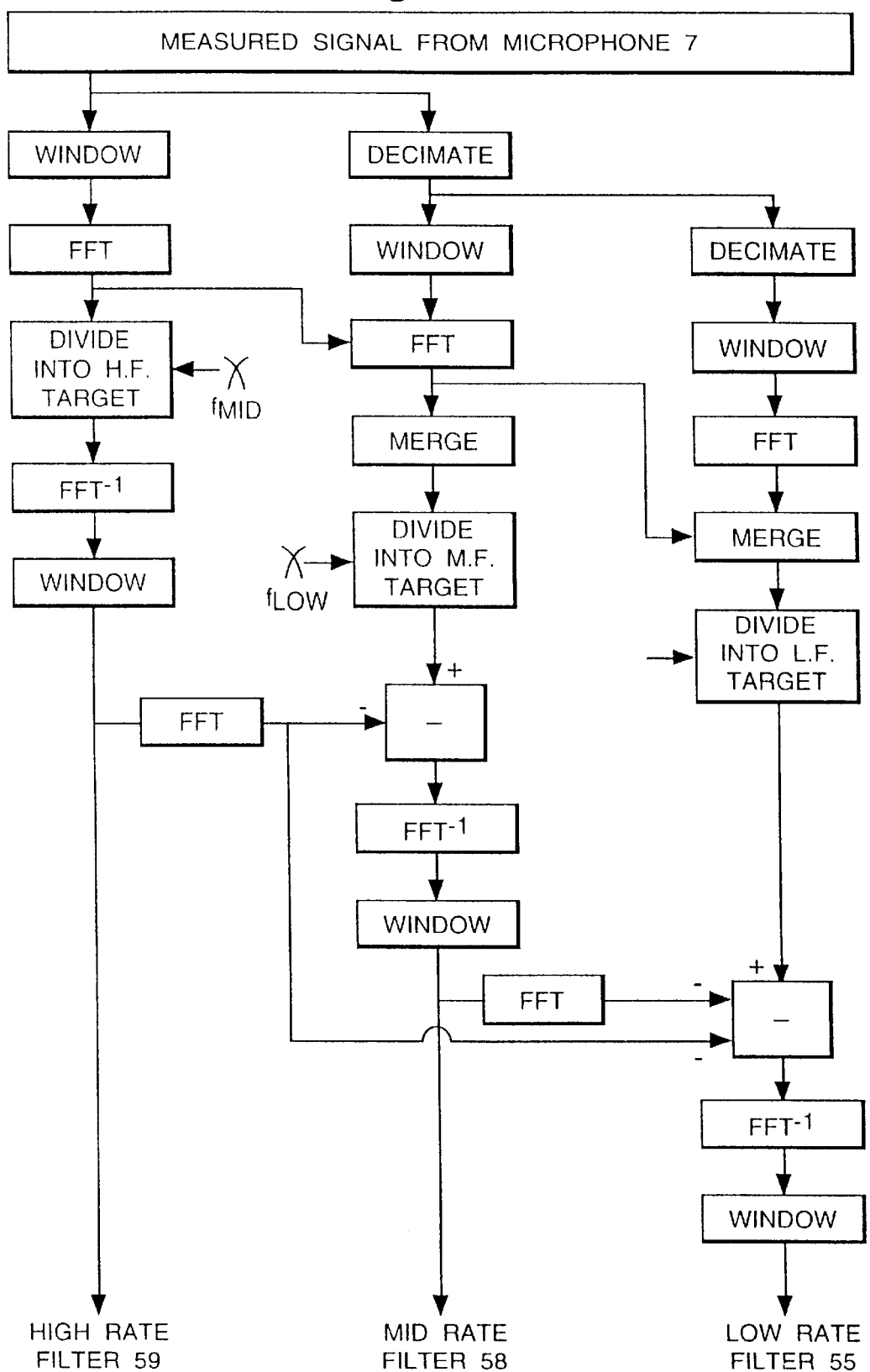
FIG. 17 illustrates in detail one example of the method according to FIG. 15.

For completeness, FIG. 17 illustrates one way in which, for example, the loudspeaker response may be derived. The full band rate signal is Fourier transformed, with an initial windowing operation using a suitable flat topped window to prevent frequency leakage, then divided into the high frequency target which comprises a predetermined response calculated, firstly, to prevent compensation for the low pass anti-aliasing and sampling filtering present in the measuring equipment, and secondly, to impose a gentle low frequency cut at below the upper frequency limit of the mid-rate filter, e.g. 4 kHz.

The compensation filter thus derived is inverse Fourier transformed, and the resulting impulse response is windowed once more or limit the filter length to a practical value (e.g. 75 samples). The measured signal is also decimated by a factor of, for example, three to calculate the mid-rate filter coefficients. The decimated signal is windowed and Fourier transformed as before. Since the decimation has band limited the spectrum, it is merged at around its Nyquist frequency with the corresponding portion of the high rate spectrum previously derived. The resulting merged spectrum is divided into the mid-frequency target, which includes a low frequency cut below the upper frequency limit of the low rate filter at, for example, 900 Hz.

As discussed above with reference to FIGS. 16B and C, the spectrum of the actual high rate filter is derived by a Fourier transform and subtracted from the mid-frequency compensation spectrum, and the result is inverse Fourier transformed and windowed to yield the coefficients of the mid-rate filter 58.

The measured signal is decimated further to provide a low rate signal, which, is before, is windowed and Fourier transformed. To correct the error around the Nyquist frequency, the spectrum thus derived is merged with the corresponding portion of the mid-frequency spectrum previously derived, and the results is divided into the low frequency target spectrum. The resulting calculated compensation spectrum has subtracted from it the spectra of the actual high and mid-rate filters 59 and 58, and the resulting corrected spectrum is inverse Fourier transformed and windowed to yield the coefficients of the low rate filter 55.

Figure 18:
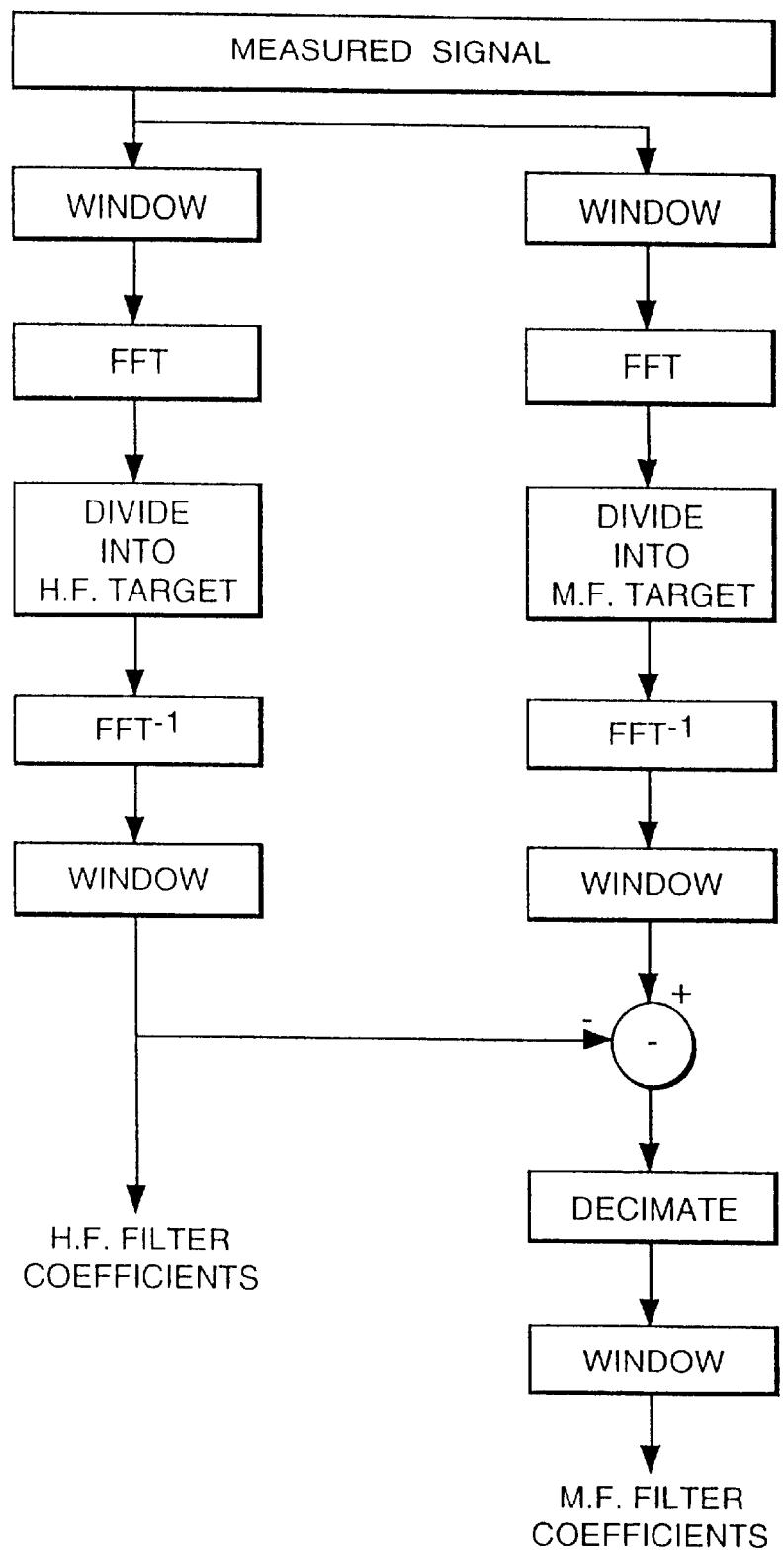
FIG. 18 illustrates schematically a variation of the method of FIG. 17.

This process can be adapted in several ways; for example, the mid-rate filter could be derived without decimation from the full rate signal, in which case, as shown in FIG. 18, the corresponding coefficients of the high frequency filter can be subtracted from those of the full rate impulse response derived by inverse Fourier transforming the mid-frequency correction response. This time domain subtraction serves to prevent the mid-range filter correcting again those aspects of the mid-range response already taken account of by the high rate filter. The mid-range characteristic of the high range filter. To obtain coefficients of a filter to work at the lower sample rate required of the mid-rate filter 58, this impulse response is then decimated (e.g. by a factor of three). Further windowing to reduce this length of the impulse response may be performed.

The same process could of course be analogy be employed to derive the low rate filter 55 taking account of the mid-rate filter 58.

In calculating the room response, the measured signals from each microphone position are separately windowed and transformed (with decimation as necessary), and the spectra averaged, prior to the subsequent stages of FIG. 17 or 18. At this stage, the corresponding band response for the loudspeaker is divided out to give the response of the room.

Compensating Source Phase Errors

The electrical source signal supplied to the filter 5 is, as disclosed with reference to FIG. 1B, usually the result of an original audio source signal S processed by electrical circuitry such as amplifiers, filters, transformers and so on having an overall transfer function $F_S$. Since the original audio source signal itself is not available, it is not in general possible to identify the source signal and the transfer function $F_S$ separately.

A modern high fidelity sound recording may have passed through many stages of processing, including AC couplings and each will include e.g. RC high pass circuits. At low frequencies, the phase leads induced by these filters can lead to noticeable phase distortion. Because the original source signal is not available, the co-efficient calculator 6 cannot automatically compensate the effect of these phase errors. It is also not possible to compensate for such phase leads using a passive analogue filter as an acausal filter is necessary: this can however be provided by a digital filter including a bulk delay or an FIR filter.

In a preferred embodiment of the invention we provide an all pass filter selectable by the user to compensate these phase errors; this can be achieved with a filter having a simple response in which the phase is responsive (at least roughly) to 1/f over bass frequencies. The constant of proportionality is selected by the user, for example by a separately provided phase control on the filter 5 housing.

It can be shown that over mid-bass frequencies, the effect of cascaded RC high pass elements can approximately be compensated by a filter having a transfer function of the form $e^{-ik/w}$, where K is a constant that can be adjusted by the listener for an optimum setting, and W is angular frequency in radians. The group delay of such a filter equals $-K/W^2$, representing a time advance which becomes larger without limit at very low frequencies. To implement this directly would require infinite processing delay, so the correction is implemented in a modified form having substantially the correct form over the audible frequency range (above around 16 Hz).

One such approach is as follows:

The Bessel filter $1/B_n(s)$ is an n-th order low-pass filter whose phase response is a maximally flat approximation to unit delay. Hence $B_n(-s/2)/B_n(s/2)$ is a n-th order all-pass with the same property. Hence $B_n(K/(2s))/B_n(-K/(2s))$ is an n-th order acausal all pass whose phase response is a maximally flat approximation to $-K/w$ for large w.

One could therefore calculate the corresponding function of w (s=iw) in the frequency domain and take the Fourier transform to obtain the corresponding impulse response. This will be acausal but will contain reverse-time exponential tails that die away at a reasonable rate, so that an available pre-response of, say 0.25 sec would be adequate.

A disadvantage of this technique is that all coefficients of the transversal filter need to be re-calculated each time the user demands a new value of K, and this makes "continuous" manual adjustment in response to a knob very difficult.

To overcome this difficulty, one can determine $K_{max}$, the maximum value of K likely to be needed, implement a corresponding acausal response as a transversal filter 62a, then subtract off the unwanted phase-shift corresponding to $K_{max}-K$ by means of a causal all-pass filter 62b, which can be implemented recursively and easily adjusted. The transversal filter 62a implements $B_n(K_{max}/(2s))/B_n(-K_{max}/(2s))$ (acausal all-pass) and the recursive all-pass filter 62b implements $B_n(-(K_{max}-K)/(2s))/B_n((K_{max}-K)/(2s))$ (causal).

Figure 19:
FIG. 19 illustrates schematically the structure of a filter embodying a second aspect of the invention.
Figure 20:
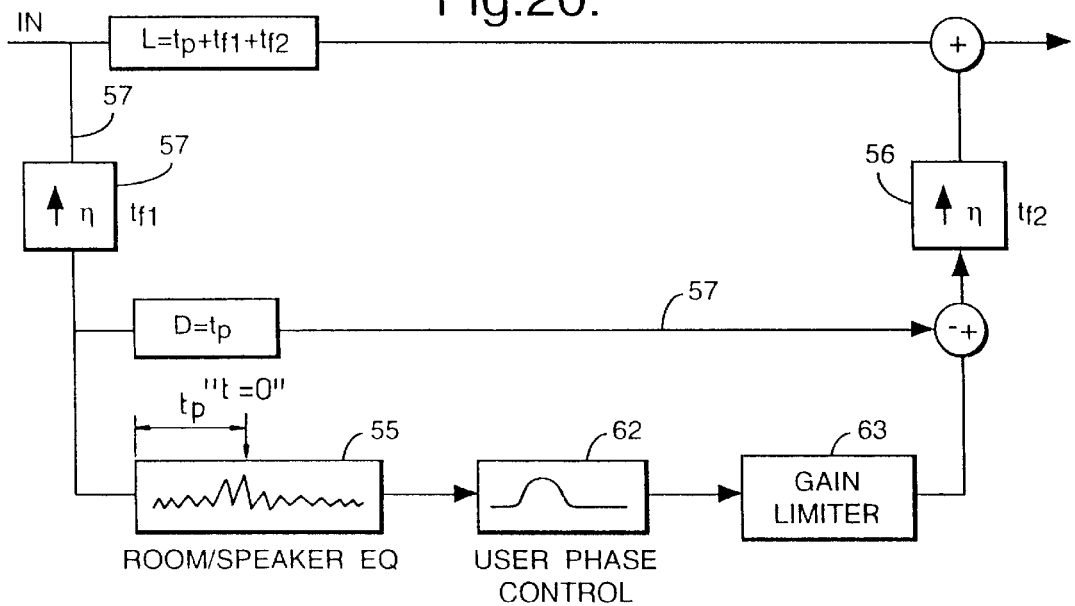
FIG. 20 shows schematically the function of the filter of FIG. 12 including this embodiment.

This structure is illustrated schematically in FIG. 19; the transversal filter coefficients will in practice be predetermined and will form part of the filter 5, whereas the coefficients of the causal infinite impulse response filter (typically a third order filter) are swiftly calculated in real time by the coefficient calculator 6 in response to variation of the value of K supplied as a control signal by a phase control knob operated by a listener. FIG. 20 illustrates the disposition of the phase control filter 62 in the embodiment of FIG. 12. Note that, in this case, the delay path 57 is required explicitly to be present.

Several pre-set $K_{max}$ values may be supplied, allowing the user to select different ranges of correction.

As stated above, it is preferred that the phase response of the compensation filter should be inversely proportional to frequency in the mid and bass frequency region. However, departures from this proportionally are acceptable. In fact, the phase response of loudspeakers in the bass region is generally not exactly proportional to 1/f, but often departs from such exact proportionality by a phase angle of a few degrees, so that corresponding variations in the correction of filter are of no importance.

It may be desirable, for other reasons, to provide a filter which approximates the inversely proportional phase response but has excursions or ripples therefrom. For example, as will later be discussed, it is desirable in many applications (such as audio visual reproduction, where synchronisation with a video signal must be maintained) to avoid long bulk delays in the audio reproduction chain. However, to precisely specify the phase response of the filter to a good approximation to the desired inversely proportional frequency relationship requires a large number of filter stages and hence, since the phase correction filter is acausal, a long preresponse and corresponding filter delay, perhaps as high as several hundred milliseconds. Accordingly, in applications (such as audio visual reproduction) where it is desirable to avoid lengthy delays, a filter deviating from proportionally but having a lower filter preresponse and hence delay is provided, in one embodiment of the invention.

One particularly preferred type of such filter has a phase response which closely approximates inverse proportionality to frequency over the mid-bass frequency ranges, but deviates therefrom by progressively increasing deviations at progressively lower frequencies; the filter is thus linear over the audio range where bass errors are particularly noticeable (around 200 or 300 Hz).

Some discussion of the suitable filters and of their derivation will now be given.

One example of a phase compensation or correction filter has the response $(g-z)/(1-gz)$, where, as conventional, $z^{-1}$ indicates the unit sample delay. This filter defines an acausal all pass network if the magnitude of g is less than 1, and its phase behaviour compensates the phase response of, for example, a loudspeaker having a low frequency roll off at 12 dB per octave below its bass cut off frequency and a phase response corresponding to that of the all pass filter $(g-z^{-1})/(1-gz^{-1})$.

This correction filter can be implemented with an impulse response of a realistic length if impulse response terms at a sufficiently low level (for example, below −100 dB) are omitted. Where this figure is taken, the preresponsive length of the filter is $11.5/(1-g)$ samples.

The phase response of the acausal filter $(g-z)/(1-gz)$ is not exactly inversely proportional to 1/f at frequencies above the cut off frequency of the loudspeaker. For g very close to 1 in value, the phase response of the acausal phase compensation filter approximates that of $-(1+jw\tau)/(1-jw\tau)$ where w is angular frequency and $\tau$ is the time constant (equal to $1/(1-g)$ samples) of the filter, which has a phase response, at angular frequency w, of $2\cot^{-1}(w\tau)=2w\tau$ (radians) at higher frequencies. However, for $w\tau=1$, $2\cot^{-1}(1)=2\pi/4=1.57$ radians which deviates from the ideal $2/w\tau$ by 0.43 radians. For $w\tau=2$, $2\cot^{-1}(w\tau)-2/w\tau=-0.073$ radians=−4.17°. Thus the deviation from the ideal inverse frequency law is less than 0.1 radian above about twice the cut off frequency of the loudspeaker, (typically above about 70 Hz), the deviation reducing rapidly with increasing frequency.

Although the acausal phase compensation filter $(g-z)/1-gz)$ has a shorter preresponse (of $11.5\tau$) than filters that more exactly compensate for a phase response proportional to 1/f, it is also possible to use more elaborate acausal phase compensation filters with an even shorter preresponse of around $3\tau$ or $4\tau$ (corresponding typically to a preresponse of about 10 or 15 msec for a loudspeaker cut off frequency of 50 Hz).

Figure 37A:
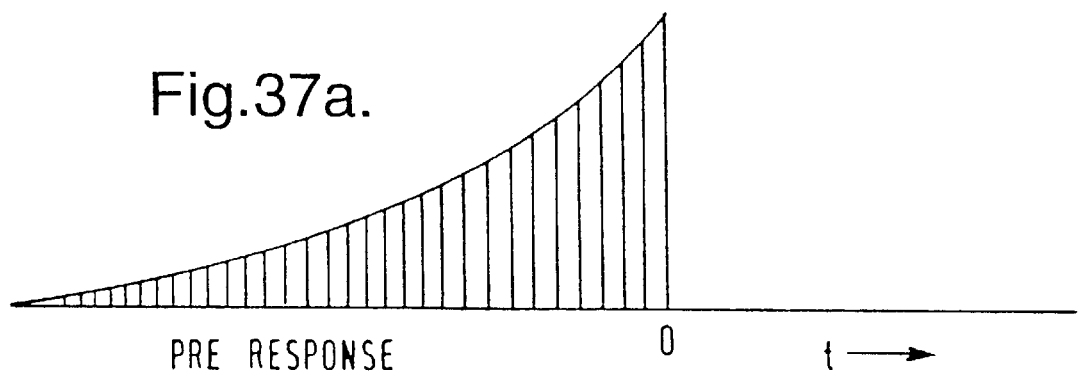
FIGS. 37a–c shows schematically modification of the impulse response of a phase lead correction filter according to an aspect of the invention.

Referring to FIG. 37a, the impulse response of the bass phase correction filter described above therefore corresponds generally to a time reversed version of the all pass (i.e. phase only) part of the Bessel correction filter described above, and thus has the general form of an exponential attack of infinite length prior to the "t=0" or main term of the impulse response. Truncating this infinite preresponse would lead to ripples in the phase response, but would also lead to ripples in the amplitude response so that the filter would no longer be an all pass filter. However, as noted above, truncation of extremely low magnitude terms in the impulse response is generally acoustically acceptable.

In a preferred embodiment, however, we provide a new method of truncating the preresponse of an all pass correction filter of this type, whilst still maintaining its amplitude response intact. This enables the realisation of a filter having a shorter bulk delay (i.e. preresponse). This is achieved by employing a filter which corresponds to a cascade of the above described filter and a further all pass filter which has the effect of truncating the preresponse; since both filters are all pass, the filter corresponding to their cascade must also be all pass and hence distortion of the amplitude response is avoided.

A first, relatively crude, method of doing so employs a casual all pass truncation filter as follows:

$$(g-z)(1-g^n z^n)z^{-n}/(1-gz)(1-g^n z^{-n})=(z^{-n}-g^n)(g-z)/(1-g^n z^{-n})/(1-gz)$$

where the value of n is selected such that $g^n$ is small (say <0.1), the term $(1-g^n z^n)$ is factorable, using simple arithmetic, by the term $(1-gZ)$, so that the combined filter response is:

$$z^{-n}(g-z)(1+gz+g^2 z^2 + \ldots + g^{n-1} z^{n-1})/(1-g^n z^{-n})$$

Figure 37B:
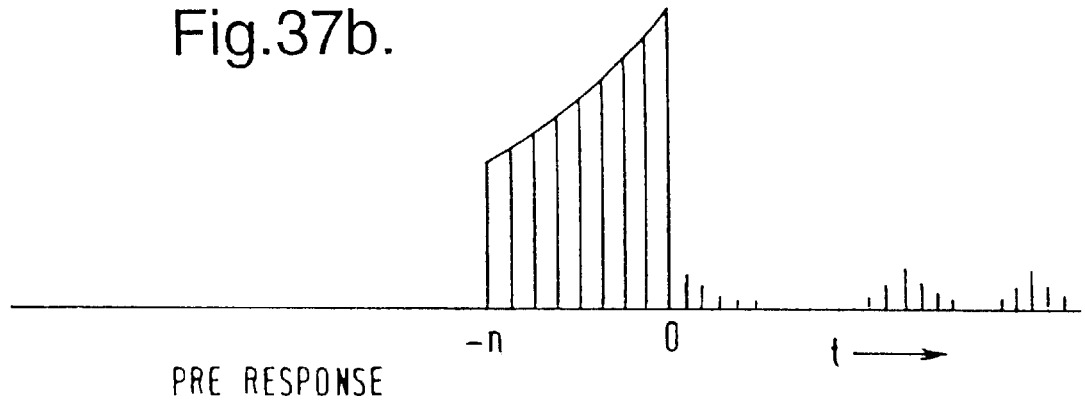

In this filter, the denominator is causal and so is the numerator. The impulse response of this filter is indicated in FIG. 37b, and the preresponse will be seen to be truncated to n samples. As a consequence of the truncation, low level spaced components in the post response are introduced; these render the post response portion of the impulse response considerably longer, but do not thereby extend the bulk delay of the filter (which is dictated by the preresponse) and can in practice readily be realised using a simple recursive filter structure.

The factor $(z^{-n}-g^n)/1-g^n z^{-n})=z^{-n}(1-g^n z^n)/(1-g^n z^{-n})$ produces an overall time delay $z^{-n}$ of n samples, plus phase deviations of order $\pm 2g^n$ radians for small values of n, since the numerator and denominator can both be in error by up to $\pm g^n$ radians.

A preferred implementation of this filter provides a finite impulse response filter for implementing the numerator (providing the bulk delay necessary for realising the preresponse) and a recursive filter for realising the denominator, the two filters being cascaded in series; as described above, the recursive filter coefficients may be varied in use to vary the phase correction.

Whilst the technique of reducing the preresponse does so without changing the amplitude response of the filter, in some applications the sharp step in the impulse response may, as noted elsewhere in this patent, be psychoacaustically audible. Accordingly, a more preferred embodiment which avoids this will now be described.

Figure 37C:
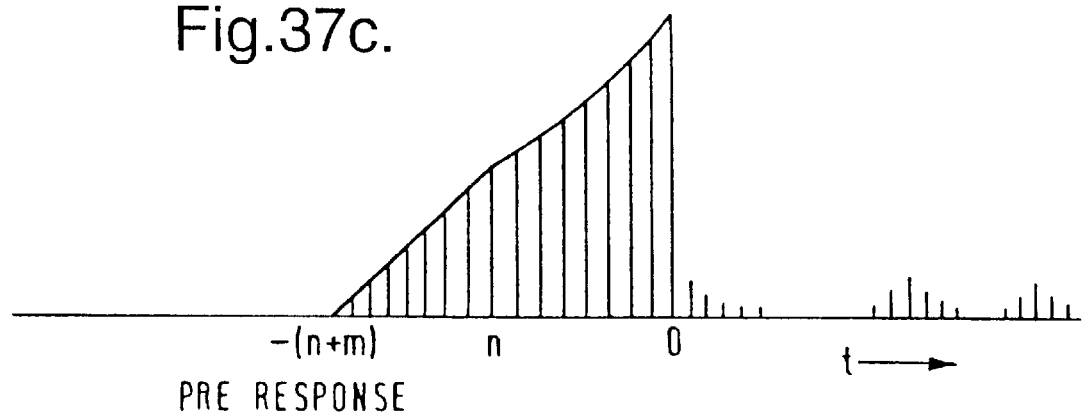

Referring to FIG. 37c, a smooth transition in impulse response between the value at a sample $-n$ of the response of FIG. 37a and 0 at some sample $-(m+n)$ may be produced by averaging the n+1 impulse responses corresponding to those which would be produced by truncating the impulse response of FIG. 37a by multiplying by a truncating all pass filter of the above type in which n is replaced by (n+1), where i is each integer from 0 to m. It would in principle be possible to provide a bank of filters, each truncating the impulse response at a value one sample different to the others, between $(-n)$ and $-(n+n)$, and summing their outputs. However, the same effect is achieved by employing a more complex casual all pass truncation filter:

$$\frac{(g-z)\left(1-\sum_{j=0}^{m} g^{n+j} a_j z^{+n+j}\right) z^{-n-m}}{(1-gz)\left(1-\sum_{j=0}^{m} g^{n+j} a_j z^{-n-j}\right)}$$

The coefficients $a_j$ are normalised to sum to unity, s that the numerator is divisible by $(1-gz)$; in on example, all values of $a_j$ are equal to $1/(m+1)$, which provides a smooth attack in the preresponse a illustrated in FIG. 37c.

In this particular example the phase ripple resulting is due to the factor:

$$\frac{(1-\Sigma g^{n+j} a_j z^{n+j})}{(1-\Sigma g^{n+j} a_j z^{-(n+j)})}$$

and consequently decreases with frequency.

In general, it is found that acausal phase compensation can acceptably deviate from being proportional to 1/f within the audio band if the deviation is less than about 0.1 radians above a frequency corresponding to about twice the loudspeaker bass cut off frequency, and if the phase deviation decreases within increasing frequency f more rapidly than 1/f (or, in general, some constant times 1/f).

Referring to FIG. 37c, in practice, the values of n and m may be selected such that m=n/2, or thereabouts, to give a fairly rapid but smooth fade in to the impulse response. The selection of the values of g, n and m is determined in part by the maximum acceptable bulk delay (n+m) and in part by the maximum acceptable phase ripples. Recalling that $\tau$, the time constant of the all pass acausal filter the preresponse of which (shown in FIG. 37a) is to be truncated, is equal to $1/(1-g)$, if, for example, $g^n$=0.05 then n+m=4.5$\tau$.

The above described technique of taking a first filter having a predetermined amplitude and phase response and exhibiting an impulse response with a substantial preresponse, and then generating therefrom a second filter having an abbreviated preresponse but exhibiting the same amplitude response (at the cost of some phase distortion), by multiplying the first filter by a causal all pass network, can be extended to other problems than the present described context of loudspeaker compensation. In general, the inventive technique of so doing comprises providing that the numerator of the truncating all pass filter is such that it can be factored exactly by the denominator of the first filter of the impulse response for which it is desired to truncate. This can be expressed in general as:

$$\left[\frac{(P_k(z)}{(-z)^k (P_k)(z^{-1})}\right] \times \left[\frac{(Q_{n+m})(z) z^{-m-n}}{(Q_{n+m})(z^{-1})}\right]$$

where $P_k$ and $Q_{n+m}$ are polynomials of degrees k and n+m respectively. The first factor is a time reversed (and hence acausal) kth order all pass whose phase response is designed to be broadly proportional to 1/f in the audio band above the loudspeaker cut off frequency, and the second factor is an (n+m)th order causal all pass network whose response comprises an impulse of amplitude near unity plus relatively low level pre- and post-response tails, such that $P_k(z^{-1})$ factors $Q_{n+m}(z)z^{-m-n}$ exactly. In general, the first factor $(P_k(z)/(-z)P_k(z^{-1}))$ may be factored into k terms of the form $(g_j-z)/(1-g_j z_j)$ (J=1 to k) where $g_j$ is a complex valued factor, and the second factor may be factored into k terms of the form:

$$\frac{1 - \sum_{l=0}^{m_j} g_j^{n_j-l} a_{j,l} z_j^{n+1}}{1 - \sum_{l=0}^{m_j} g_j^{n-l} a_{j,l} z_j^{-n_j-1}}$$

for j=1 to k, where for each j, $$\sum_{l=0}^{m_j} a_{j,1} = 1$$

and where $n_1 + \ldots n_k = n$ $m_1 + \ldots m_k = m$ where n+m samples is the total latency or preresponse of the overall product Thus in general, a complex kth order acausal all pass response $P_k(z)/(-z)^k P_k(z^{-1})$ may have its preresponse truncated by multiplying by an all pass factor which is the product of k causal all pass factors each having the effect of truncating one of the k first order factors of (13) that kth order all pass response.

Such a modified all pass compensation, having a limited preresponse and latency, deviates from the ideal phase response proportional to 1/f to a limited degree, but still maintains the substantial benefits of a phase compensation proportional to 1/f.

By reducing preresponse, and hence latency, to a figure preferably below 50 ms, the effect of time delays causing loss of synchronisation between sound and an associated picture can be minimised without using a frame store or similar time delays for the picture. Also, in studio monitoring applications, the effect of any modification of a sound can be heard without an excessive time delay between adjusting a control and hearing its effect.

Filter Power Limiter

It is of considerable importance that it should be impossible for the filter 5 to boost bass frequencies to a level where they might overload and ultimately damage a loudspeaker. To ensure that this is impossible, a preferred embodiment of the invention includes a power limiter stage 63 following the filter 5. Where a separate low frequency equalizer filter 55 is provided, as shown in FIG. 20, the limiter 63 is provided following the filter 55.

Figure 21:
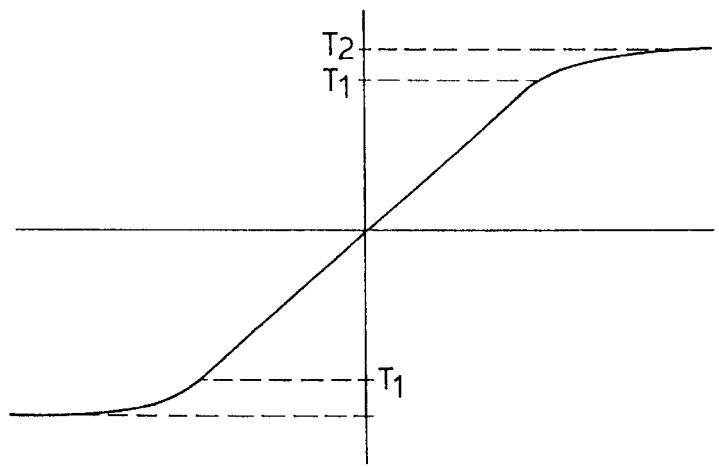
FIG. 21 illustrates schematically the gain of the further component of the filter of FIG. 20.

Referring to FIG. 21, the limiter 63 acts as a variable gain in the filtered signal path, the gain being unity for acceptable signal amplitudes. For signal amplitudes which are considered unacceptable, beyond a predetermined maximum threshold, the gain is such that the signal is attenuated. The limiter could merely comprise a clipping arrangement, but it is preferred to provide a transfer characteristic of the form shown to FIG. 21, with a gain of unity and a smooth transition above a first threshold T1 to a flat characteristic at a second threshold T2. This reduces the unacceptability of distortion introduced by the limiter 63.

Rather than using a limiter responsive to the instantaneous level of the signal, a variable gain control circuit responsive to the signal envelope level may be employed, giving lower distortion.

Test Signal

The operation of the test signal generator 8 in a preferred embodiment will now be discussed. In principle, the test signal generator 8 could generate any type of signal having a predetermined response or transfer function, and the response measured at the microphone 7 could be divided by the signal response to yield the response of the loudspeaker/room path. However, processing is naturally much simpler if the response of the test signal generated by the test signal generator 8 is unity, i.e. evenly distributed across the frequency spectrum.

Figure 22A:
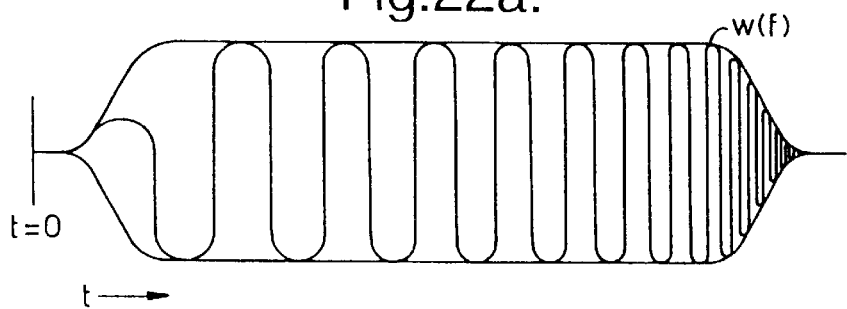
FIGS. 22a and 22b illustrate schematically the amplitude and frequency behaviour against time of a known test signal.
Figure 22B:
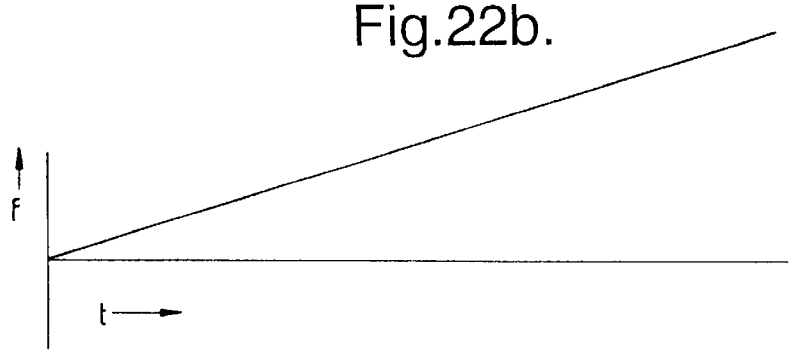

Considering the problem in the time domain, the simplest test signal is a single impulse; this enables the impulse response of the signal path to be measured directly. However, since the effect of the path is to distribute the energy of the impulse over a considerable time (up to several seconds), the amplitude of the test impulse needs to be extremely high which is undesirable with real amplifiers and loudspeakers. Alternative test signals which have greater energy but a similar frequency spectrum have been developed; various types of pseudo-random sequences are known on the other hand, and on the other hand it is known to use a so called "chirp" signal comprising a continuous signal with linearly rising frequency, of the general form cos/sin $(2\pi K t^2)$ as shown in FIGS. 22a and 22b. At an instant t the instantaneous frequency of this signal is 2K.

Because the reverberation period of the room can be long, it is necessary to wait for a settling period after the frequency sweep has finished to make sure that the room response has died down before commencing a second sweep. Typically, the waiting period can be as long as seven times the length of the frequency sweep period. This discrete frequency sweep signal is therefore not ideal since considerable time is wasted or, viewed in another way, the energy of the signal is again dissipated over a long period.

Figure 22C:
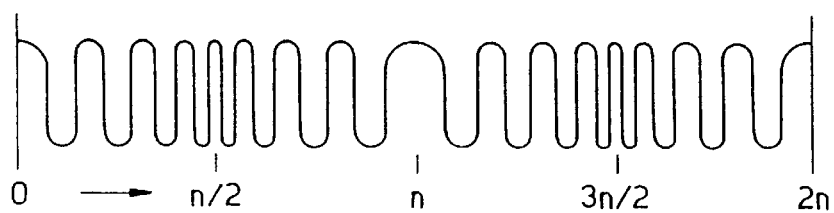
FIGS. 22c and 22d illustrate correspondingly the behaviour of a test signal according to a first embodiment of the invention.
Figure 22D:
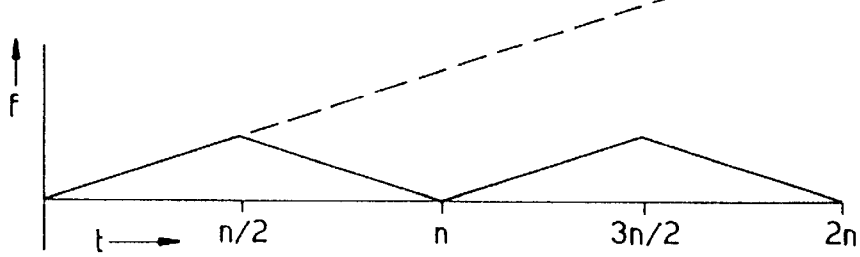

An alternative to a discrete frequency sweep would be to provide a signal which swept up in frequency and then down again continuously as shown in FIG. 22c. One simple method of doing so would be by using a continuously increasing frequency sweep of the form cos (or sin) $(\pi t^2/n)$, in a sampled system where time is sampled in steps of unity. Aliasing will occur commencing at t=n/2, after which the instantaneous frequency falls again to reach zero at t=n as shown in FIG. 22d.

A problem with each of these types of chirp test signal is that to derive the complex Fourier transform required for a complete amplitude and phase description of the system response, it would be necessary to generate a complex test signal $e^{\pi i t^2/n}$. Unfortunately, this is not physically possible; one must use either a sine or cosine signal and process the measured response appropriately.

Figure 22E:
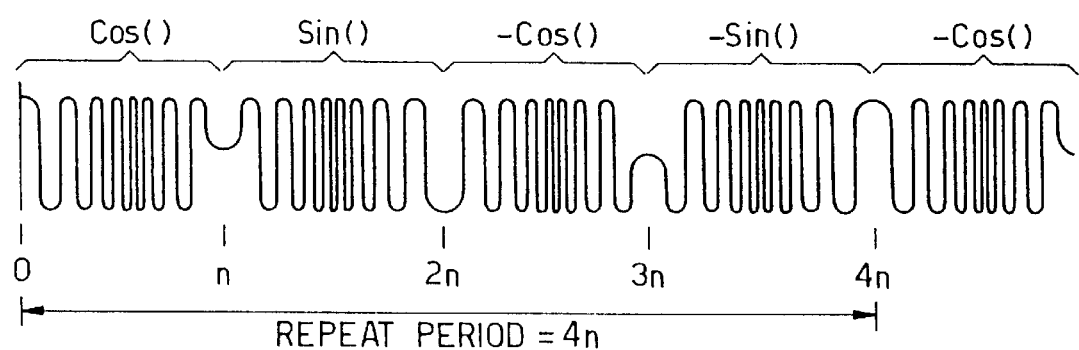
FIGS. 22e and 22f illustrate correspondingly the behaviour of a test signal according to a second embodiment of the invention.
Figure 22F:
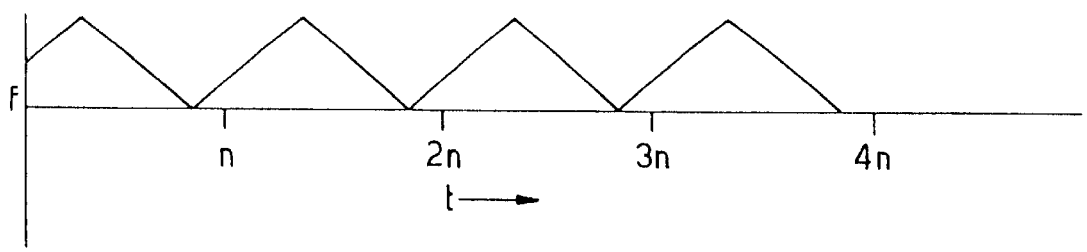

Preferably, therefore, the test signal generator according to the present invention in one aspect generates a test signal of the form cos (or sin) $(\pi t^2/n + \pi t/2n)$ as shown in FIGS. 22e and 22f. It is easily shown that at t=0, this signal has a frequency 1/4n and a phase of zero. At t=n, the frequency again is 1/4n but the phase is $\pi/2$. In general, the second n samples are a repeat of the first but with a phase shift of 90°, and the third n samples are a repeat of the first but with a phase shift of 180°. The fourth block has a phase shift of 270°, and the fifth block of n samples repeats the first.

The test signal therefore provides two quadrature (i.e. sine and cosine) components from which the complex Fourier spectrum can be reproduced, but does so without a discontinuity so that it is unnecessary to wait to allow reverberations to die away in between the two quadrature components.

Another advantage is that since the signal over the third block of n samples is the phase reversed version of the signal over the first block of n samples, subtracting the corresponding blocks of measured signal samples will double the value of measured signal components but any second order nonlinearities (produced, for example, by loudspeaker overloading at low frequencies due to the voice coil travelling outside the magnetic gap or rectification effects) will be cancelled out. It is also demonstrable that by similar processing the effects of third and fourth order harmonic distortion can be reduced.

In general, the effects of high order harmonic distortion can be reduced by using a test signal of the form:

$$\cos(\pi t^2/n + 2\pi t/qn + \phi),$$

where $\phi$ is any constant phase offset, and q is the order of the harmonic to be cancelled and applying appropriate processing to the received signal. Still more generally, the term 1/q may be replaced by p/q, where p and q are relatively prime integers.

An alternative signal having a similar effect has the form $\cos(\pi t^2 \ast m/n)$, where m is an integer relatively prime to n. Suppose, for example, n=1024 and m=5, the rate of increase of frequency will be five times as fast as that of the signal of FIGS. 22a and 22b. At t=0, the signal frequency is zero, but because m is not divisible into n, the next point at which the signal passes through zero would occur after a non integer number of samples (204.8). Even interpolating between sample point 204 and 205, the phase has not returned to zero. In fact, although the frequency appears to repeat after 204.8 samples, the phase does not repeat until 1024 samples. Because the low frequency energy of the signal is distributed over time compared to that of FIG. 22a, there is less low frequency non linear distortion.

Particularly useful values of m/n are those which are furthest from being simple ratios (in other words are highly incommensurable); the so called "golden ratio" is one example of such a ratio, and others are obtained from successive terms of a Fibonacci series. Such ratios give rise to a test signal which approaches the properties of a pseudo random signal, which minimises the non linear distortion problem referred to above.

Figure 23:
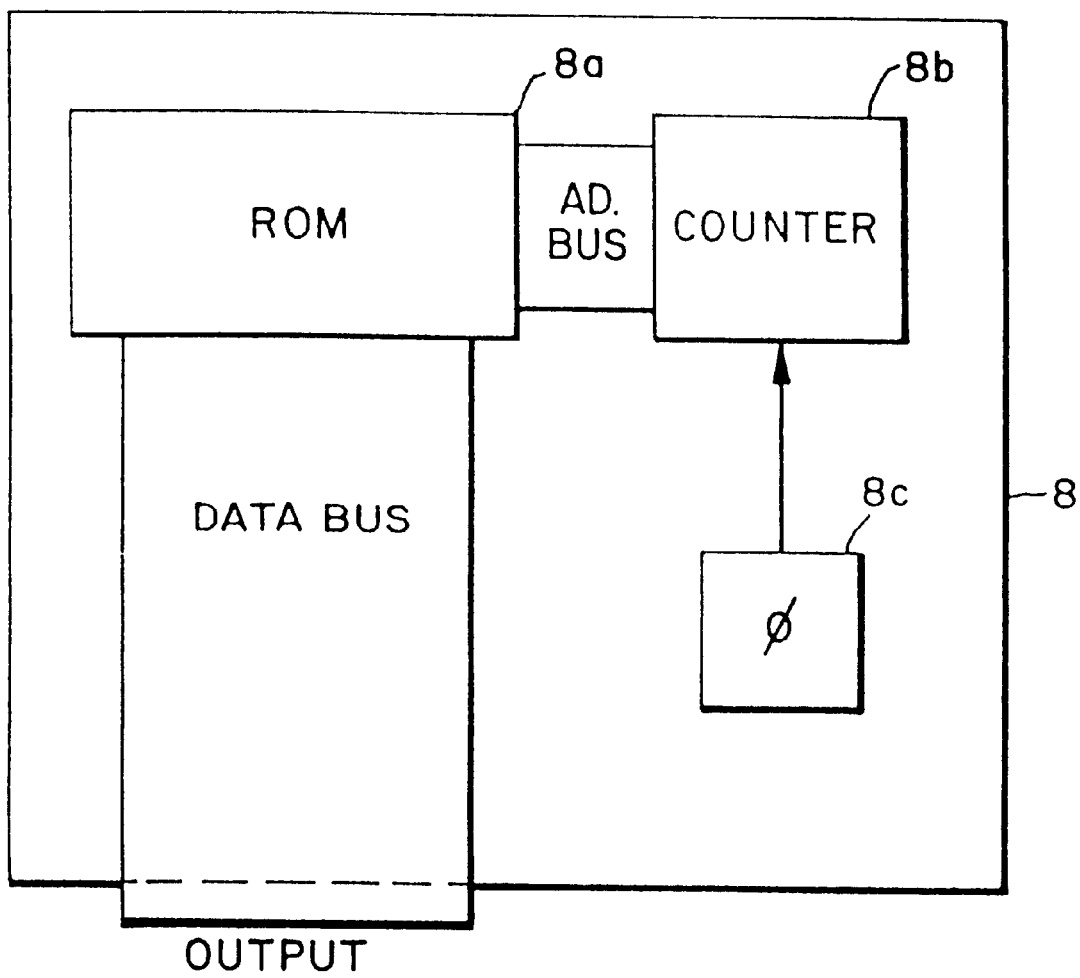
FIG. 23 illustrates schematically the structure of a test signal generator for generating the signals of FIG. 22.

Referring to FIG. 23, one way of providing a test signal generator 8 is to provide, in successive addresses of a read only memory (ROM) 8a, the successive signal values stored in digital form to be output as successive time samples. The data bus of the ROM 8a is connected to the digital output bus of the signal generator 8, and the address bus of the ROM 8a is accessed by the output of an up-counter circuit 8b clocked by the system clock 8c so as to access successively higher addresses within the ROM 8a. It is unnecessary in practice to provide the counter circuit 8b and clock 8c as separate circuit components; they preferably form a part of any suitable digital processor such as that which performs the digital filtering, operating under a suitable stored program. Similarly the ROM 8a may form a partitioned area of a general purpose storage device within the apparatus.

The above types of test signal are examples of a more general type of test signal according to an aspect of the invention. In the above test signals, a signal is generated which has a periodically varying frequency and a periodically phase, and the phase repetition period exceeds the frequency repetition period so that the coefficient calculator 6 can refer to several measured signal portions which contain corresponding frequency information, but are shifted one relative to the other by predetermined phase increments. It will be clear that there is in fact no need for the signal to have a periodically varying frequency, provided the signal is broad band (i.e. includes frequency components across the range of interest) and is periodically repeated; the above chirp signals are special cases of this general class of signals.

Figure 38:
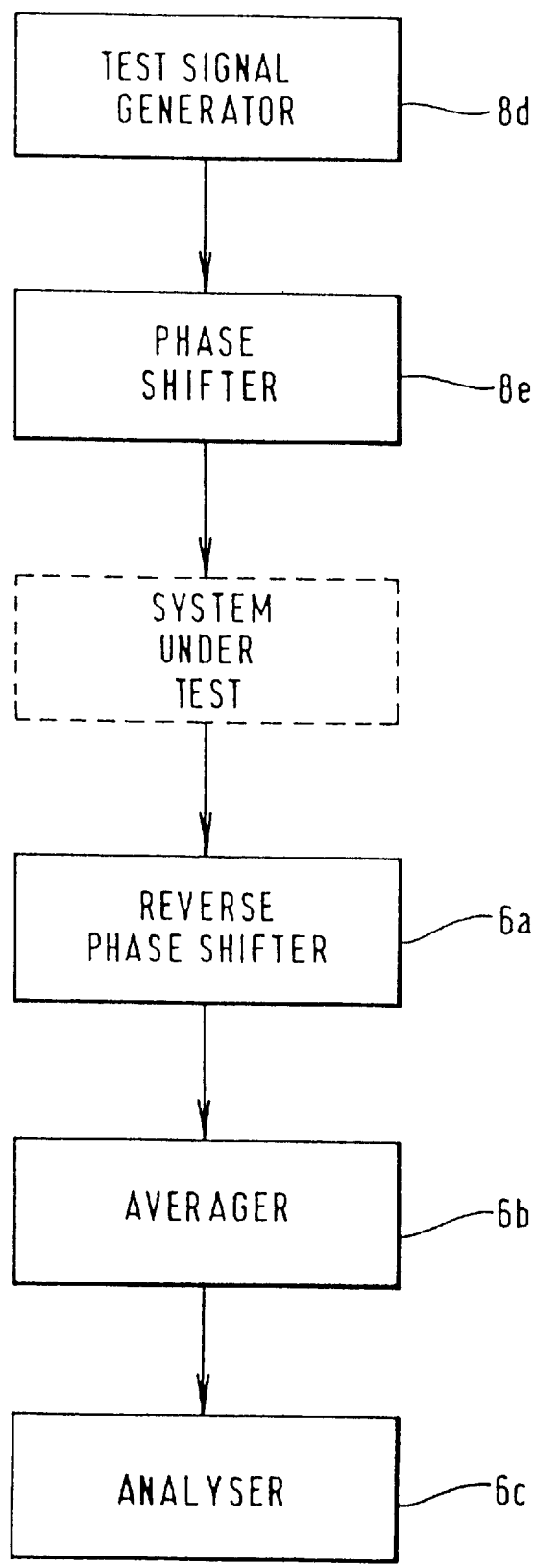
FIG. 38 is a block diagram showing schematically the structure of a testing system according to a further aspect of the invention.
Figure 39:
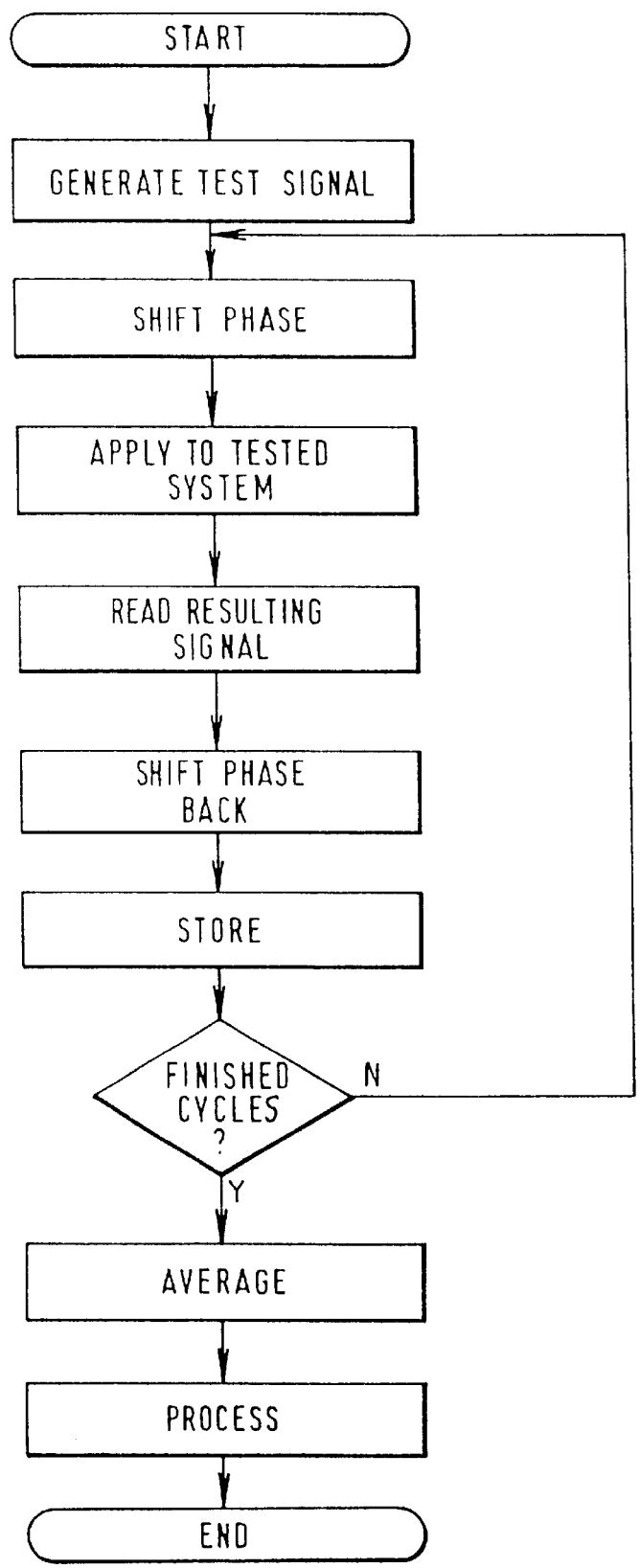
FIG. 39 is a flow diagram showing the operation of the system of FIG. 38.

Accordingly, in this aspect, referring to FIGS. 38 and 39 the generator 8 comprises means 8d for generating a reference test signal which is broad band and means 8e for producing a time dependant phase shift of the test signal 8d. The means 8d, 8e, could, of course, be realised by a single look up table embodying successive values of the phase shifted reference signal, as is provided in FIG. 23.

The reference test signal generated by the signal generator 8d could, as above noted, be a chirp signal (i.e. a signal with a periodically varying frequency), or it could be a Gaussian random signal or some other white noise signal, or it could be a single impulse; moreover, although these examples all have relatively constant amplitude frequency components, it could be any other signal provided that it includes frequency components of known amplitudes across the frequency band which the calculator 6 is to operate. The reference signal generator 8d may produce a digital or analog output.

Figure 40:
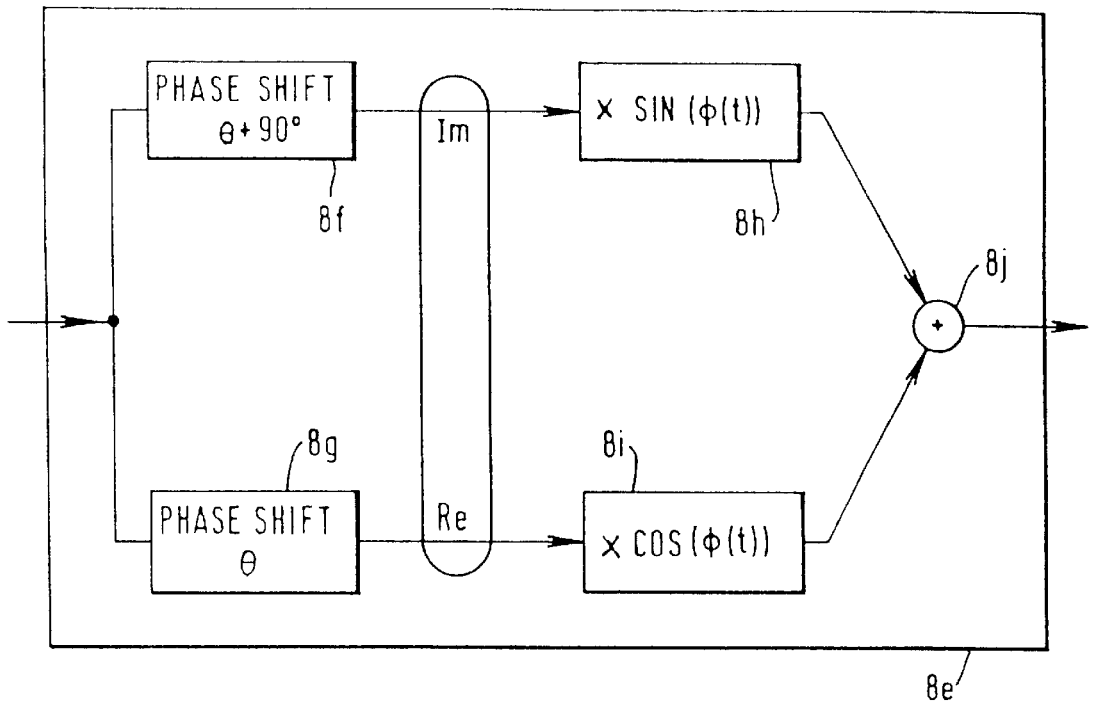
FIG. 40 is a block diagram showing a portion of the test signal generator of FIG. 38, in greater detail.

Referring to FIG. 40, the phase shifter 8e may comprise means 8f, 8g for generating a pair of signals having a phase angle of 90 degrees between them, and means (8h,8i,8j) for performing a time varying rotation transformation on the signals, by multiplying one by a time varying sine term and the other by a corresponding time varying cosine term, and summing the two at an adder 8j. It will usually be convenient that the constant phase term "θ" may be 0, so that one of the signals produced by the means 8f, 8g corresponds to the original signal from the signal generator 8d.

If the signal from the signal generator 8d comprises an analog signal, the means 8f, 8g may comprise a pair of analog phase shift networks having outputs mutually in quadrature; such networks generally have a frequency dependency, which is dealt with (reversed) by the reverse phase shifter 6a.

If the output of the signal generator 8d comprises a series of digital samples, and the signal generator 8 includes a store dimensioned to hold samples for one period of the reference signal, the phase shift means 8f may comprise digital means for performing a Hilbert tranform to generate the phase shifted signal therefrom.

Figure 41:
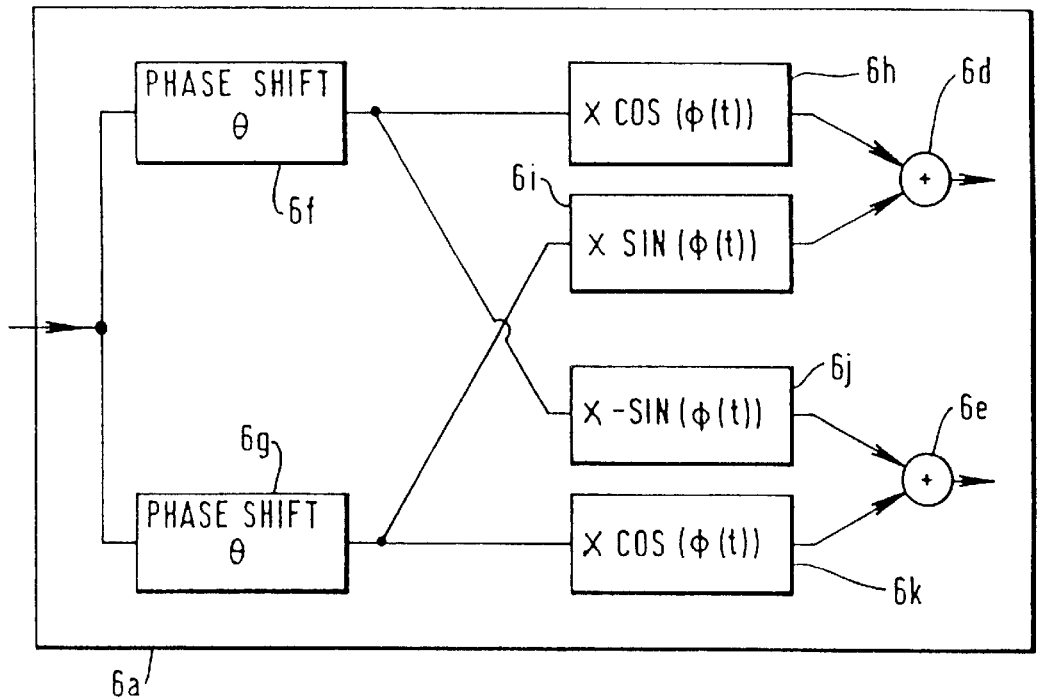
FIG. 41 is a block diagram showing a portion of the test signal analyser of FIG. 38 in greater detail.

Referring to FIG. 41, the reverse phase shifter 6a may comprise means 6d, 6e for generating a pair of output signals in quadrature; as with the phase shifter 8e, one of the output signals may correspond to the signal received from the system under test, or alternatively there may be a constant phase shift θ common to both outputs (which need not be the same as the constant phase shift, if any, introduced by the means 8g, 8f in the phaser shifter 8e).

The reverse phase shifter 6a conveniently comprises means 6f, 6g for producing a pair of quadrature phase shifted output signals, corresponding to the equivalent means 8f, 8g employed in the signal generator 8, and cosine and sine generators 6h–6k by which the outputs of the phase shift means 6f,6g are multiplied to generate, as outputs 6d, 6e, a pair of orthogonally reverse phase shifted signals, with phase shifts $(-\phi(t))$, $(90-\phi(t))$.

The sine and cosine function generators 8h, 8i, 6h–6k may all conveniently be provided as look up tables, addressed by a clock signal as shown in FIG. 23, so as to produce time varying digital output signals which are then multiplied by the signals from the phase shift means 6f, 6g or 8f, 8g.

The averager 6b comprises means for storing signal samples from the reverse phase shifter 6a which correspond to a complete repetition period of the reference signal generated by the signal generator 8d. Referring to FIGS. 38 and 39 after a complete cycle or period of the reference signal has been applied to the system under test, at least one further such period is then generated; although the reference signal produced by the signal generator 8d is the same, it will have a different phase shift due to the phase shifter 8e. The samples corresponding to the second period, and as many further periods are required, are then likewise stored by the averager 6b.

Once the required number of periods of the reference signal are completed, the corresponding samples in each stored portion are averaged to form an average stored portion. For instance, the first sample stored from the first stored period of the reference signal may be added to the first sample stored for the second stored period of the reference signal and to the first sample stored for each further stored period, so as to derive an arithmetic mean value over different phase shifts for the first sample, and likewise to derive averaged sample values for the rest of the reference signal cycle from the time aligned samples of the first, second and further stored portions.

In fact, it may be convenient to form a running average or a sum, by adding each reverse phase shifted sample to a corresponding stored value from previous reference signal periods, so that the averager 6b needs only contain storage means dimensioned to hold samples for a singal reference signal cycle. Equally, however, other types of average than the arithmatic mean could be employed.

In a particularly preferred embodiment, the function $\phi(t)$ is selected such that the phase shift repeats after an integer number of cycles of the reference signal generated by the reference signal generator 8d; where the phase returns to its initial value after a number q of cycles, so that $\phi=A+2\pi pt/nq$, the test signal generator 6 is arranged to generate q cycles (or an integer multiple thereof) and the averager 6b is arranged to generate sequence of averaged sample values from a corresponding number of cycles.

It can therefore be seen that each averaged sample produced by the averager 6b corresponds to the corresponding point in the reference signal, passed through the system under test, averaged over phase shifts of $\phi$, $\phi+2\pi/q$, $\phi+4\pi/q$ ... $\phi+2\pi r/q$.

This can be shown to cancel second and higher order harmonics, in exactly the same way as the above described frequency swept chirp signal (which is a particular case of this aspect of the invention).

Figure 42A:
FIGS. 42a–42f are diagrams showing illustratively the spectra, in the Fourier domain, of signals at various stages of the system of FIGS. 38, 40 and 41.
Figure 42B:
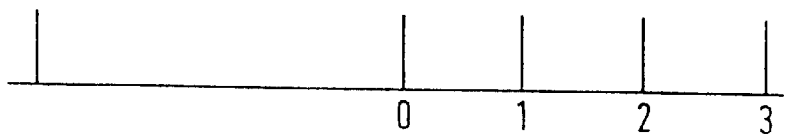

An explanation of how this beneficial distortion cancellation takes place is most easily described in the frequency or Fourier domain. For convenience, if n=1 second and q=10, the reference signal output by the signal generator 8d comprises, as shown in FIG. 42a, harmonics at 1 Hz, 2 Hz . . . . FIG. 42b shows that, if the orthogonally phase shifted outputs of the phase shift means 8f, 8g are considered as real and imaginary parts of a complex signal ("analytical signal"), the negative frequency components of the line spectrum are thus removed.

Figure 42C:
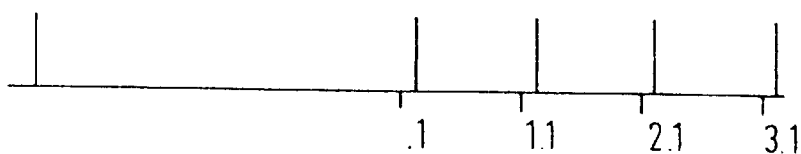
Figure 42D:
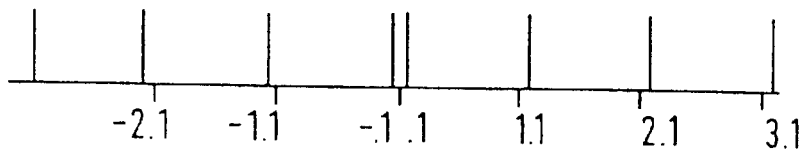

Since the phase shift produced by the phase shifter 8e repeats every 10 cycles (i.e. every 10 seconds) and the phase shift produced by the multiplications with the sine and cosine values produced by since and cosine multipliers 8h, 8i give a progressive phase advance, the time varying phase shifts correspond to a frequency offset of 0.1 Hz. Therefore, as shown in FIG. 42c, the complex output phase of the sine and cosine multipliers would be a phase shifted signal having only positive frequency components. However, since the sine and cosine components are added together at the adder 8j to produce a real result, the signal actually applied to the system under test is, as shown in FIG. 42d, a signal having positive and negative frequency components lines at frequencies of +/- (n+0.1 Hz).

Figure 42E:
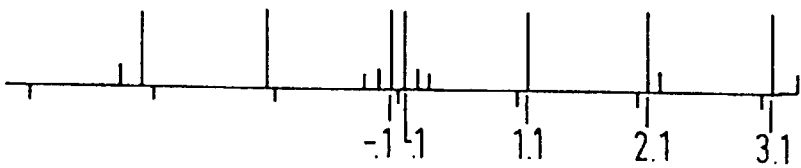

If the system under test introduces harmonic distortion into the test signal, the result is shown in FIG. 42e, the line at 0.1 Hz has harmonics at 0.2 Hz and 0.3 Hz, etc; the line at 1.1 Hz gives rise to harmonics at 2.2 Hz, 3.3 Hz, 4.4 Hz etc; the line at 2.1 gives rise to harmonics 4.2, 6.3 Hz etc, and so on. Thus, it will be seen that the effect of applying the phase shift to the reference signal is to generate a signal in which the line spectrum components are no longer harmonically related, so that the harmonics introduced by distortion can be separated in the frequency domain from the line spectrum of the test signal.

Figure 42F:
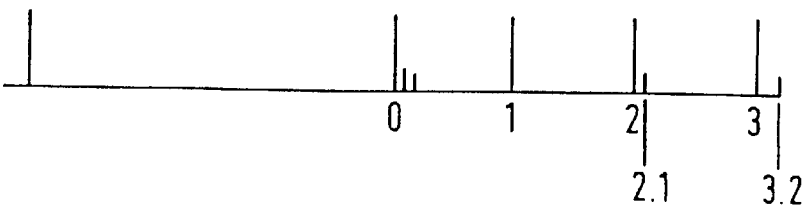

Referring to FIG. 42f, if the two quadrature outputs 6d, 6e are taken as the real and imaginary components of a complex measured signal, the effect is once more to suppress negative frequency components. The effect of the reverse phase shift here is to shift down the frequencies of all components by 0.1 Hz, so that the spectral lines of the reference signal have returned to 0, 1, 2, . . . Hz and the distortion harmonics are now at 0.1, 0.2 . . . , 2.1, 3.2 . . . Hz etc. Finally, the averaging process performed by the averager 6c eliminates all components (e.g. the distortion introduced harmonics) except those at an integer multiple of 1 Hz. The averaged signal samples can then be used to find the impulse response of the system under test, in the same manner as described above, except that account must be taken of the fact that the averaged signal frequency content has been shifted down 0.1 Hz relative to the signal supplied to the system under test.

For example, if the analyser 6c performs a Fourier transform on the stored averaged signal samples, the signal values at 0, 1, 2, 3 . . . Hz are generated by interpolation from the peaks derived from the transform, which actually relate to test signal frequencies of 0.1, 1.1, 2.1 . . . Hz.

The transform coefficients thus derived are then divided by the (known) coefficients corresponding to the Fourier transform of the reference signal, so as to deconvolve the impulse response of the reference signal and leave that of the system under test.

Various further modifications to the above described technique can be made. For example, although it is preferred that the phase variation $\phi(t)$ is linear (or at least monotonic) with time, other functions could be employed although less smooth functions (for example including steps) inevitably lead to some extent to generation of false frequencies.

Further, the phase repetition period need not be an exact multiple of the period of the reference signal; if it is not, then the averagor 6b is arranged to perform "ergodic" averaging over a sufficiently large number of reference signal repetition cycles. The averaging means 6c, in this embodiment, is arranged to apply a windowing function to the samples prior to averaging, so as to weight each sample by a windowing constant; the shape of the windowing function is preferably selected such that the sum of the windowing constants applied to the samples which are averaged together to produce a single averaged sample is unity. Considering the received signal samples over the whole plurality of reference signal cycles, the shape of the windowing function is preferably a smooth curve tapering to 0 at either end and rising to a maximum towards the middle; one example of a windowing function which satisfies this is a B-spline of higher order (for example a cubic spline), having curve control points ("knots") equally spaced at a distance n samples (where n is the number of reference signal repetition periods) from each other, convolved with a rectangle function.

Rather than performing the above described averaging, it would in principle be possible to separate the distortion harmonics from the test signal harmonics by employing a comb filter or the like.

Multiple Speaker Systems

In the preceding description, the problem of equalising one loudspeaker in an acoustic environment has been described. However, at present many audio reproduction systems provide two speakers $1a$, $1b$, whether or not the source material is also provided in stereo, and it has been proposed to use a larger number of speakers (for example, quadrophonic systems employing four speakers) to enhance the sound image.

If a separate equaliser filter is derived for each loudspeaker/acoustic environment path, then it is likely that the overall delay in the filters will differ such that the sound from different speakers will arrive at the compensated zone at different times, creating an undesirable echo and disrupting the stereo effect. Some form of equalisation for each loudspeaker which takes account of the equalisation for other loudspeakers is therefore desirable.

Delay Equalisation

Figure 24:
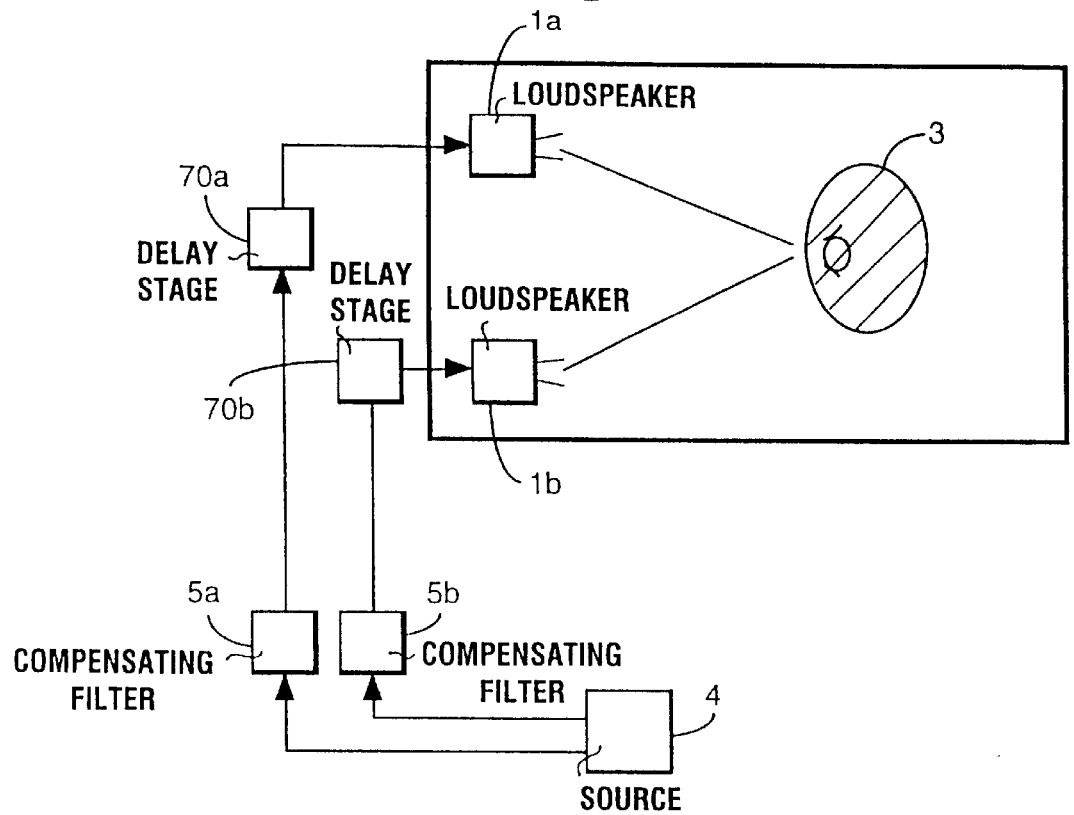
FIG. 24 illustrates schematically the elements of a stereo embodiment of the invention corresponding to FIG. 2.
Figure 25A:
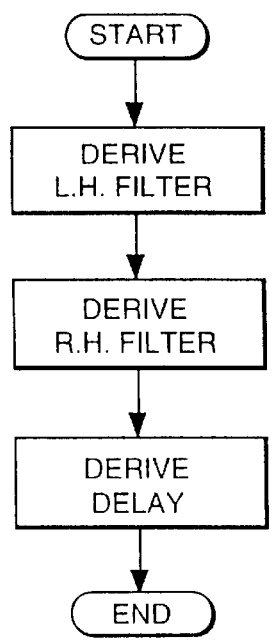
FIG. 25a and 25b shows schematically alternative method of deriving parameters for equalizing the stereo channels of the system of FIG. 24.
Figure 25B:
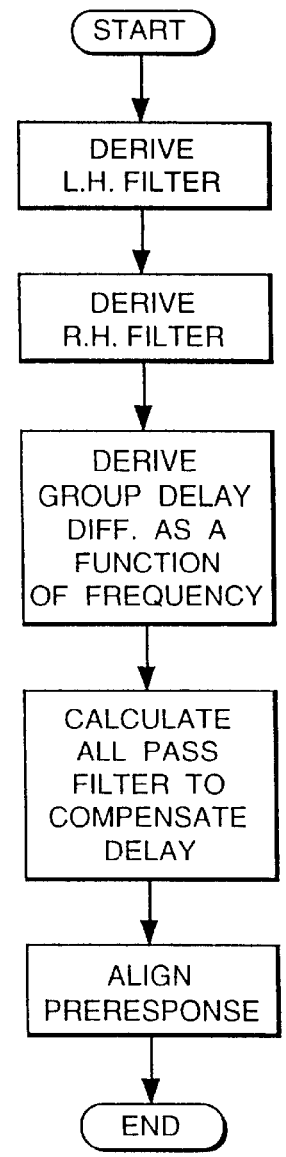

In one embodiment shown in FIGS. 24 and 25$a$, this is provided by deriving, as above, a separate compensating filter $5a$, $5b$ for each loudspeaker/environment path, and introducing into the signal path pure delay stages $70a$, $70b$ calculated so as to align the time of arrival of the initial transients of sound from each loudspeaker within the compensated zone.

Calculating such a delay may be done, for example, by providing a test signal from each loudspeaker $1a$, $1b$ separately and timing the delay over each path to the microphone $7$; calculating the difference in times between the longest and the or each shorter time; and providing in the compensating filter for the or each loudspeaker $1a$, $1b$ which gave a shorter arrival time a delay stage $70a$, $70b$ corresponding to its time difference.

Since the compensation of the acoustic environment $2$ is not linear phase, the group delay will differ with the acoustic signal frequency. Although a single delay stage is reasonably effective in restoring the stereo effect, the problem is not entirely eliminated because, since the compensation of the acoustic environment $2$ is not linear phase, the group delay varies with signal frequency.

For stereo systems, it is strongly preferred that the acoustic environment compensation stage should have a limited pre-response, since this should make the phase response of the entire signal path somewhat more linear with frequency and, since the signal paths from the two loudspeakers deviate less from an ideal response, they will be more similar to each other than if minimum phase compensation for the acoustic environment were used.

In an alternative, and preferably additional, step, the delays $70a$, $70b$ are arranged to have a frequency dependency so as to give substantially equal arrival times to signals from the two loudspeakers $1a$, $1b$ irrespective of signal frequency. This does not imply that the signal path from each loudspeaker to the listener position $3$ is itself linear phase; merely that the degree of deviation from linear phase is essentially the same for each path.

The group delay as a function of frequency may simply be determined by passing a plurality of test signals of different frequencies through the combination of the filter $5$, loudspeaker $1$ and acoustic environment $2$ to the microphone $7$, and measuring the time of flight of each signal at each frequency for each loudspeaker. Alternatively, a frequency swept test signal of the kind discussed above may be employed. The group delay is preferably derived over relatively broad frequency intervals; for example, one group delay value for each ⅓ of an octave.

Having derived the group delay at a number of frequencies for each loudspeaker, the corresponding delays for the loudspeakers are subtracted for each frequency to give the inter-channel delay as a function of frequency. The filter calculator $6$ then calculates the parameters of an all pass filter having a group delay against frequency response such as to substantially equalize the inter-channel delay, and the delay $70a$ or $70b$ is replaced by an all pass filter exhibiting this behaviour.

Matrix Compensating Filters

Referring to FIG. 24, with polyphonic (e.g. stereo) source material, the desired effect is that, for a human head at a listening point $3$ in an acoustic environment, each ear should receive a predetermined amount of signal from each loudspeaker $1a$, $1b$, the predetermined portion for the left ear of the left hand loudspeaker should be greater than that for the right ear, and vice versa.

Figure 26:
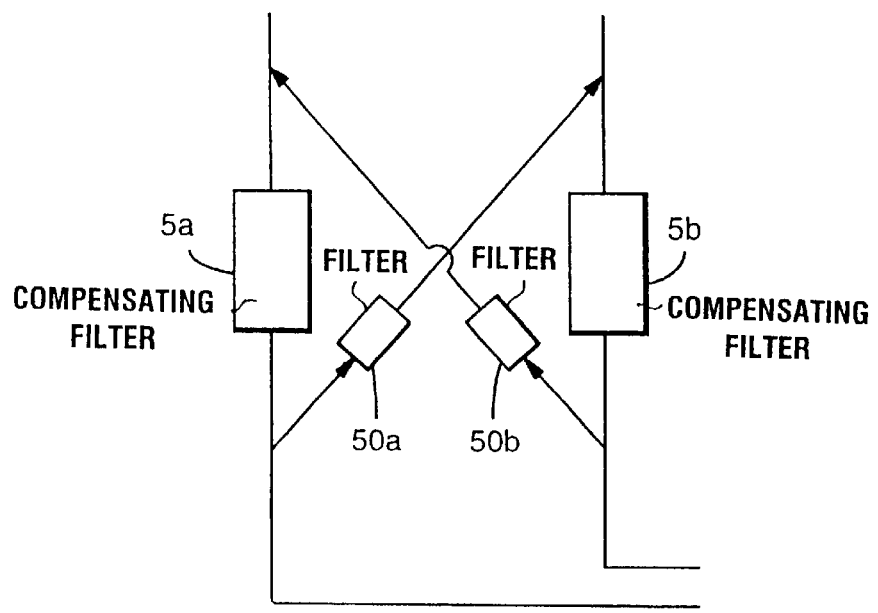
FIG. 26 shows schematically a variant of part of the system of FIG. 24.

The presence of the acoustic environment $2$ can however upset the proportions of the signals from the respective loudspeakers which reach each ear and thus the stereo sound image perceived by the listener. This can be compensated by providing, in addition to compensating filters in each of the loudspeaker paths, filters $50a$, $50b$ linking the two loudspeaker paths so as to provide to each loudspeaker $1a$, $1b$ a filtered proportion of the signal from the other loudspeaker path as shown in FIG. 26.

It may be convenient to position the filters $50a$, $50b$ to filter the outputs of the filters $5a$, $5b$ so that it is unnecessary to include in the filters $50a$, $50b$ any substantial element of loudspeaker correction (assuming the loudspeakers $1a$ and $1b$ to be matched, as is usual. The combined filtering system $5a$, $5b$, $50a$, $50b$, may however be viewed as a matrix filter having two inputs and two outputs.

Reverberation Reduction

A known technique of noise cancellation employs a loudspeaker and a microphone positioned in close proximity. The microphone receives sound representing the sound incident upon the loudspeaker, and a processing or filtering circuit produces a signal supplied to the loudspeaker which is in antiphase to the signal incident upon the microphone, so that the loudspeaker signal cancels the incident signal. This cancellation is effective over an area or volume around the loudspeaker. This effect could be used to reduce reverberations in acoustic environment, where the loudspeaker is positioned at a reflecting surface so that an incident wave is cancelled rather than being reflected.

Figure 27A:
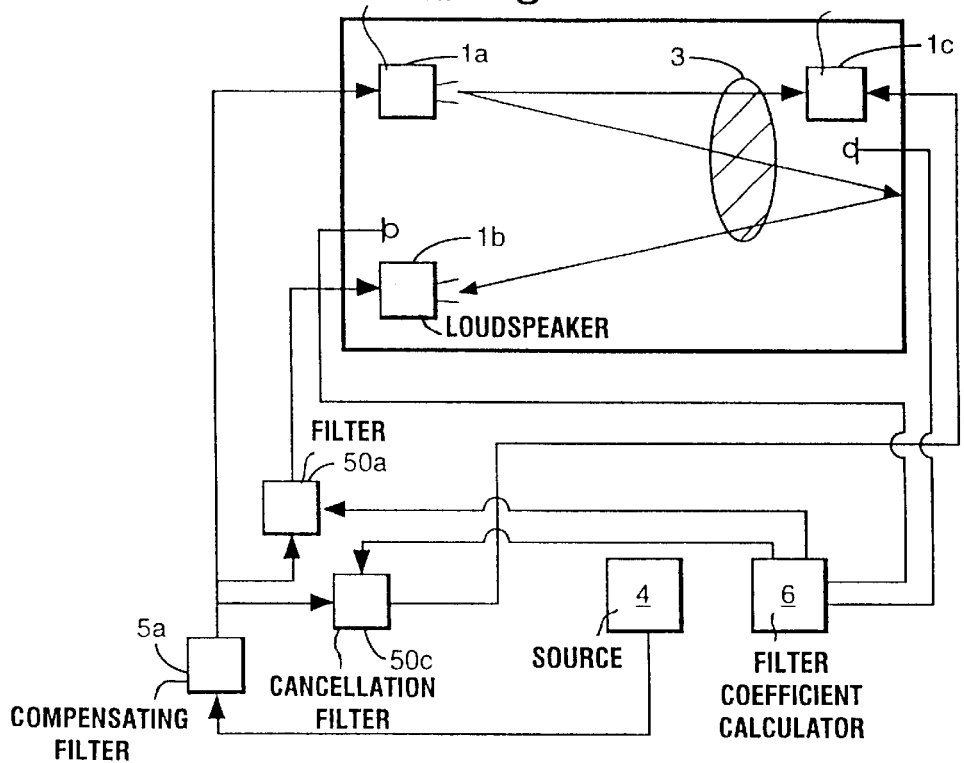
FIGS. 27a and 27b show schematically apparatus according to a further aspect of the invention.
Figure 27B:
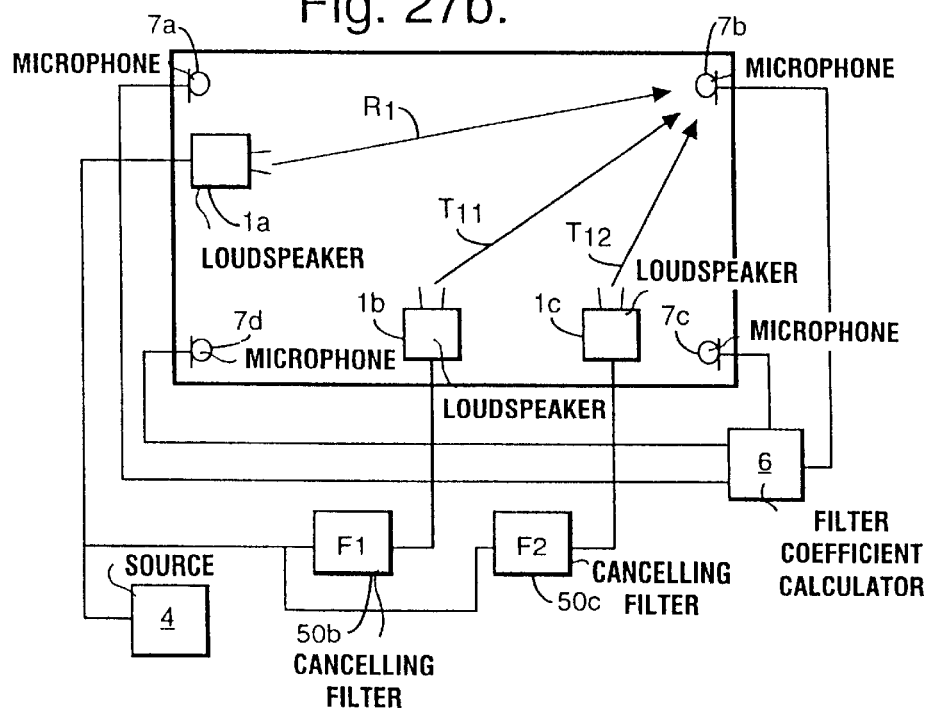

We have realised, that in such an application, a separate microphone is unnecessary in use since the signal incident upon the loudspeaker is in essence the source signal filtered by the response of the acoustic environment. Referring to FIG. 27$a$, a cancellation loudspeaker $1c$ can therefore be provided within a room connected via a cancellation filter $50c$ to the audio source $4$. With a single cancellation loudspeaker, the signal to be produced by the loudspeaker $1c$ should correspond essentially to the signal received at $1c$ as processed by the filter path via the compensation filter $5a$, loudspeaker $1a$ and acoustic environment $2$.

As discussed above, the response of the loudspeaker $1a$ is substantially compensated by the filter $5a$; the principal component of the filter $50c$ is therefore due to the differences in response of the path through the environment $2$ to the zone $3$ for which the filter $5a$ is optimised and to the loudspeaker $1c$. One significant component of this is a time of flight delay, since the speaker $1c$ operates to cancel sound reaching a reflecting surface beyond the listening position $3$.

In general, some or all loudspeakers $1a$, $1b$, $1c$ may act both as sound reproducing loudspeakers and as cancellation loudspeakers. These two functions are however conceptually distinct as will be explained below.

As stated above, we have found that long lasting reverberations, even if of relatively low amplitude, are noticable by the listener. When more then one cancellation loudspeaker is employed, there is no reason why the or each microphone used to derive the parameters of the cancellation filters should be positioned near the cancellation loudspeakers. What is desired is to derive cancellation filters such that the reverberations in the room perceived by a listener within the compensation zone 3 are reduced. It might therefore be thought that the best position for the microphones is in or around the compensation zone 3. However, we have found that whilst this will tend to reduce the amplitude of early parts of the reverberation envelope, it has significantly less effect in reducing the long tail of the envelope which is perceptually more noticable. We have found, surprisingly, that it is preferable to position the microphones in corners of the room and derive the parameters of the cancellation filters to minimize the signals received by the mirophones at those positions.

Both reproducing loudspeakers 1a and cancellation loudspeakers 1b and 1c may be provided within a room, although in general each loudspeaker may reproduce and cancel sound. The audio source 4 is connected directly to the reproducing speaker 1a and is connected to the cancelling speakers 1b and 1c via respective cancelling filters 50b and 50c. In deriving the cancellation filters, four microphones 7a–7d are provided near the corners of the room, although diametrically opposite corners of a cuboid room contribute essentially identical information, so no more than four microphones in corners are necessary. If further microphones are available, they may be positioned within the interior of the room. One suitable location for the microphones 7a–7d in practice is physically within the housing of the loudspeakers 1a–1c; with some moving coil loudspeakers, the loudspeaker itself can be employed as a microphone.

The first step is to measure the impulse response from each of the loudspeakers 1a, 1b, 1c to each of the microphones 7a–7d. This is achieved by generating a test signal through each of the loudspeakers 1a–1c in turn, and digitising and storing the signal received from each of the microphones 7a–7d over a relatively long period of up to a second or more. Designating the impulse response of the path from the reproduction microphone 1a as $R_1$ and that from the cancellation loudspeakers 1b and 1c $T_{11}$ and $T_{12}$, the response at the microphone 7a to an impulse test signal is $R_1+T_{11}*F_1+T_{12}*F_2$, where $F_1$ and $F_2$ are the filter impulse responses (for an FIR filter, the coefficient sets) of the cancellation filters 50b, 50c. Equivalent equations can be constructed for the signals received by each of the other microphones. The impulse responses R and T have already been measured. By using the actual impulse responses devised from the microphones 7a–7d, the coefficient calculator 6 derives values of impulse responses F1, F2 of filters 50b, 50c which result in the lowest squared amplitude of the signals which would arise at the microphone positions and hence the lowest amount of audio energy in the room.

Since it is desired to reduce the later parts of the envelope so as to reduce the decaying tail of the reverberation, the filter coefficients may be calculated in such a way that minimizing the amplitude of these later portions of the reverberation is given greater weight than minimising the earlier portions.

A test signal is supplied to the room by test signal generator 8 via the or each reproducing loudspeaker 1a. The response measured at the speakers 7a–7d is digitised and stored by the coefficient calculator 6, to give a sequence of samples lasting up to one second or more from each microphone. If the test signal was not an impulse response, the transfer function of the test signal is deconvolved with the measured signal values to yield for each microphone a corresponding series of impulse response samples. For simplicity, in the following, a sampling rate of 1 kHz is assumed.

Figure 28:
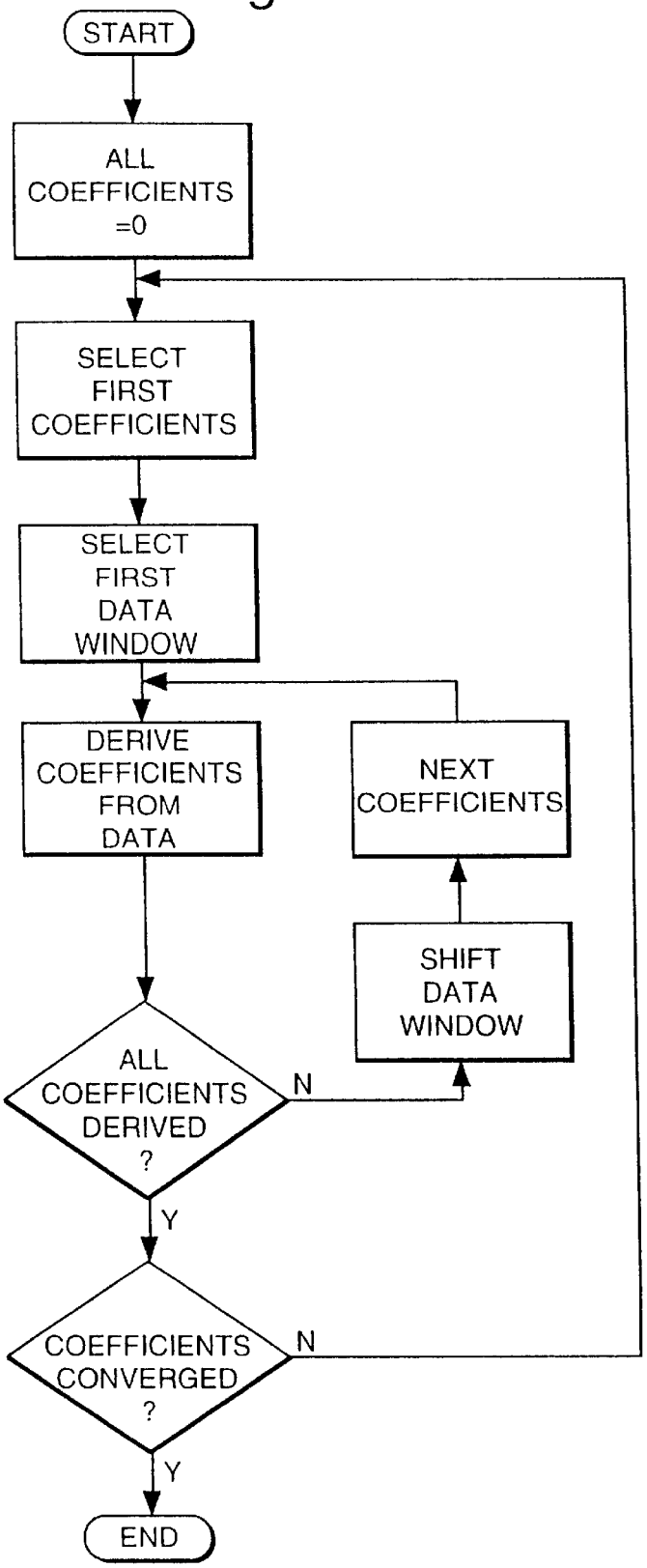
FIG. 28 shows schematically a method of deriving characteristics of a filter of FIG. 27b.

Referring to FIG. 28, a firs set of, say, sixty impulse response samples are read from the buffer memory containing the measured responses for each microphone. The total number of such data is then 4×60=240. Preferably the first samples of the measured impulse responses are not taken into account at all in deriving the filter coefficients, so as to avoid distorting the early part of the room response. For example, the first set may be the sixty samples from 40 msecs to 100 msecs after the initiation of the test signal.

Using the known stored values of R and T, the coefficient calculator 6 then calculates a first set of transversal filter coefficients (for example, the first 30) for each of the filters 50b, 50c so as to minimise the least mean squared amplitude value (i.e. the power or energy) of the signal which would be measured by the microphone 7a–7d with the subsequent coefficients set to zero; this is straight forward since 240 data are available for solving 60 unknowns, and any standard method for solving a linear least squares problem of this kind may be employed (for example, normal equations, Gram-Schmit Orthogonalization, Householder Transformation, Givens Rotation etc.).

The result is that a first set of coefficients for each of the cancellation filters which reduce the energy within the impulse response of the acoustic environment 2 (as measured at the four microphone positions 7a–7d) at a later time have been derived.

The next step is to calculate the next filter coefficients (i.e. those occuring later in the impulse response at the cancellation filters) from a later portion of the measured impulse responses from the microphone 7a–7d. Preferably, this is achieved by selecting the next set of sixty measured impulse response samples for each microphone 7a–7d so as to overlap the first set; for example, the second set may be samples between t=50 msecs and 110 msecs.

The first ten coefficients derived for each filter are correspondingly fixed, and the next set of two hundred and forty measured signal data are used to derive a further set of thirty coefficients (the eleventh to fortieth coefficients) for each of the filters 50b, 50c. Once all the coefficients (for example, sixty coefficients) of each filter have been derived, the process may if desired be repeated, using the just derived coefficient values rather than zero as the starting values for coefficients. Once the coefficient values have converged (that is, the difference between values calculated between a calculation cycle and the preceding cycle is less than a predetermined level) the coefficient values are supplied to the cancellation filters 50b, 50c for subsequent reproduction.

As stated above, each of the cancellation filters 50b, 50c is derived to includes a substantial delay such that the cancellation filter exhibits no substantial response before sound from the reproducing loudspeaker 1a has reached the cancellation loudspeaker. It is therefore possible to combine cancellation filters 50b, 50c with compensation filters 5 of the type discussed above, most of the response of which occurs prior to that of the cancellation filters. To avoid conflicts between the two separate filtering processes, however, it may be desirable to restrict the acoustic environment equalisation portion of the filter 5 to relatively high frequencies and the response of the cancellation filters 50 to relatively low frequencies.

Crossover Equalisation

As stated above, the crossover network of the loudspeaker 1 is generally an analogue filter circuit. In achieving desired amplitude characteristics, the effect of the crossover network is to introduce substantial phase distortions. We have found surprising increase in psycho-acoustic acceptability of a signal when a digital filter calculated to linearise the phase distortions due to the crossover network is employed. Since such a filter needs to be acausal, it is best realised as a transversal filter, for example a digital FIR filter.

Figure 29:
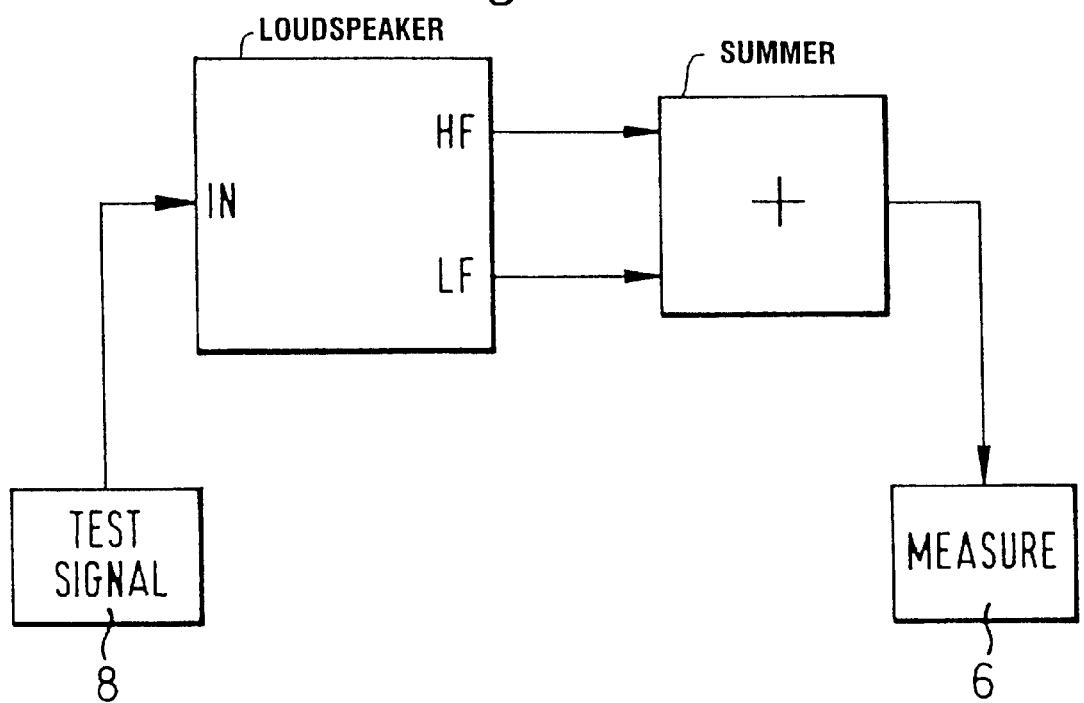
FIG. 29 shows schematically an arrangement for measuring the response of a crossover network.
Figure 30:
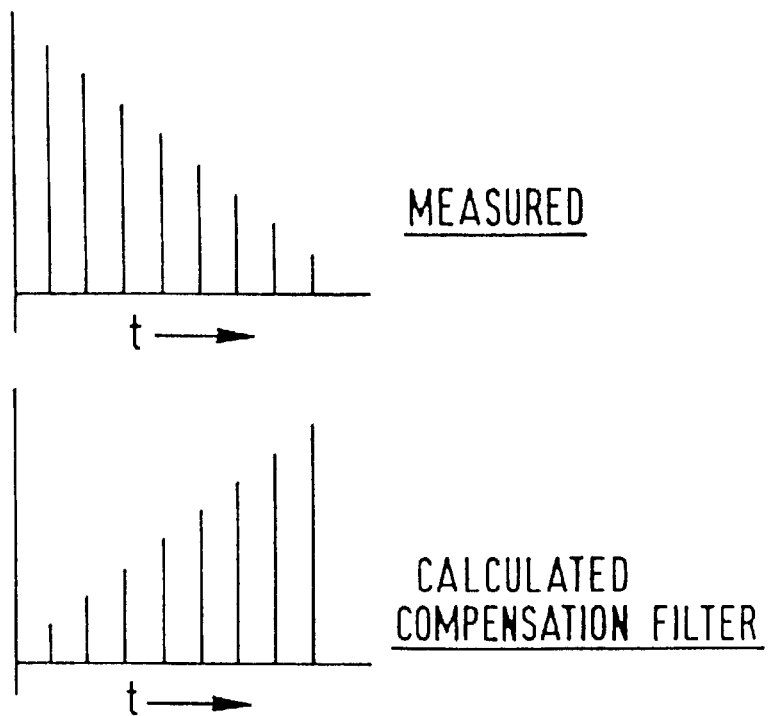
FIG. 30 illustrates schematically the inverse impulse response of the crossover network.

To derive such a filter, the crossover network of the loudspeaker 1 is disconnected and its impulse response is measured by supplying an electrical signal to the input and summing the outputs as shown in FIG. 29. Ideally, if the overall amplitude of the crossover network were essentially flat, the impulse response would contain substantially only phase information. To provide a filter which when cascaded with the crossover network will result in a linear phase system, it would thus merely be necessary to reverse the measured impulse response so that the last coefficient of the measured response becomes the first coefficient of the compensating filter response, as shown in the FIG. 30.

Of course, this method has the effect of doubling the size of amplitude variations in the actual crossover network response; if the ripples in the amplitude response are substantial, it is preferred to derive the phase spectrum or all pass component of the crossover network response and equalize only that. Alternatively, the response of the whole loudspeaker unit including acoustic portions may be equalized over the crossover frequency band.

Once the coefficients have been derived, a corresponding filter can be manufactured either as an analogue shift register (such as a charge coupled device) with the filter coefficients as tap values realised as suitably valued resistors, or by a digital signal processing device of any suitable commercially available type. A preprogrammed filter suitable for use with one particular type of loudspeaker may be provided, or coefficients required to characterise several different types of crossover network may be provided, to be selected by a user to match his loudspeaker.

Automobile Compensation

Figure 31:
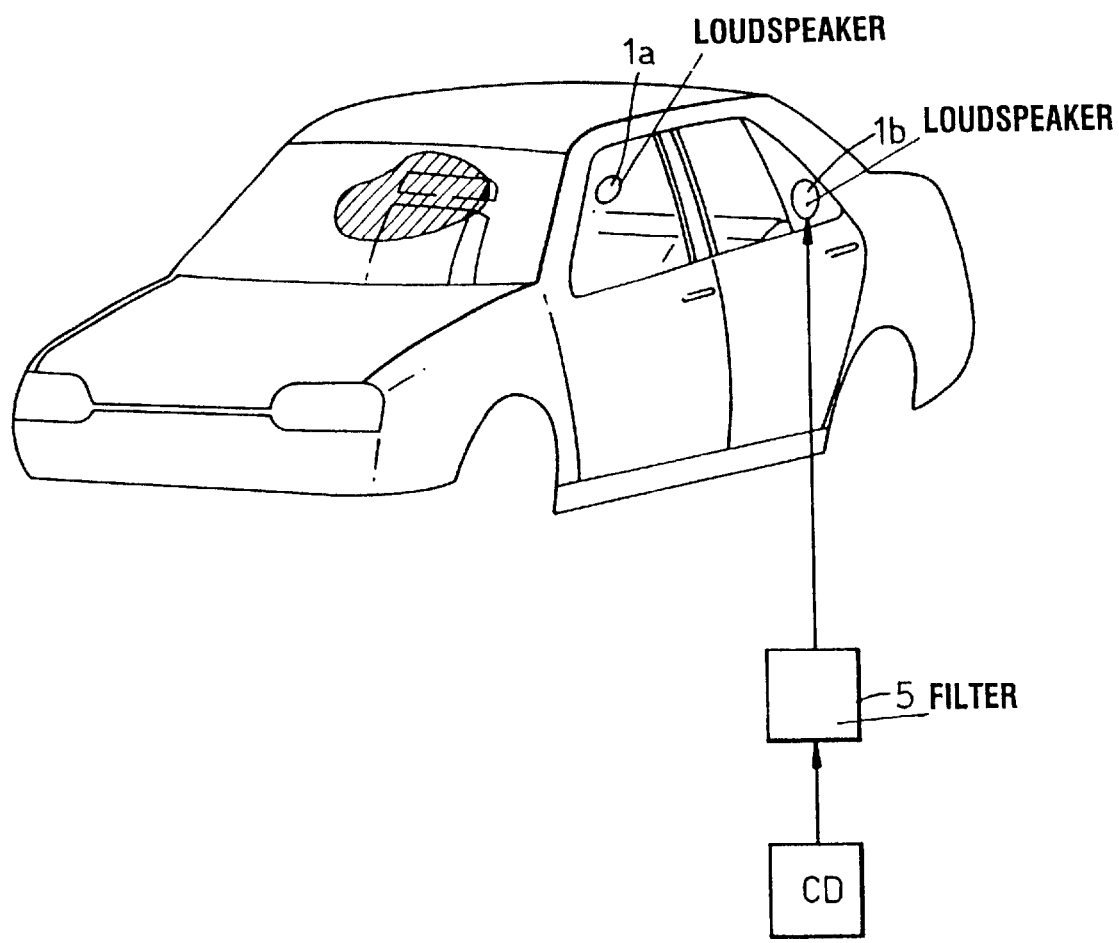
FIG. 31 shows the application of the invention to automobile audio reproduction systems.

Referring to FIG. 31, an automobile is an example of an acoustic environment the response of which can be characterised in advance. In other words, all cars of a particular model will have equivalent loudspeaker mounting positions, (usually) equivalent loudspeakers, equivalent dimensions, and equivalent materials. It is therefore possible to measure (or even calculate) the loudspeaker and environment compensations necessary for any loudspeaker/car combination in advance, and omit from the apparatus according to this embodiment the test signal generator 8, microphone 7 and coefficient calculator 6.

The filter 5 is permanently configured to provide compensation for the type of car and loudspeaker for which it is provided. The compensation zone for which the filter 5 is designed to correct the car environment to may be a single zone around head height at the driving seat position. Alternatively, the zone may encompass all the passenger positions at head height.

Since the presence of passengers in the car not only effects the choice of zone for which the filter 5 should compensate but also effect the response of the car environment itself (possibly quite radically), in a modification, the filter 5 may be configured to 2 or more settings corresponding to different numbers of persons—for example, a "driver only" setting where the coefficients of the filter 5 are derived to compensate a zone around the driver and in such a way as to take account of the presence only of the driver in the environment, and a "passenger plus driver" setting in which the coefficients of the filter 5 such as to correct over a volume including the driver and passenger seats, and the acoustic environment for which the coefficients were derived takes account of the presence of a number of passengers.

The filter 5 is provided as a separate unit to accompany a compact disc player or other audio sound source 4.

Audio High Fidelity Reproduction Apparatus

Figure 32:
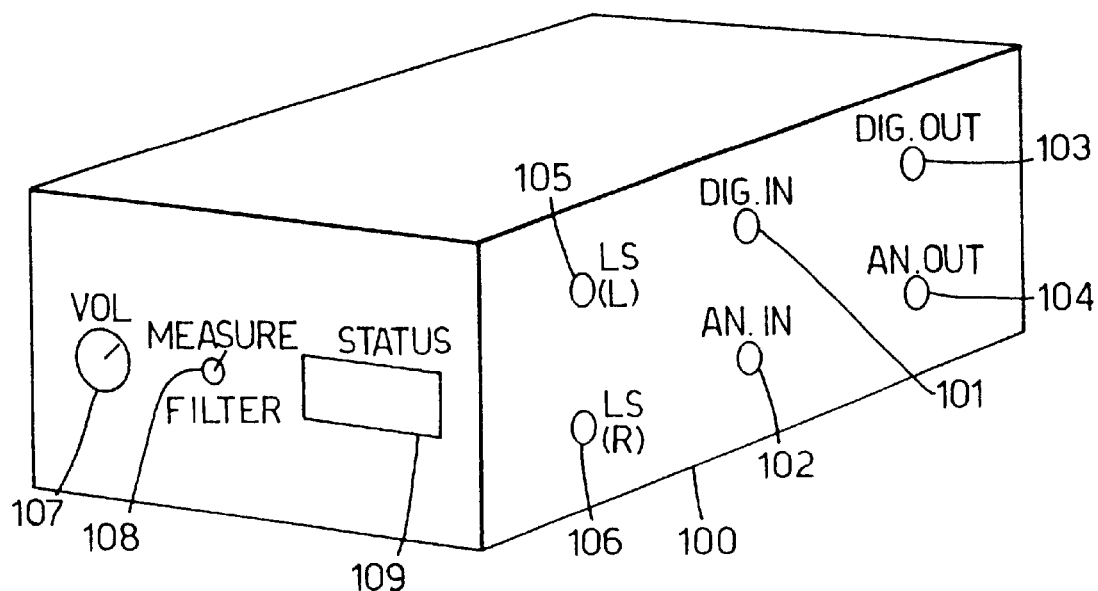
FIG. 32 shows schematically the external appearance of apparatus for domestic audio reproduction.

Referring to FIG. 32, in one embodiment, apparatus suitable for use with a predetermined type of loudspeaker comprises a unit 100 comprising digital and analogue input ports 101, 102; digital and analogue monitor outputs 103, 104 and a pair of analogue loudspeaker outputs 105, 106. Also provided on the unit are a volume control 107, a switch 108 for selecting between filtering and measuring the acoustic environment response; and a status display 109.

Figure 33:
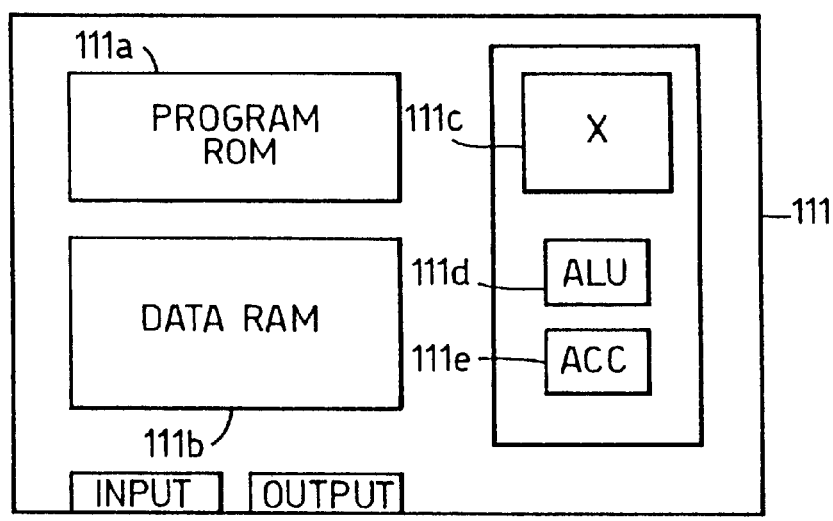
FIG. 33 shows schematically the structure of a processor forming part of the apparatus for FIG. 32.

Referring to FIG. 33, the digital input 101 is connected to a digital format converter 110 arranged to convert the digital signal to a standard format (the SPDIF format). Separate inputs for different types of digital signal (e.g. from a DAT source or a compact disc) may be provided.

Figure 34:
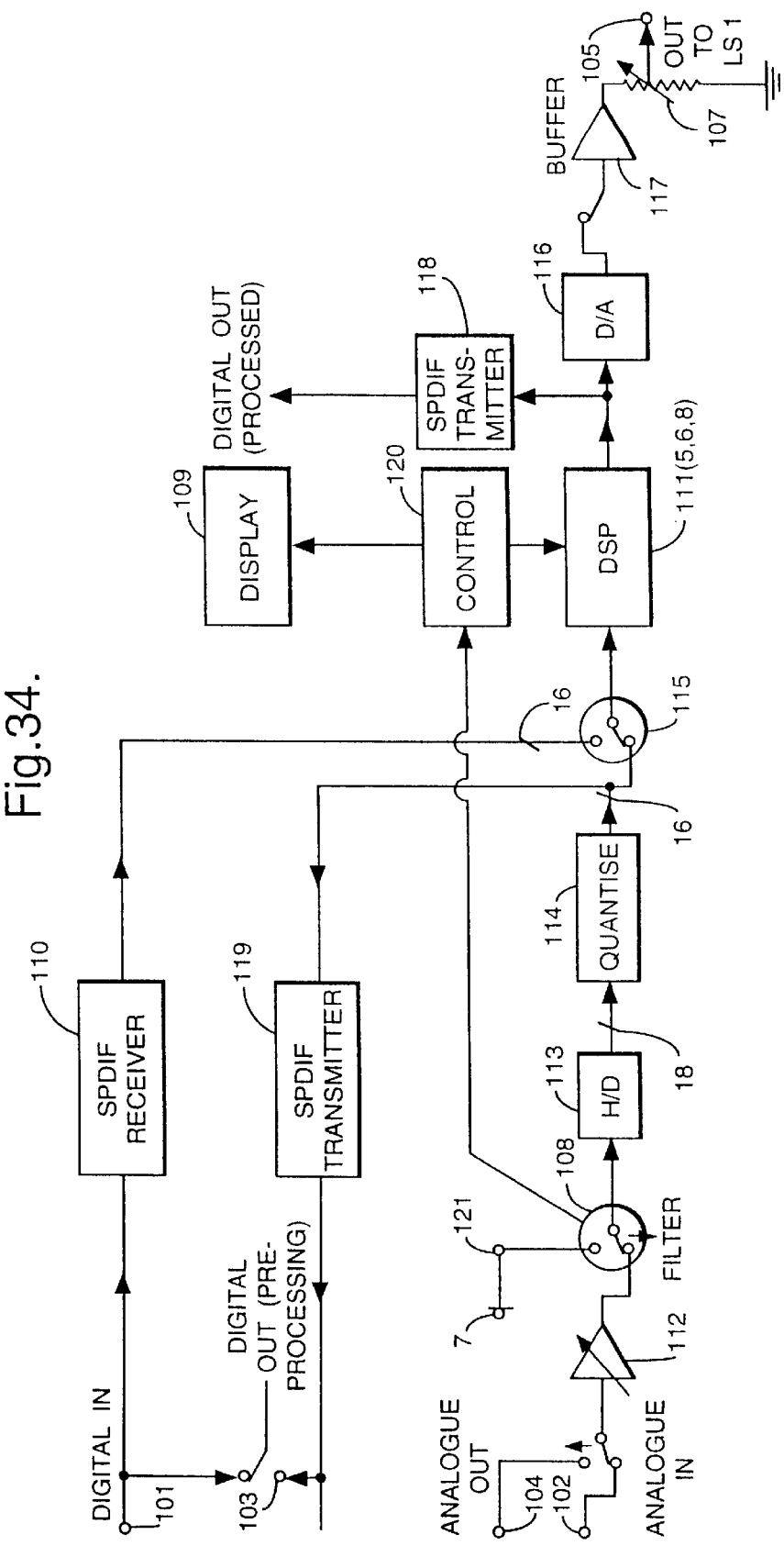
FIG. 34 is a block diagram of the apparatus of FIG. 32.

The format converted digital signal is supplied to a digital signal processor device 111 comprising, for example, a TMS 320 C25 processor device. The elements of such a device are indicated schematically in FIG. 34; it generally comprises a program ROM 111$a$, and a data RAM 111$b$ connected via address and data buses (not shown) to processing elements including a multiplyer 111$c$, arithmetic logic unit 111$d$ and accumulator 111$e$. Predetermined data (relating, for example to the loudspeaker response) is held in ROM, and program ROM 111$a$ includes sub-routines for performing operations such as fast Fourier transform operations (on blocks of, for example, 1024 signal values) and finite response or infinite impulse response filtering operations according to coefficients derived and stored in the data RAM 111$b$.

The analogue input port 102 is connected, via a buffer amplifier 112, to one input terminal of the switch 108. When "filter" mode of switch is selected, the input analogue signal is routed via switch 108 to an analogue to digital converter 113 having a higher resolution (for example, 18 bits). The digitized signal sample train may then be quantized, with dithering of the least significant bit to reduce the number of bits if necessary to, say, 16 by a quantizer 114.

A switch 115, which may be set responsively to a jack inserted into one of the sockets 101 or 102, selects between the digital input and the digitised analogue input signal to be supplied to the data input bus of the digital signal processing device 111. The output of the digital signal processing device 111 is converted to an analogue signal by a digital to analogue converter 116, buffered by a buffer amplifier 117 and supplied, via the volume control potentiometer 107, to the loudspeaker output socket 105 or 106 (FIG. 33 shows only one loudspeaker channel).

The output of the digital signal processor 111 is supplied, via a digital format converter 118, as a digital output. The digitised analogue input is also supplied as a digital output via a digital format converter 119 to the digital output port 103.

The digital signal processor 111 performs the function of the filter 5 when the switch 108 is set to filter mode and the functions of the test signal generator 8 and coefficient calculator 6 when the switch 108 is set to "measure" mode. A controller 120 comprising a micro-processor or microcontroller device is provided to sense the position of the switch 108, and control the operation of the digital signal processor 111 in response thereto. The controller 120 may also control the status display 109 to inform the user of the apparatus of its internal condition.

An external microphone 7 is connectable to a microphone input port 121 routed to the analogue to digital converter 113 via the other terminal of switch 108 when the switch is in the "measure" setting.

In operation, when first placed in an acoustic environment it will be necessary for the apparatus to measure the acoustic environment response. The status display 109 may therefore prompt the user to set the switch 108 to the measure setting (or alternatively, the same information may be provided from an instruction manual). After the microphone 7 has been connected to the socket 121 and positioned at an appropriate position in the room, the user sets the switch 108 to the measure setting. This is sensed by the controller 120 which sets the digital signal processor 111 to function as the test signal generator 8 and coefficient calculator 6 by supplying an instruction to execute an appropriate subroutine.

The subroutine causes the digital signal processor 111 to output a series of digital values corresponding to a test signal, to be supplied to the loudspeaker 1, whilst reading in and storing successive digitised values from the microphone 7. After a measurement has been taken at the microphone position (which typically takes several seconds, to allow long room reverberations to decay) the status display 109 is set by the controller 120 to indicate that the measurement is complete and that the user should move the microphone to another point. Upon his doing so, the process is repeated and the second point microphone signal data are stored. After a predetermined number of points, the controller 120 instructs the display 109 to indicate that measurements are complete. The microphone 7 may then be un-plugged.

The controller 120 then instructs the digital signal processor 111 to execute a sub-routine to perform coefficient calculation. The loudspeaker response will be stored in a read only memory, and from this and the measured signals the digital signal processor 111 calculates the coefficients necessary to enable it to filter an input audio signal. The controller 120 then releases the switch 108 into the filter mode setting, instructs the digital signal processor 111 to act as a digital filter using the derived coefficients, and indicates on the status display 109 that the apparatus is ready for audio reproduction.

Other conventional features such as a direct signal bypass path to the loudspeaker 1 (not shown) are also provided. The controller 120 may be performed by the digital signal processor 111 executing a supervisory routine if so desired.

Audio Visual Reproduction

Figure 35:
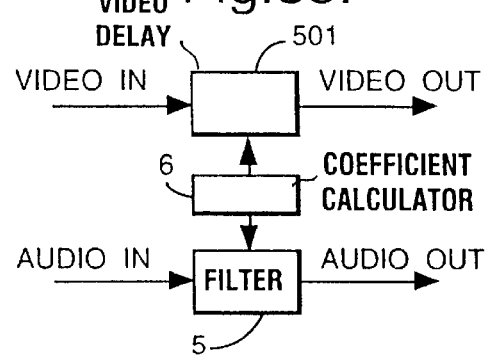
FIG. 35 shows schematically an embodiment of the invention for audio visual reproduction.

When the filter 5 is acausal, as it will be when linear phase compensation of the loudspeaker is employed, the filter 5 will produce a significant signal delay. When reproducing audio material which has an associated video picture (e.g. replaying a video tape or disc) this will result in loss of synchronisation between the sound and pictures; this is very noticable and annoying to a viewer. In an embodiment of the invention for use in replaying audio visual material, shown in FIG. 35 there is therefore provided a video delay 501 of selectable length, the length being set by a control signal from the coefficient calculator 6 to match the delay of the filter 5. Any convenient form of delay line may be employed; if the signal is received in digital form the delay may comprise a digital frame buffer and associated addressing logic.

Modifications

Various modifications to the embodiments disclosed may be made without departing from the scope of the invention. In particular, it will be realised that the particular order of operations shown in the various flow charts is by way of example only; operations which are by their nature linear may be combined and their order altered without affecting the result. Further, each operation of multiplication in the frequency domain may be if necessary replaced by an operation of convolution in the time domain, although in general such convolution operations require greater numbers of arithmetic operations.

Although the invention has been described particularly with reference to digital transversal or finite impulse response filters, it is equally possible to realise the invention using analogue transversal filters of the charge coupled device or similar type. Likewise, infinite impulse response or recursive filter may be used to implement the invention; algorithms are known for generating suitable parameters of an infinite impulse response filter from those of a finite impulse response filter and vice versa.

Figure 36:
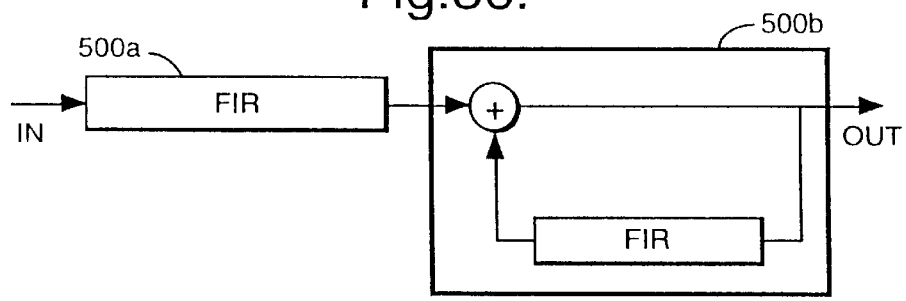
FIG. 36 shows schematically the structure of a filter according to a preferred embodiment of the invention.

One economical way of realising the filter 5 shown in FIG. 36 is as a recursive filter 500$b$ comprising a finite impulse response filter in a feedback path, the recursive filter 500$b$ having a minimum phase response, and an acausal transversal filter 500$a$ having a response which includes all other parts of the correction response. When linear phase loudspeaker correction is combined with minimum phase room correction, the filter 500$a$ will comprise the loudspeaker compensation and the filter 500$b$ the room compensation. However, when the room compensation is non minimum phase, the all pass elements of the room compensation can be provided by the transversal filter 500$a$ (or may alternatively be provided by an additional recursive all-pass filter).

What is claimed is:

1. A method of processing an audio signal, said method comprising the steps of:

executing at least one spectral transform operation to derive a signal spectrum, processing the spectrum to effect smoothing thereof, said smoothing being variable with frequency across the signal spectrum; and conditioning the response of a filter for use in a subsequent audio reproduction with said smoothed spectrum.

2. A method according to claim 1, wherein a first spectral transform operation is performed prior to processing the corresponding signal spectrum to effect smoothing thereof, and a second, inverse, spectral transform operation is then performed on the smoothed spectrum.

3. A method according to claim 1, wherein said executing step comprises a first spectral transform operation deriving the corresponding signal spectrum and a second, inverse, spectral transform operation is performed on the signal spectrum, prior to processing the corresponding inverse spectrum to effect smoothing thereof.

4. A method according to claim 1, wherein the audio signal carries information relating to the response of an acoustic environment to a test signal.

5. A method according to claim 1, wherein the degree of smoothing increases with increasing frequency.

6. A method according to claim 5, wherein the degree of smoothing varies continuously over at least a portion of the signal spectrum.

7. A method according to claim 1, further comprising the step of using the smoothed spectrum to condition the response of a filter for use in subsequent audio reproduction in the acoustic environment.

8. A method according to claim 1, wherein said filter is a digital finite impulse response filter.

9. An acoustic environment audio correction system, comprising:

a test signal generator;

a measurement microphone;

a conditionable correction filter; and processing means for deriving a representation of the response of the acoustic environment at a plurality of frequencies in dependence on a test signal generated by the test signal generator and transmitted within the acoustic environment, for processing the representation of the response to effect smoothing, said smoothing being variable with frequency, and subsequently for conditioning the correction filter in dependence on the smoothed representation of the response.

10. An acoustic environment audio correction system according to claim 9 further including a memory for storing a signal received by the measurement microphone in dependence on the test signal generated by the test signal generator and transmitted within the acoustic environment.

11. An acoustic environment audio correction system according to claim 9 wherein the conditionable correction filter is a digital finite impulse response filter.

12. An acoustic environment audio correction system according to claim 9 wherein the test signal generator is arranged to supply an electrical test signal to an input of a loudspeaker.

13. An acoustic environment audio correction system according to claim 9, wherein said processing means performs a first spectral transform operation prior to processing the corresponding signal spectrum to effect smoothing thereof, and subsequently performs a second, inverse, spectral transform operation on the smoothed spectrum.

14. An acoustic environment audio correction system according to claim 9, wherein said processing means performs a first spectral transform operation deriving the corresponding signal spectrum and a second, inverse, spectral transform operation on the signal spectrum, prior to processing the corresponding inverse spectrum to effect smoothing thereof.

* * * * *